(12) United States Patent
Lee et al.

(10) Patent No.: US 11,917,845 B2
(45) Date of Patent: Feb. 27, 2024

(54) LIGHT-EMITTING DEVICE INCLUDING ELECTRON TRANSPORT PARTICLE, ELECTRONIC APPARATUS INCLUDING THE SAME, AND METHOD OF MANUFACTURING THE LIGHT-EMITTING DEVICE

(71) Applicant: Samsung Display Co., Ltd., Yongin-si (KR)

(72) Inventors: Sooho Lee, Yongin-si (KR); Changhee Lee, Yongin-si (KR); Hyunmi Doh, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 17/336,011

(22) Filed: Jun. 1, 2021

(65) Prior Publication Data
US 2021/0376278 A1 Dec. 2, 2021

(30) Foreign Application Priority Data

Jun. 2, 2020 (KR) .................. 10-2020-0066673

(51) Int. Cl.
*H10K 50/16* (2023.01)
*C09K 11/02* (2006.01)
(Continued)

(52) U.S. Cl.
CPC .............. *H10K 50/16* (2023.02); *C09K 11/02* (2013.01); *C09K 11/06* (2013.01); *C09K 11/54* (2013.01);
(Continued)

(58) Field of Classification Search
CPC ............. H01L 51/5072; H01L 51/0005; H01L 51/0007; H01L 51/502; H01L 51/5234;
(Continued)

(56) References Cited

U.S. PATENT DOCUMENTS

| 5,537,000 A * | 7/1996 | Alivisatos | .............. B82Y 20/00 |
| | | | 313/499 |
| 7,651,674 B2 * | 1/2010 | Jun | ...................... C09K 11/565 |
| | | | 977/773 |

(Continued)

FOREIGN PATENT DOCUMENTS

| JP | 2019-114668 A | 7/2019 |
| KR | 10-2019-0029470 A | 3/2019 |
| KR | 10-2019-0107506 A | 9/2019 |

OTHER PUBLICATIONS

Liang, Xiaoyong, et al. "Colloidal metal oxide nanocrystals as charge transporting layers for solution-processed light-emitting diodes and solar cells," Chem. Soc. Rev., 2017, 46, 1730-1759.

(Continued)

*Primary Examiner* — Caleb E Henry
(74) *Attorney, Agent, or Firm* — Lewis Roca Rothgerber Christie LLP

(57) ABSTRACT

Provided are a light-emitting device, an electronic apparatus including the same, and a method of manufacturing the light-emitting device, wherein the light-emitting device includes: a first electrode, a second electrode facing the first electrode, and an interlayer between the first electrode and the second electrode, wherein the interlayer includes an emission layer and an electron transport layer, the electron transport layer is between the emission layer and the second electrode, and the electron transport layer includes an electron transport particle, the electron transport particle includes a core and a shell covering the core, the core includes an oxide, a chalcogenide, or any combination thereof, and the shell includes a chalcogenide, the chalcogenide of the core being the same as or different from the chalcogenide of the shell.

13 Claims, 4 Drawing Sheets

(51) Int. Cl.
*C09K 11/54* (2006.01)
*C09K 11/56* (2006.01)
*C09K 11/55* (2006.01)
*C09K 11/06* (2006.01)
*H10K 50/115* (2023.01)
*H10K 50/828* (2023.01)
*H10K 71/00* (2023.01)
*H10K 71/15* (2023.01)
*H10K 71/13* (2023.01)
*H10K 102/00* (2023.01)

(52) U.S. Cl.
CPC ............ *C09K 11/55* (2013.01); *C09K 11/565* (2013.01); *H10K 50/115* (2023.02); *H10K 50/828* (2023.02); *H10K 71/00* (2023.02); *H10K 71/135* (2023.02); *H10K 71/15* (2023.02); *H10K 2102/331* (2023.02)

(58) Field of Classification Search
CPC ............ H01L 51/56; H01L 2251/5369; H01L 2251/303; H01L 51/0032; H01L 33/504; H01L 25/0753; H01L 33/58; H01L 33/54; H01L 2933/0091; H01L 33/56; H01L 33/50; C09K 11/02; C09K 11/06; C09K 11/54; C09K 11/55; C09K 11/565; C09K 11/025

See application file for complete search history.

(56) References Cited

U.S. PATENT DOCUMENTS

| | | | |
|---|---|---|---|
| 9,054,330 B2 | 6/2015 | Qian et al. | |
| 9,812,004 B1* | 11/2017 | Boshernitzan | ......... G08C 17/02 |
| 9,831,706 B2* | 11/2017 | MacWilliams | ........... H02J 7/32 |
| 9,874,693 B2* | 1/2018 | Baiocco | ................ H01L 21/762 |
| 2006/0039850 A1* | 2/2006 | Jun | ........................ C09K 11/08 |
| | | | 423/561.1 |
| 2009/0039764 A1 | 2/2009 | Cho et al. | |
| 2010/0140586 A1* | 6/2010 | Char | ..................... C09K 11/883 |
| | | | 257/14 |
| 2012/0113672 A1 | 5/2012 | Dubrow et al. | |
| 2012/0280345 A1* | 11/2012 | Zhu | ........................ G02B 6/1226 |
| | | | 257/E31.127 |
| 2013/0037778 A1* | 2/2013 | Kazlas | ................. C09K 11/883 |
| | | | 257/E29.024 |
| 2014/0027816 A1* | 1/2014 | Cea | ....................... H01L 29/1054 |
| | | | 257/E29.085 |
| 2014/0197507 A1* | 7/2014 | Assefa | ................. H01L 31/0745 |
| | | | 438/69 |
| 2015/0091093 A1* | 4/2015 | Bouche | ................. H01L 27/092 |
| | | | 257/369 |
| 2015/0268417 A1* | 9/2015 | Assefa | ................ H01L 27/1461 |
| | | | 385/14 |
| 2016/0027848 A1* | 1/2016 | Liu | ........................ H01L 51/502 |
| | | | 257/40 |
| 2018/0047928 A1* | 2/2018 | Kim | ...................... H10K 50/125 |
| 2018/0254421 A1* | 9/2018 | Kinge | .................... H01L 51/426 |
| 2018/0309078 A1* | 10/2018 | Ju | ........................... H01L 51/502 |
| 2018/0351125 A1* | 12/2018 | He | .......................... C09K 11/06 |
| 2019/0081262 A1 | 3/2019 | Kim et al. | |
| 2019/0280235 A1 | 9/2019 | Kim et al. | |
| 2019/0296255 A1* | 9/2019 | Kim | ........................ H10K 71/00 |
| 2020/0067005 A1* | 2/2020 | Park | ....................... H10K 50/115 |
| 2020/0395561 A1* | 12/2020 | Park | ....................... H10K 85/381 |
| 2021/0074939 A1* | 3/2021 | Jung | ........................ H10K 59/38 |

OTHER PUBLICATIONS

Zheng, Enqiang, et al. "ZnO/ZnS core-shell composites for low-temperature-processed perovskite solar cells," Journal of Energy Chemistry vol. 27, Issue 5, 2017, 1461-1467.

* cited by examiner

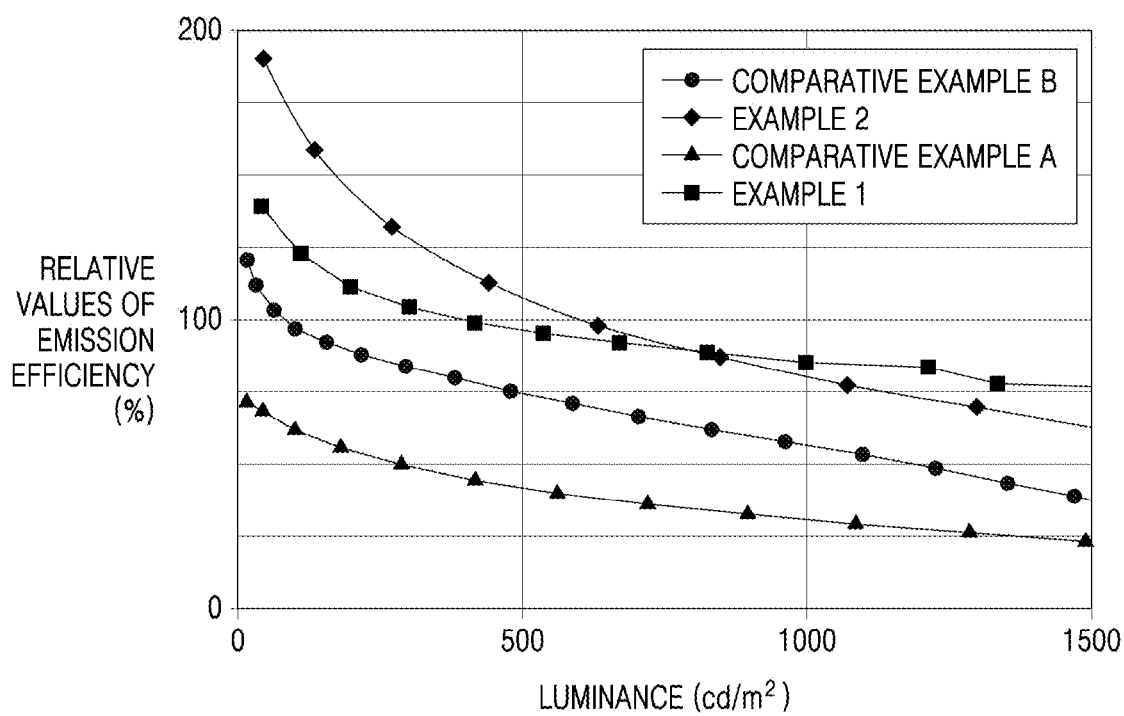

LIGHT-EMITTING DEVICE INCLUDING ELECTRON TRANSPORT PARTICLE, ELECTRONIC APPARATUS INCLUDING THE SAME, AND METHOD OF MANUFACTURING THE LIGHT-EMITTING DEVICE

CROSS-REFERENCE TO RELATED APPLICATION

This application claims priority to and the benefit of Korean Patent Application No. 10-2020-0066673, filed on Jun. 2, 2020, in the Korean Intellectual Property Office, the entire content of which is hereby incorporated by reference.

BACKGROUND

1. Field

One or more embodiments of the present disclosure relate to a light-emitting device, an electronic apparatus including the same, and a method of manufacturing the light-emitting device.

2. Description of Related Art

Light-emitting devices are devices that convert electrical energy into light energy. Examples of such light-emitting devices include organic light-emitting devices in which a light-emitting material is an organic material, and quantum dot light-emitting devices in which the light-emitting material is a quantum dot.

A light-emitting device may have a structure in which a first electrode, a hole transport region, an emission layer, an electron transport region, and a second electrode are sequentially formed. Holes provided from the first electrode may move toward the emission layer through the hole transport region, and electrons provided from the second electrode may move toward the emission layer through the electron transport region. The holes and the electrons recombine in the emission layer to produce excitons. These excitons transition (e.g., relax) from an excited state to a ground state to thereby generate light.

SUMMARY

One or more embodiments provide a light-emitting device having excellent emission efficiency and lifespan properties, an electronic apparatus, and a method of manufacturing the light-emitting device.

Additional aspects of embodiments will be set forth in part in the description which follows and, in part, will be apparent from the description, or may be learned by practice of the presented embodiments of the disclosure.

According to one or more embodiments, a light-emitting device includes
a first electrode,
a second electrode facing the first electrode, and
an interlayer between the first electrode and the second electrode,
wherein the interlayer includes an emission layer and an electron transport layer,
the electron transport layer is between the emission layer and the second electrode,
the electron transport layer includes an electron transport particle,
the electron transport particle includes a core and a shell covering the core,
the core includes an oxide, a chalcogenide, or any combination thereof, and
the shell includes a chalcogenide, wherein the chalcogenide of the core may be the same as or different from the chalcogenide of the shell.

According to one or more embodiments, an electronic apparatus includes the light-emitting device.

According to one or more embodiments, a method of manufacturing a light-emitting device includes:
forming an electron transport layer on an emission layer, wherein:
the forming of the electron transport layer includes:
providing a first composition including an electron transport particle and an organic solvent,
providing the first composition on the emission layer; and
forming the electron transport layer including the electron transport particle by removing at least some of the organic solvent in the first composition provided on the emission layer.

BRIEF DESCRIPTION OF THE DRAWINGS

The above and other aspects and features of certain embodiments of the disclosure will be more apparent from the following description taken in conjunction with the accompanying drawings, in which:

FIG. 6 shows a graph of luminance ($cd/m^2$)-emission efficiency relative value (%) of each of the light-emitting devices manufactured in Examples 1 and 2 and Comparative Examples A and B.

DETAILED DESCRIPTION

Figure 1:
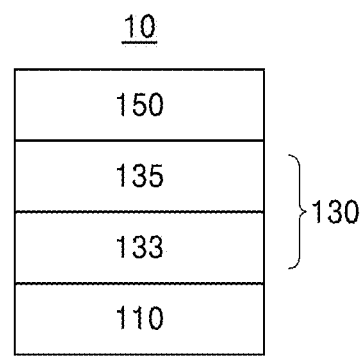
FIG. 1 is a schematic view of a light-emitting device according to an embodiment.

Reference will now be made in more detail to certain embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the subject matter of the present disclosure may have diverse modified embodiments, only certain embodiments are illustrated in the drawings and are described in the detailed description. An effect and a characteristic of embodiments of the disclosure, and a method of accomplishing these will be apparent when referring to embodiments described with reference to the drawings. The disclosure may, however, be embodied in many different forms and should not be construed as limited to the embodiments set forth herein.

It will be understood that although the terms "first," "second," etc. may be used herein to describe various components, these components should not be limited by these terms. These components are only used to distinguish one component from another.

As used herein, an expression used in the singular encompasses the expression of the plural, unless it has a clearly different meaning in the context.

The terms "consists of" and "consisting of," as used herein, refer to the existence of only the corresponding component while excluding the possibility that other components are added. For example, the wording "consists of A, B and C" refers to the existence of only A, B and C.

In the present specification, the terms "include" or "have" refer to that a corresponding component is present, and the possibility of adding one or more other components is not excluded. Unless defined otherwise, the terms "include" or "have," as used herein, may refer to both the case of consisting of the corresponding components and the case of further including other components.

The term "B layer on (above) A layer" includes both the case where the A layer and the B layer are in direct contact (e.g., physical contact) with each other, and the case where any other layer is between the A layer and the B layer.

The term "Group II element," as used herein, may include a Group IIA element and a Group IIB element on the IUPAC periodic table, and the Group II element includes, for example, magnesium (Mg), calcium (Ca), zinc (Zn), cadmium (Cd), and/or mercury (Hg).

The term "Group III element," as used herein, may include a Group IIIA element and a Group IIIB element on the IUPAC periodic table, and the Group III element may include, for example, aluminum (Al), gallium (Ga), indium (In), and/or thallium (Tl).

The term "Group V element," as used herein, may include a Group VA element and a Group VB element on the IUPAC periodic table, and the Group V element may include, for example, nitrogen (N), phosphorus (P), arsenic (As), and/or antimony (Sb).

The term "Group VI element," as used herein, may include a Group VIA element and a Group VIB element on the IUPAC periodic table, and the Group VI element may include, for example, sulfur (S), selenium (Se), and/or tellurium (Te).

Hereinafter, an example of the light-emitting device will be described with reference to FIG. 1 and FIG. 2.

Referring to FIG. 1, a light-emitting device 10 includes a first electrode 110, an interlayer 130, and a second electrode 150, and the interlayer 130 includes an emission layer 133 and an electron transport layer 135. The electron transport layer 135 is between the emission layer 133 and the second electrode 150.

First Electrode 110

In FIG. 1, a substrate may be additionally under the first electrode 110 or above the second electrode 150. The substrate may be a glass substrate and/or a plastic substrate. The substrate may be a flexible substrate. In one or more embodiments, the substrate may include plastics with excellent heat resistance and/or durability, such as, for example, polyimide, polyethylene terephthalate (PET), polycarbonate, polyethylene naphthalate, polyarylate (PAR), polyetherimide, or a combination thereof.

The first electrode 110 may be formed by, for example, depositing and/or sputtering a material for forming the first electrode 110 on the substrate. When the first electrode 110 is an anode, a high work function material that can easily inject holes may be used as a material for a first electrode 110.

The first electrode 110 may be a reflective electrode, a semi-transmissive electrode, or a transmissive electrode. When the first electrode 110 is a transmissive electrode, a material for forming the first electrode 110 may include indium tin oxide (ITO), indium zinc oxide (IZO), tin oxide ($SnO_2$), zinc oxide (ZnO), or any combinations thereof. In one or more embodiments, when the first electrode 110 is a semi-transmissive electrode or a reflective electrode, magnesium (Mg), silver (Ag), aluminum (Al), aluminum-lithium (Al—Li), calcium (Ca), magnesium-indium (Mg—In), magnesium-silver (Mg—Ag), or any combinations thereof may be used as a material for forming a first electrode 110.

The first electrode 110 may have a single-layered structure including (or consisting of) a single layer or a multi-layered structure including a plurality of layers. In an embodiment, the first electrode 110 may have a three-layered structure of ITO/Ag/ITO.

Hole Transport Region

In some embodiments, the interlayer 130 may additionally include a hole transport region between the first electrode 110 and the emission layer 133.

The hole transport region may have: i) a single-layered structure including (or consisting of) a single layer including (or consisting of) a single material, ii) a single-layered structure including (or consisting of) a single layer including (or consisting of) a plurality of different materials, or iii) a multi-layered structure including a plurality of layers including different materials.

The hole transport region may include a hole injection layer (HIL), a hole transport layer (HTL), an emission auxiliary layer, an electron blocking layer (EBL), or any combination thereof.

For example, the hole transport region may have a multi-layered structure including a hole injection layer/hole transport layer structure, a hole injection layer/hole transport layer/emission auxiliary layer structure, a hole injection layer/emission auxiliary layer structure, a hole transport layer/emission auxiliary layer structure, or a hole injection layer/hole transport layer/electron blocking layer structure, wherein, in each structure, layers are stacked sequentially from the first electrode 110.

The hole transport region may include a compound represented by Formula 201, a compound represented by Formula 202, or any combination thereof:

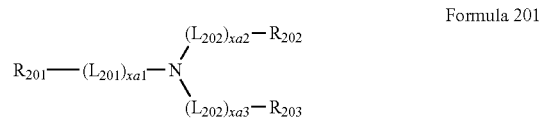

Formula 201

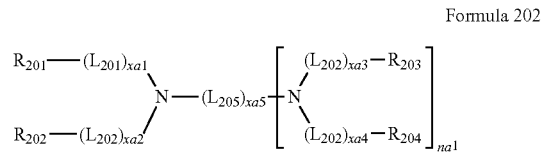

Formula 202 wherein, in Formulae 201 and 202, $L_{201}$ to $L_{204}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $L_{205}$ may be *—O—*', *—S—*'*—N($Q_{201}$)-*', a $C_1$-$C_{20}$ alkylene group unsubstituted or substituted with at least one $R_{10a}$, a $C_2$-$C_{20}$ alkenylene group unsubstituted or substituted with at least one $R_{10a}$, a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, xa1 to xa4 may each independently be an integer from 0 to 5, xa5 may be an integer from 1 to 10, and $R_{201}$ to $R_{204}$ and $Q_{201}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, $R_{201}$ and $R_{202}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$ (for example, a carbazole group and/or the like) (for example, refer to the following compound HT16 herein below), $R_{203}$ and $R_{204}$ may optionally be linked to each other, via a single bond, a $C_1$-$C_5$ alkylene group unsubstituted or substituted with at least one $R_{10a}$, or a $C_2$-$C_5$ alkenylene group unsubstituted or substituted with at least one $R_{10a}$, to form a $C_8$-$C_{60}$ polycyclic group unsubstituted or substituted with at least one $R_{10a}$, and na1 may be an integer from 1 to 4.

In an embodiment, Formulae 201 and 202 may each include at least one of the groups represented by Formulae CY201 to CY217:

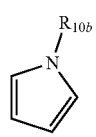
CY201

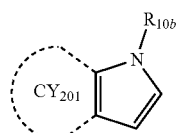
CY202

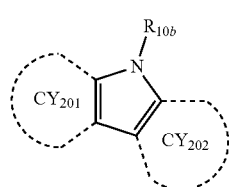
CY203

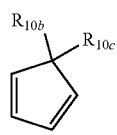
CY204

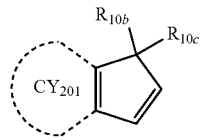
CY205

-continued

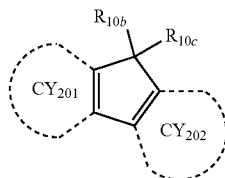
CY206

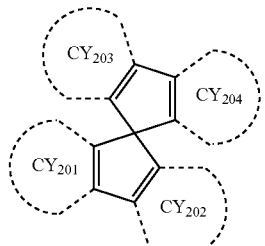
CY207

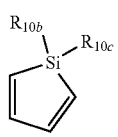
CY208

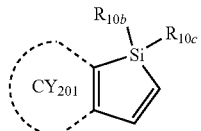
CY209

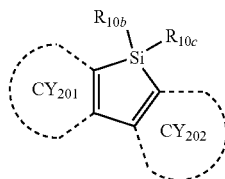
CY210

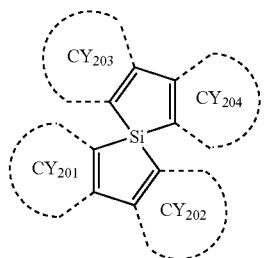
CY211

CY212

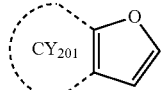
CY213

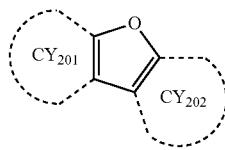
CY214

CY215

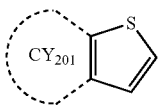
CY216

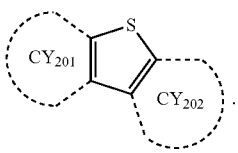
CY217

Regarding Formulae CY201 to CY217, $R_{10b}$ and $R_{10c}$ are the same as described in connection with $R_{10a}$, ring CY201 to ring CY204 may each independently be a $C_3$-$C_{20}$ carbocyclic group, or a $C_1$-$C_{20}$ heterocyclic group, and at least one hydrogen in Formula CY201 to CY217 may be unsubstituted or substituted with at least one $R_{10a}$ described herein.

In an embodiment, ring $CY_{201}$ to ring $CY_{204}$ in Formulae CY201 to CY217 may each independently include a benzene group, a naphthalene group, a phenanthrene group, and/or an anthracene group.

In an embodiment, Formulae 201 and 202 may each include at least one of the groups represented by Formulae CY201 to CY203.

In one or more embodiments, Formula 201 may include at least one of the groups represented by Formulae CY201 to CY203 and at least one of the groups represented by Formulae CY204 to CY217.

In one or more embodiments, in Formula 201, xa1 is 1, $R_{201}$ is a group represented by one of Formulae CY201 to CY203, xa2 is 0, $R_{202}$ is a group represented by one of Formulae CY204 to CY207.

In one or more embodiments, each of Formulae 201 and 202 may not include a group represented by one of Formulae CY201 to CY203.

In one or more embodiments, each of Formulae 201 and 202 may not include a group represented by one of Formulae CY201 to CY203 and may include at least one of the groups represented by Formulae CY204 to CY217.

In an embodiment, each of Formulae 201 and 202 may not include a group represented by one of Formulae CY201 to CY217.

In an embodiment, the hole transport region may include one of Compounds HT1 to HT44, m-MTDATA, TDATA, 2-TNATA, NPB(NPD), β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), or any combination thereof:

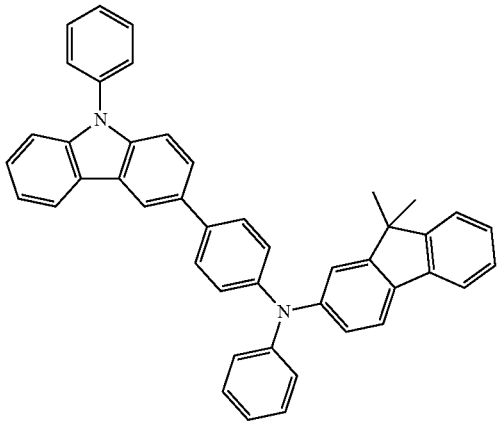
HT1

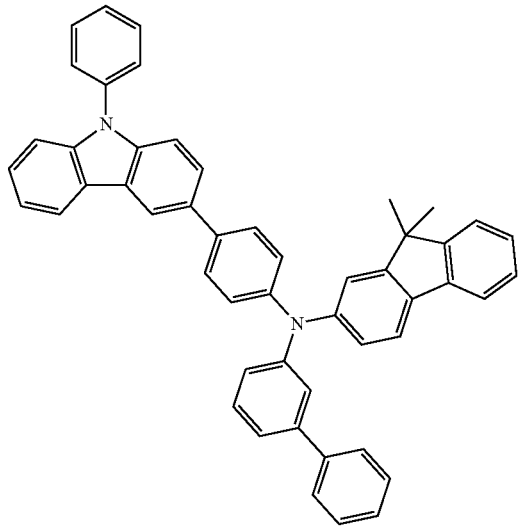
HT2

-continued
HT3
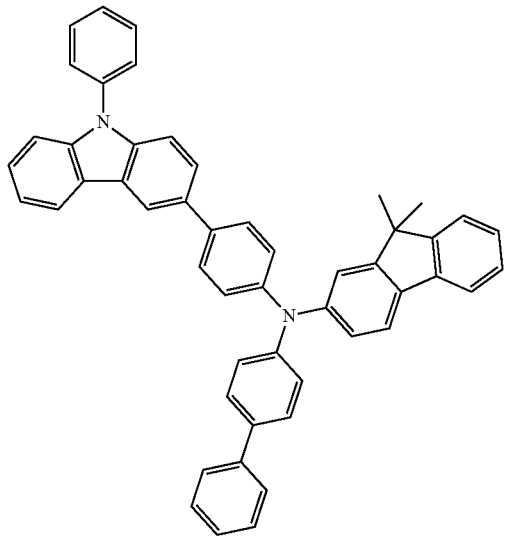
HT4
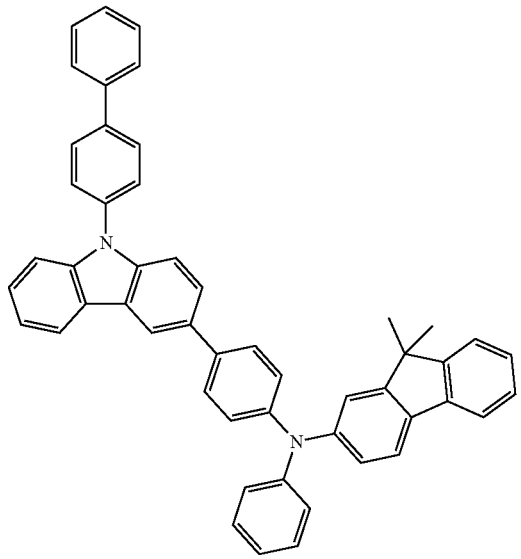
HT5
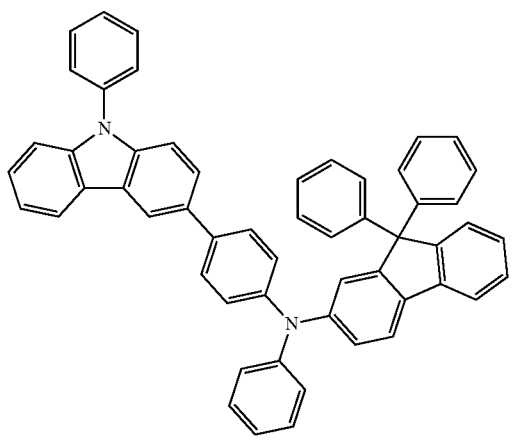
HT6
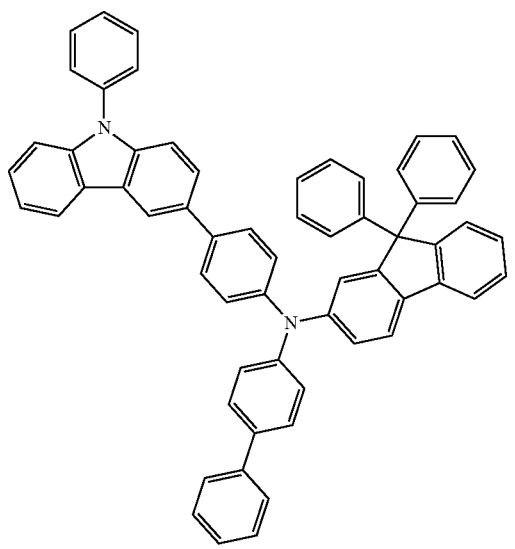
HT7
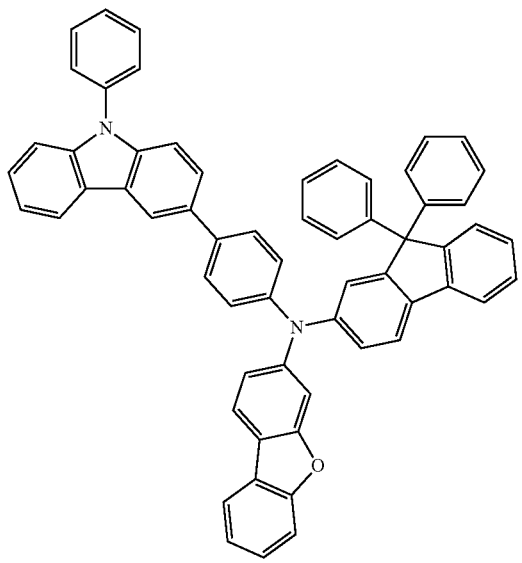
HT8
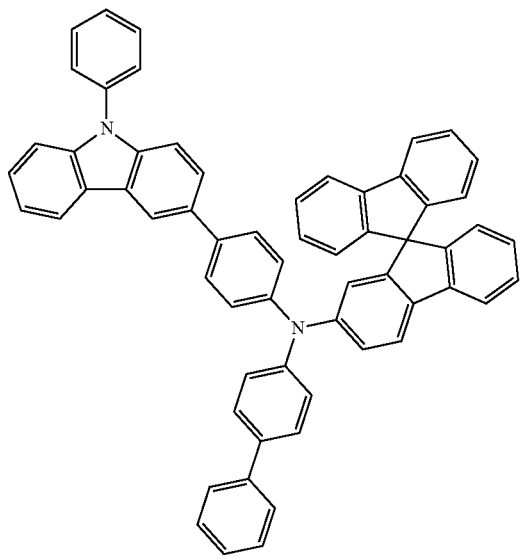

-continued
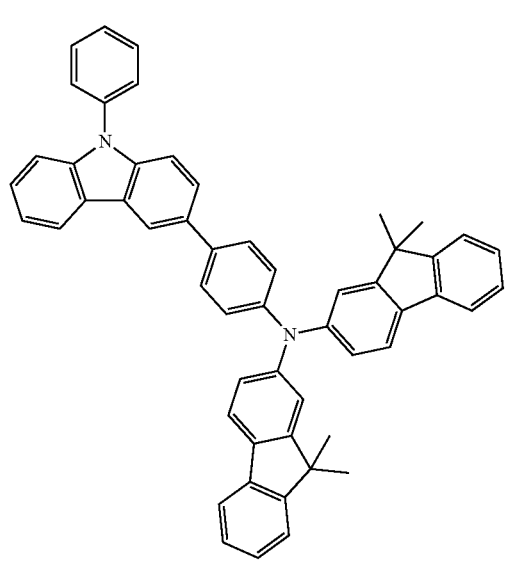
HT9
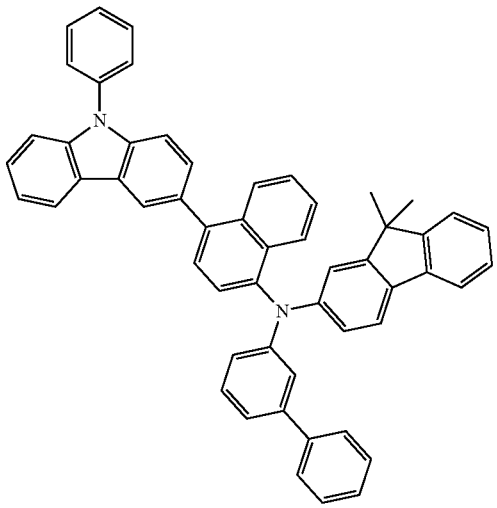
HT10
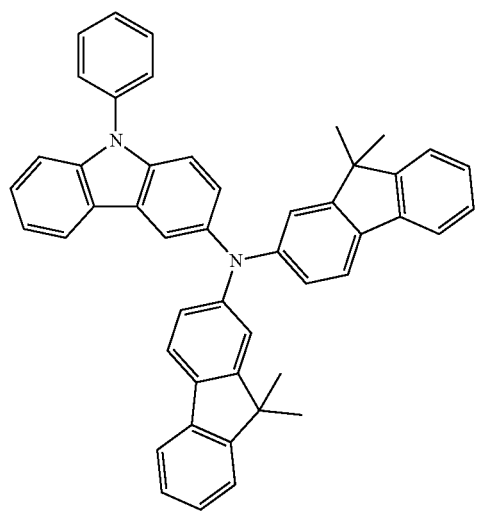
HT11
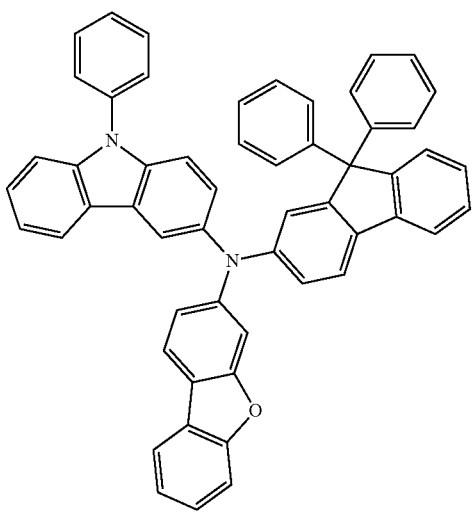
HT12
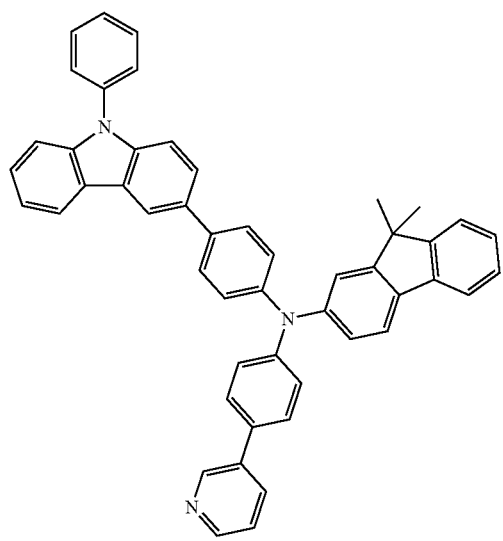
HT13
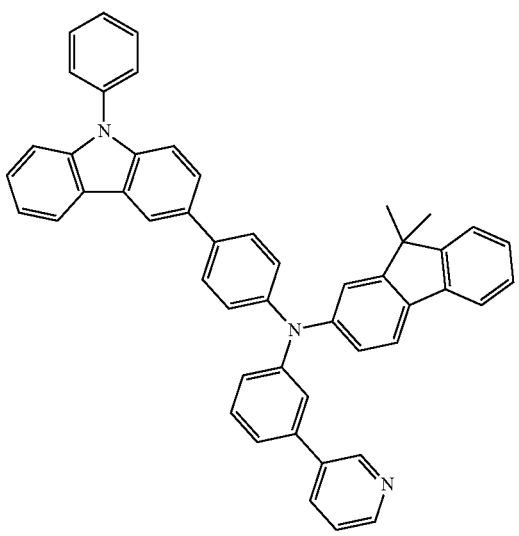
HT14

-continued
HT15
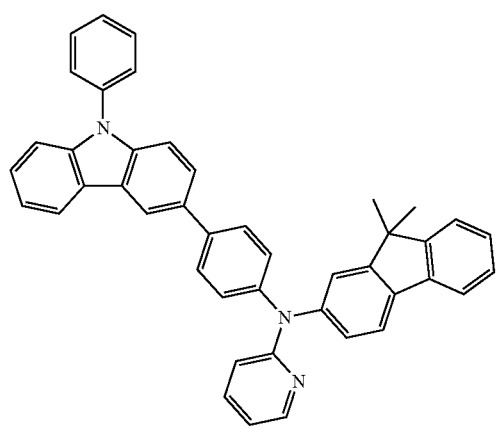
HT16
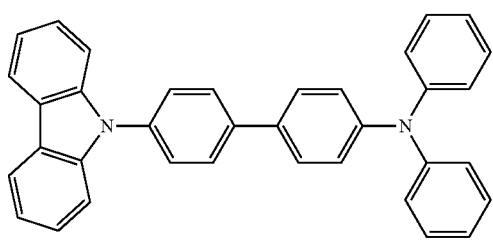
HT17
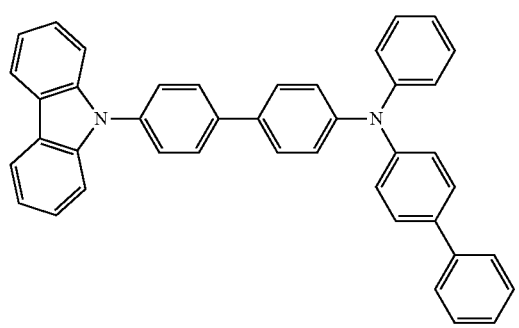
HT18
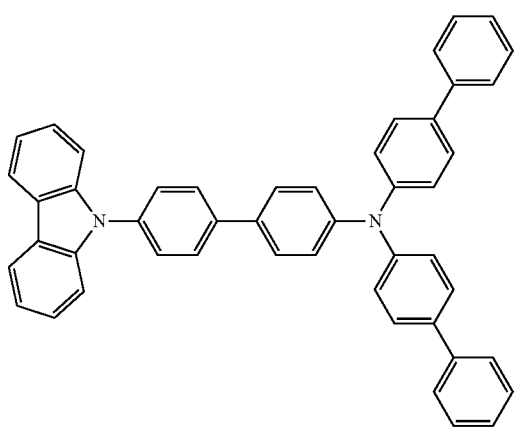
HT19
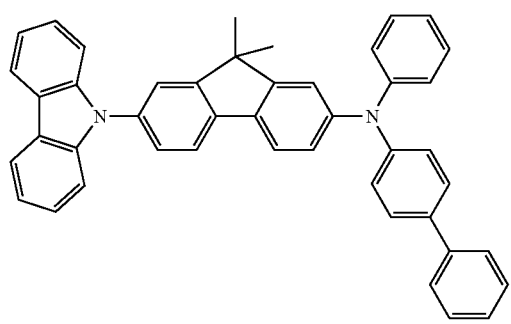
HT20
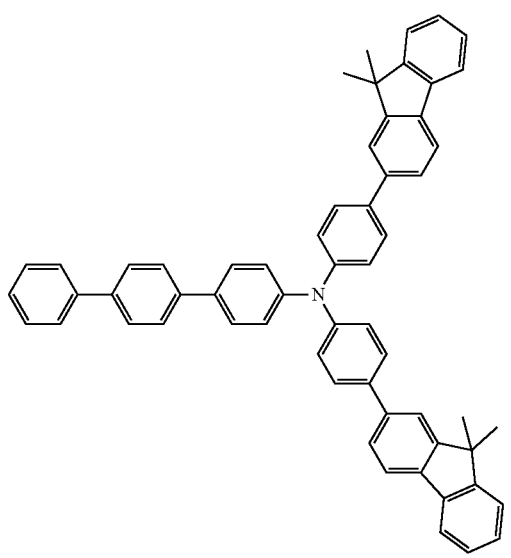

-continued
HT21
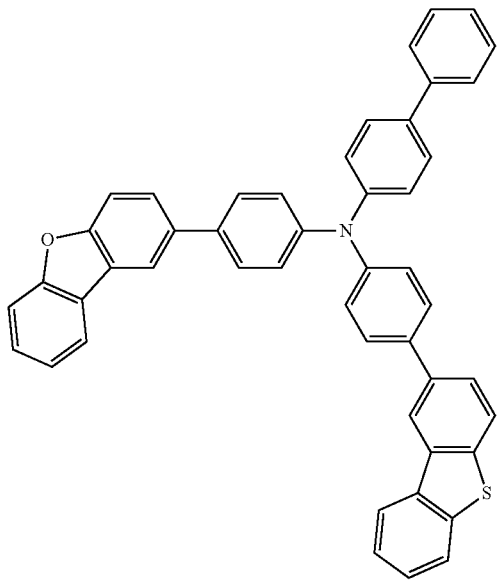
HT22
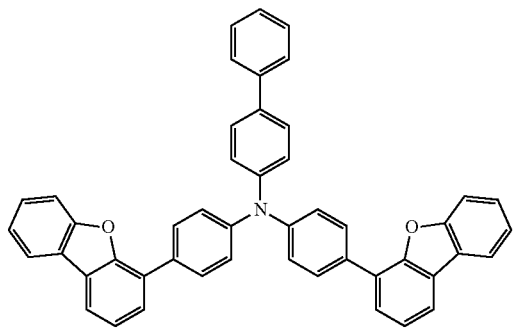
HT23
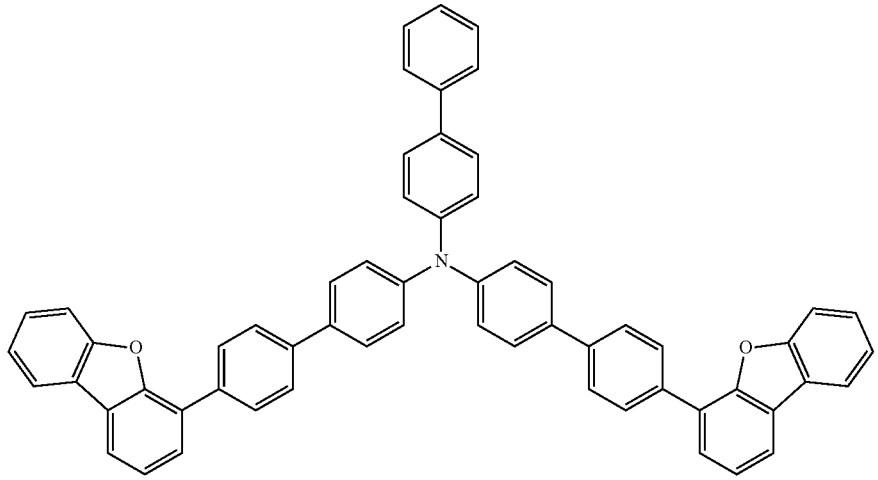
HT24
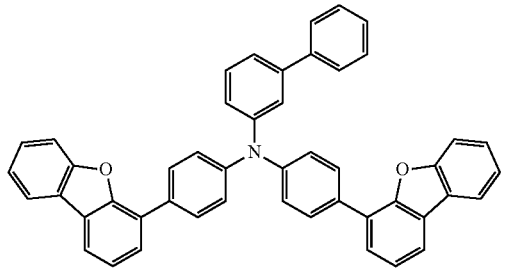
HT25
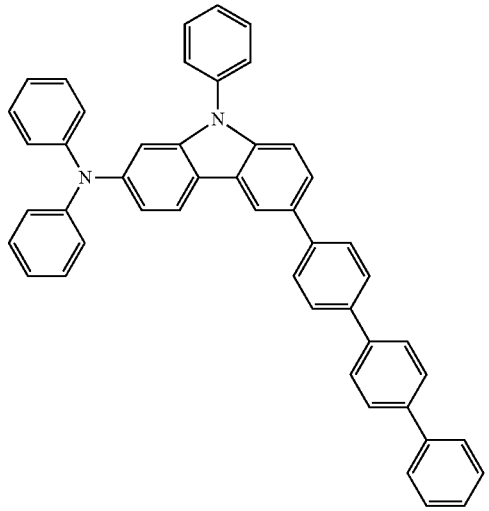

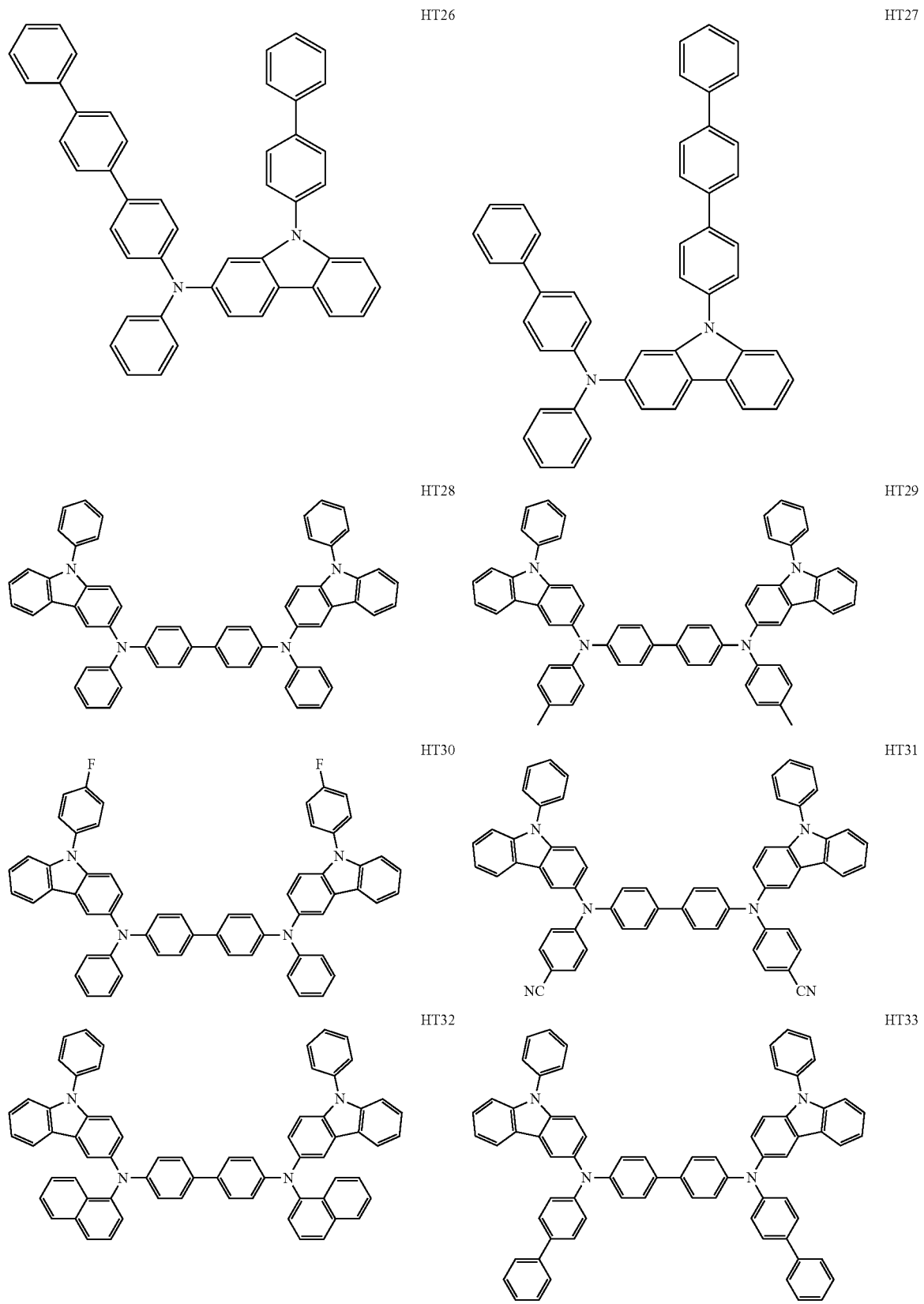

-continued
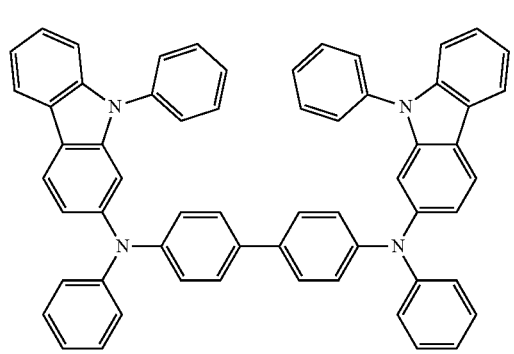
HT34
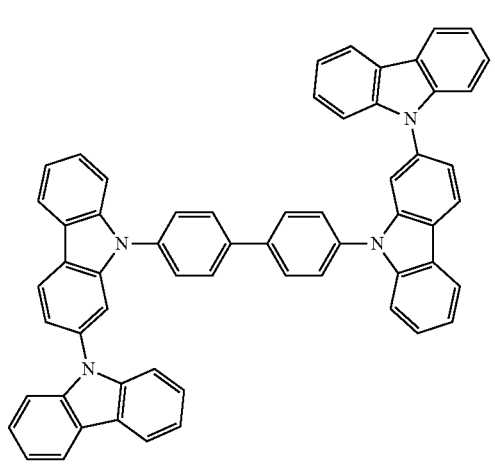
HT35
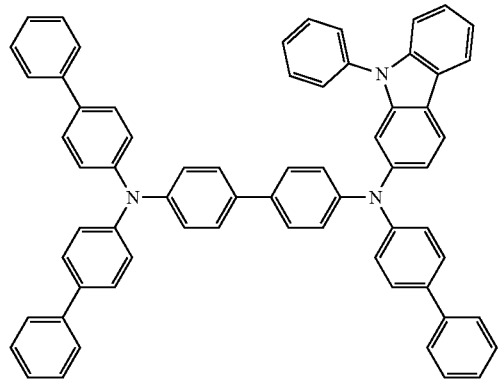
HT36
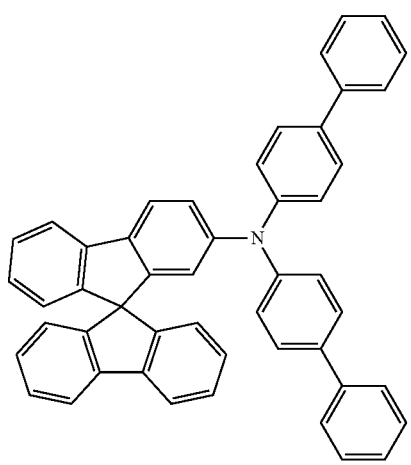
HT37
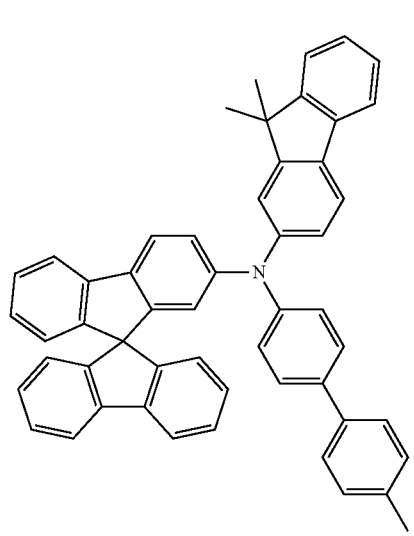
HT38
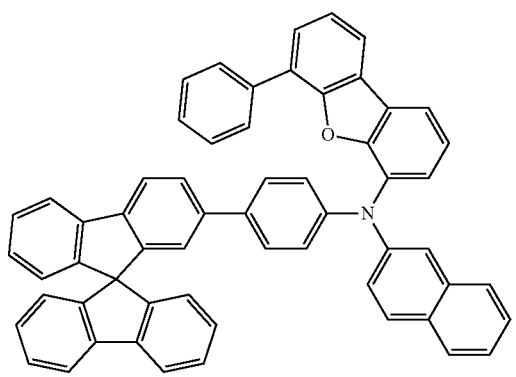
HT39

-continued
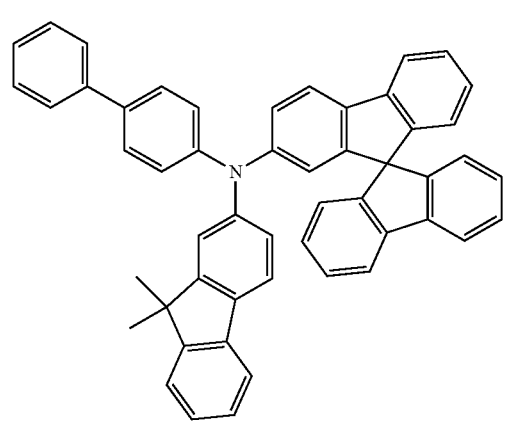
HT40
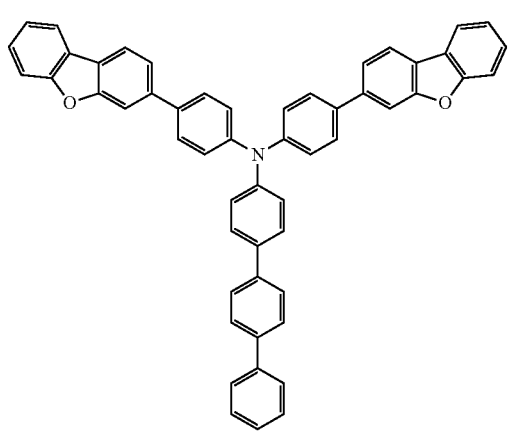
HT41
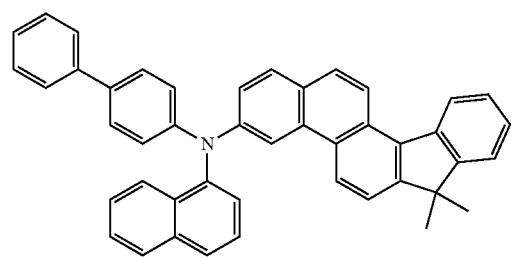
HT42
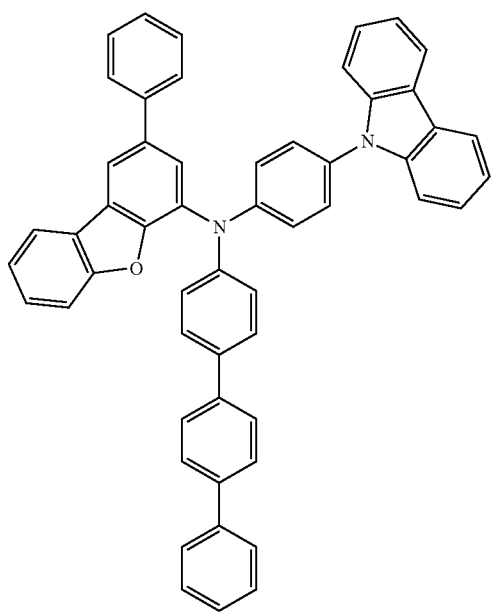
HT43
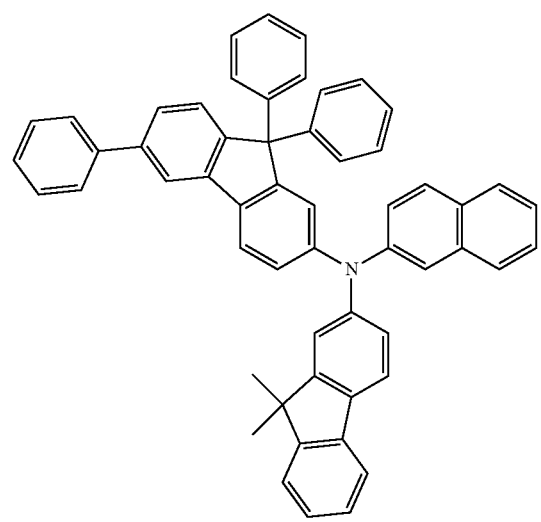
HT44
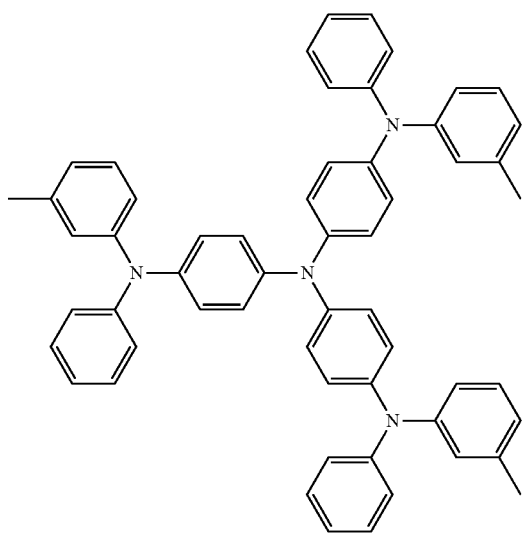
m-MTDATA -continued
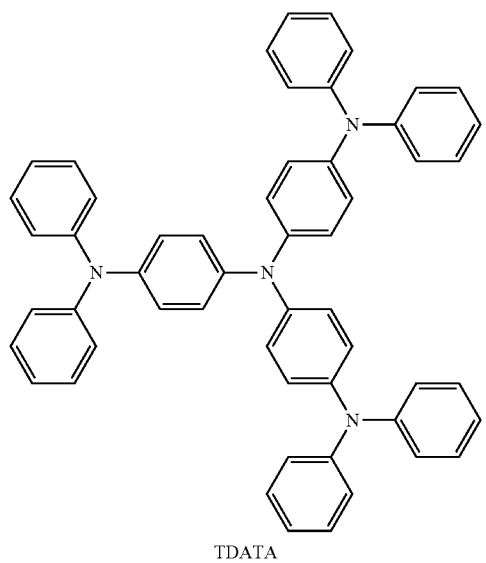
TDATA
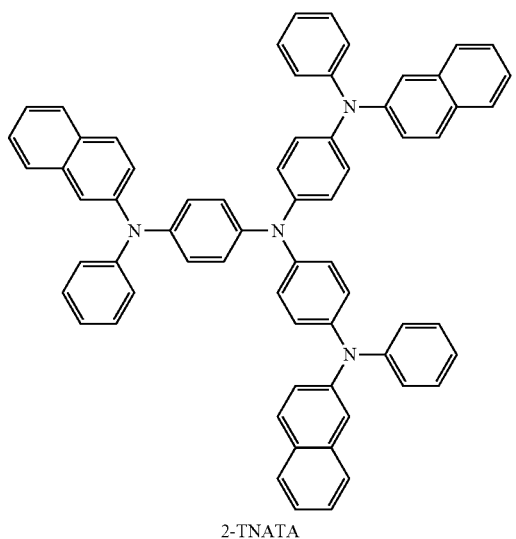
2-TNATA
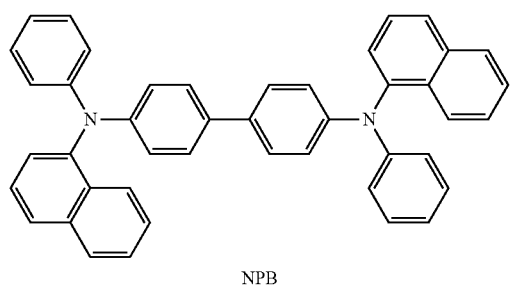
NPB
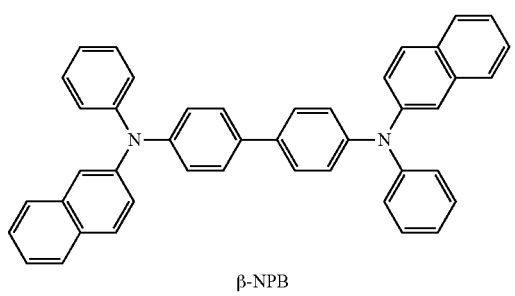
β-NPB
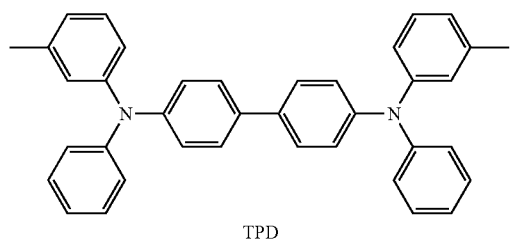
TPD
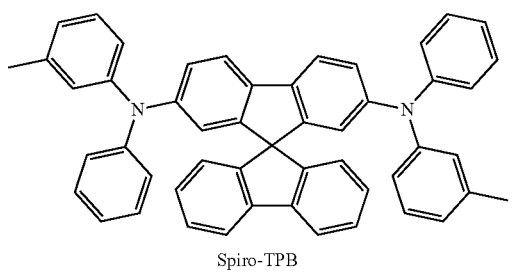
Spiro-TPB
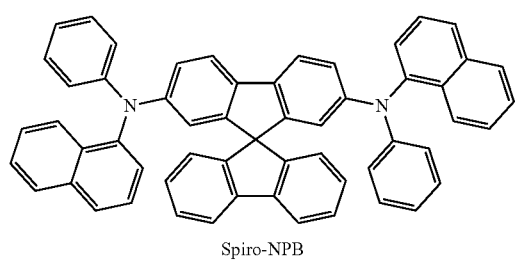
Spiro-NPB
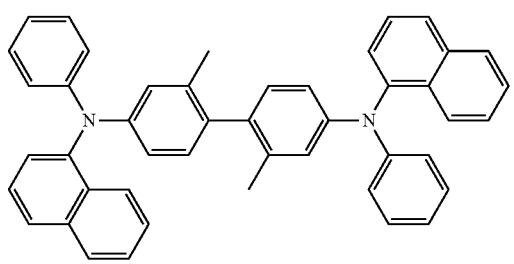
methylated-NPB

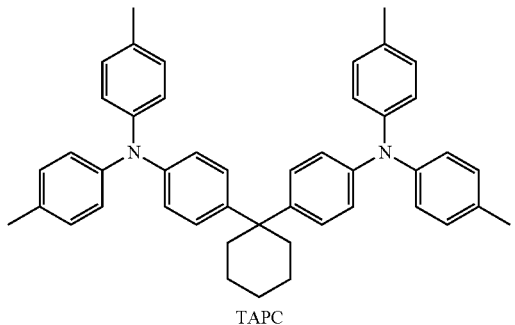

TAPC

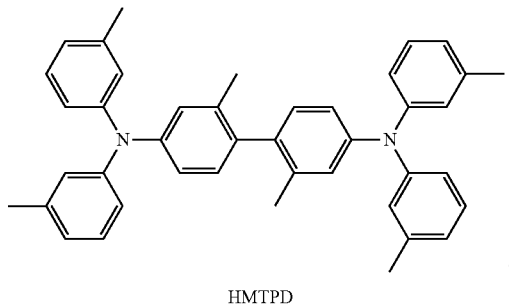

HMTPD

A thickness of the hole transport region may be in a range of about 50 Å to about 10,000 Å, for example, about 100 Å to about 4,000 Å. When the hole transport region includes a hole injection layer, a hole transport layer, or any combination thereof, a thickness of the hole injection layer may be in a range of about 100 Å to about 9,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer and the hole transport layer are within these ranges, suitable or satisfactory hole transporting characteristics may be obtained without a substantial increase in driving voltage.

The emission auxiliary layer may increase light-emission efficiency by compensating for an optical resonance distance according to the wavelength of light emitted by an emission layer 133, and the electron blocking layer may block or reduce the flow of electrons from an electron transport region. The emission auxiliary layer and the electron blocking layer may include the materials as described above.

P-Dopant

The hole transport region may further include, in addition to the foregoing materials, a charge-generating material for the improvement of conductive properties. The charge-generating material may be uniformly or non-uniformly dispersed in the hole transport region (for example, in the form of a single layer of a charge-generating material).

The charge-generation material may be, for example, a p-dopant.

In an embodiment, the lowest unoccupied molecular orbital (LUMO) energy level of the p-dopant may be −3.5 eV or less.

In an embodiment, the p-dopant may include a quinone derivative, a cyano group-containing compound, a compound comprising element EL1 and element EL2, or any combination thereof.

Examples of the quinone derivative include TCNQ and F4-TCNQ.

Examples of the cyano group-containing compound include HAT-CN and a compound represented by Formula 221 below:

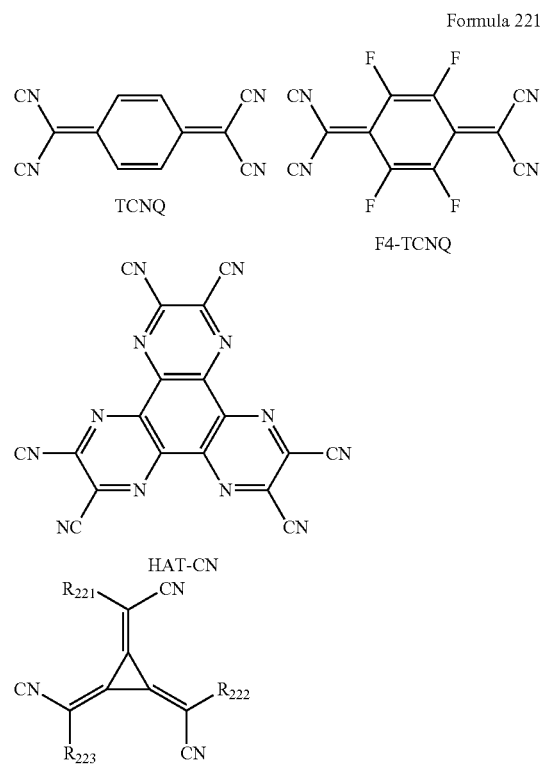

wherein, in Formula 221,
$R_{221}$ to $R_{223}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$, and
at least one of $R_{221}$ to $R_{223}$ may each independently be a $C_3$-$C_{60}$ carbocyclic group, or a $C_1$-$C_{60}$ heterocyclic group, each substituted with: a cyano group; —F; —Cl; —Br; —I; a $C_1$-$C_{20}$ alkyl group substituted with a cyano group, —F, —Cl, —Br, —I, or any combination thereof; or any combination thereof.

Regarding the compound comprising element EL1 and element EL2, element EL1 may be metal, metalloid, or a combination thereof, and element EL2 may be a non-metal, metalloid, or a combination thereof.

Examples of the metal include: an alkali metal (for example, lithium (Li), sodium (Na), potassium (K), rubidium (Rb), cesium (Cs), and/or the like); alkaline earth metal (for example, beryllium (Be), magnesium (Mg), calcium (Ca), strontium (Sr), barium (Ba), and/or the like); transition metal (for example, titanium (Ti), zirconium (Zr), hafnium (Hf), vanadium (V), niobium (Nb), tantalum (Ta), chromium (Cr), molybdenum (Mo), tungsten (W), manganese (Mn), technetium (Tc), rhenium (Re), iron (Fe), ruthenium (Ru), osmium (Os), cobalt (Co), rhodium (Rh), iridium (Ir), nickel (Ni), palladium (Pd), platinum (Pt), copper (Cu), silver (Ag), gold (Au), and/or the like); post-transition metals (for example, zinc (Zn), indium (In), tin (Sn), and/or the like); and lanthanide metal (for example, lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), and/or the like).

Examples of the metalloid include silicon (Si), antimony (Sb), and tellurium (Te).

Examples of the non-metal are oxygen (O) and halogen (for example, F, Cl, Br, I, etc.).

In an embodiment, examples of the compound comprising element EL1 and element EL2 include metal oxide, metal halide (for example, metal fluoride, metal chloride, metal bromide, and/or metal iodide), metalloid halide (for example, metalloid fluoride, metalloid chloride, metalloid bromide, and/or metalloid iodide), metal telluride, or any combination thereof.

Examples of the metal oxide include tungsten oxide (for example, WO, $W_2O_3$, $WO_2$, $WO_3$, and/or $W_2O_5$), vanadium oxide (for example, VO, $V_2O_3$, $VO_2$, and/or $V_2O_5$), molybdenum oxide (for example, MoO, $Mo_2O_3$, $MoO_2$, $MoO_3$, and/or $Mo_2O_5$), and rhenium oxide (for example, $ReO_3$).

Examples of the metal halide include alkali metal halide, alkaline earth metal halide, transition metal halide, post-transition metal halide, and lanthanide metal halide.

Examples of the alkali metal halide include LiF, NaF, KF, RbF, CsF, LiCl, NaCl, KCl, RbCl, CsCl, LiBr, NaBr, KBr, RbBr, CsBr, LiI, NaI, KI, RbI, and CsI.

Examples of the alkaline earth metal halide are $BeF_2$, $MgF_2$, $CaF_2$, $SrF_2$, $BaF_2$, $BeCl_2$, $MgCl_2$, $CaCl_2$, $SrCl_2$, $BaCl_2$, $BeBr_2$, $MgBr_2$, $CaBr_2$, $SrBr_2$, $BaBr_2$, $BeI_2$, $MgI_2$, $CaI_2$, $SrI_2$, and $BaI_2$.

Examples of the transition metal halide include titanium halide (for example, $TiF_4$, $TiCl_4$, $TiBr_4$, and/or $TiI_4$), zirconium halide (for example, $ZrF_4$, $ZrCl_4$, $ZrBr_4$, and/or $ZrI_4$), hafnium halide (for example, $HfF_4$, $HfCl_4$, $HfBr_4$, and/or $HfI_4$), vanadium halide (for example, $VF_3$, $VCl_3$, $VBr3$, and/or $VI_3$), niobium halide (for example, $NbF_3$, $NbCl_3$, $NbBr_3$, and/or $NbI_3$), tantalum halide (for example, $TaF_3$, $TaCl_3$, $TaBr_3$, and/or $TaI_3$), chromium halide (for example, $CrF_3$, $CrCl_3$, $CrBr_3$, and/or $CrI_3$), molybdenum halide (for example, $MoF_3$, $MoCl_3$, $MoBr_3$, and/or $MoI_3$), tungsten halide (for example, $WF_3$, $WCl_3$, $WBr_3$, and/or $WI_3$), manganese halide (for example, $MnF_2$, $MnCl_2$, $MnBr_2$, and/or $MnI_2$), technetium halide (for example, $TcF_2$, $TcCl_2$, $TcBr_2$, and/or $TcI_2$), rhenium halide (for example, $ReF_2$, $ReCl_2$, $ReBr_2$, and/or $ReI_2$), iron halide (for example, $FeF_2$, $FeCl_2$, $FeBr_2$, and/or $FeI_2$), ruthenium halide (for example, $RuF_2$, $RuCl_2$, $RuBr_2$, and/or $RuI_2$), osmium halide (for example, $OsF_2$, $OsCl_2$, $OsBr_2$, and/or $OsI_2$), cobalt halide (for example, $CoF_2$, $CoCl_2$, $CoBr_2$, and/or $CoI_2$), rhodium halide (for example, $RhF_2$, $RhCl_2$, $RhBr_2$, and/or $RhI_2$), iridium halide (for example, $IrF_2$, $IrCl_2$, $IrBr_2$, and/or $IrI_2$), nickel halide (for example, $NiF_2$, $NiCl_2$, $NiBr_2$, and/or $NiI_2$), palladium halide (for example, $PdF_2$, $PdCl_2$, $PdBr_2$, and/or $PdI_2$), platinum halide (for example, $PtF_2$, $PtCl_2$, $PtBr_2$, and/or $PtI_2$), copper halide (for example, CuF, CuCl, CuBr, and/or CuI), silver halide (for example, AgF, AgCl, AgBr, and/or AgI), and gold halide (for example, AuF, AuCl, AuBr, and/or AuI).

Examples of the post-transition metal halide include zinc halide (for example, $ZnF_2$, $ZnCl_2$, $ZnBr_2$, and/or $ZnI_2$), indium halide (for example, $InI_3$), and tin halide (for example, $SnI_2$).

Examples of the lanthanide metal halide include YbF, $YbF_2$, $YbF_3$, $SmF_3$, YbCl, $YbCl_2$, $YbCl_3$, $SmCl_3$, YbBr, $YbBr_2$, $YbBr_3$, $SmBr_3$, YbI, $YbI_2$, $YbI_3$, and $SmI_3$.

Examples of the metalloid halide include antimony halide (for example, $SbCl_5$).

Examples of the metal telluride include an alkali metal telluride (for example, $Li_2Te$, $Na_2Te$, $K_2Te$, $Rb_2Te$, and/or $Cs_2Te$), alkaline earth metal telluride (for example, BeTe, MgTe, CaTe, SrTe, and/or BaTe), transition metal telluride (for example, $TiTe_2$, $ZrTe_2$, $HfTe_2$, $V_2Te_3$, $Nb_2Te_3$, $Ta_2Te_3$, $Cr_2Te_3$, $Mo_2Te_3$, $W_2Te_3$, MnTe, TcTe, ReTe, FeTe, RuTe, OsTe, CoTe, RhTe, IrTe, NiTe, PdTe, PtTe, $Cu_2Te$, CuTe, $Ag_2Te$, AgTe, and/or $Au_2Te$), post-transition metal telluride (for example, ZnTe), and lanthanide metal telluride (for example, LaTe, CeTe, PrTe, NdTe, PmTe, EuTe, GdTe, TbTe, DyTe, HoTe, ErTe, TmTe, YbTe, and/or LuTe).

Emission Layer 133

The emission layer 133 may include any suitable organic light-emitting material. The organic light-emitting material may include a host, a dopant, a delayed fluorescent material, or any combination thereof. The dopant may include a phosphorescent dopant, a fluorescent dopant, or any combination thereof. When the emission layer 133 includes a host and a dopant, an amount of the dopant may be in a range of about 0.01 parts by weight to about 15 parts by weight based on 100 parts by weight of the host. A thickness of the emission layer 133 including an organic light-emitting material may be in a range of about 100 Å to about 1,000 Å, for example, about 200 Å to about 600 Å. When the thickness of the emission layer 133 is within any of the foregoing ranges, excellent light-emission characteristics may be obtained without a substantial increase in driving voltage.

In one or more embodiments, the emission layer 133 may include a quantum dot. The quantum dot may be a light-emitting quantum dot. The thickness of the emission layer 133 including the quantum dot may be from about 7 nm to about 100 nm, for example, about 10 nm to about 50 nm. Within any of the foregoing ranges, the light-emitting device may have excellent emission efficiency and/or lifespan properties due to the control of pores (e.g., the number, size, or volume of pores) that may be generated by quantum dot particle arrangement (e.g., by controlling the space between the quantum dots when the quantum dots are combined together).

When the light-emitting device is a full color light-emitting device, the emission layer 133 may include an emission layer that emits light of different color for each sub-pixel.

Host

In one or more embodiments, the host may include a compound represented by Formula 301 below:

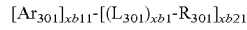   Formula 301 wherein, in Formula 301,
Ar$_{301}$ and L$_{301}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
xb11 may be 1, 2, or 3,
xb1 may be an integer from 0 to 5,
$R_{301}$ may be hydrogen, deuterium, —F, —Cl, —Br, —I, hydroxyl group, cyano group, a nitro group, a $C_1$-$C_{60}$ alkyl group unsubstituted or substituted with at least one $R_{10a}$, a $C_2$-$C_{60}$ alkenyl group unsubstituted or substituted with at least one $R_{10a}$, a $C_2$-$C_{60}$ alkynyl group unsubstituted or substituted with at least one $R_{10a}$, a $C_1$-$C_{60}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si$(Q_{301})(Q_{302})(Q_{303})$, —N$(Q_{301})(Q_{302})$, —B$(Q_{301})(Q_{302})$, —C(=O)$(Q_{301})$, —S(=O)$_2(Q_{301})$, or —P(=O)$(Q_{301})(Q_{302})$, xb21 may be an integer from 1 to 5, $Q_{301}$ to $Q_{303}$ are the same as described in connection with $Q_1$.

In one or more embodiments, when xb11 in Formula 301 is 2 or more, two or more of $Ar_{301}$(s) may be linked to each other via a single bond.

In an embodiment, the host may include a compound represented by Formula 301-1, a compound represented by Formula 301-2, or any combination embodiment:

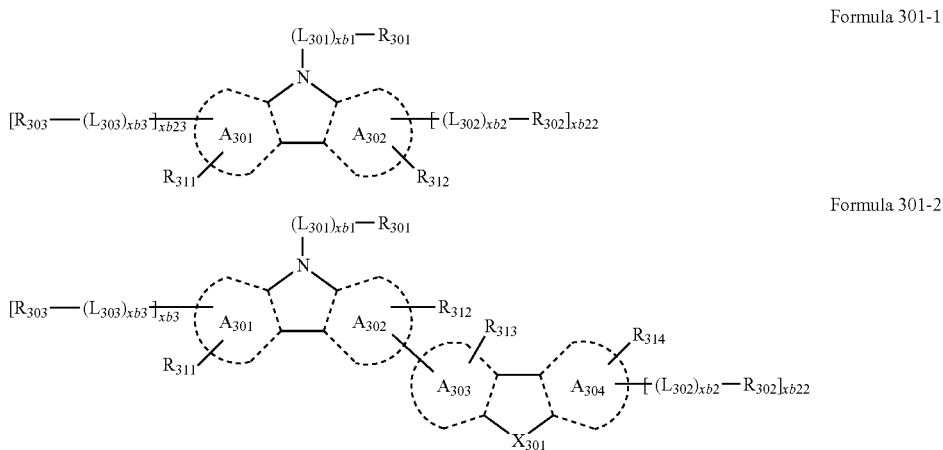

Formula 301-1

Formula 301-2 wherein, in Formulae 301-1 and 301-2,
ring $A_{301}$ to ring $A_{304}$ may each independently be a $C_3$-$C_{60}$ carbocyclic group unsubstituted or substituted with at least one $R_{10a}$, or a $C_1$-$C_{60}$ heterocyclic group unsubstituted or substituted with at least one $R_{10a}$,
$X_{301}$ may be O, S, N-[$(L_{304})_{xb4}$-$R_{304}$], C$(R_{304})(R_{305})$, or Si$(R_{304})(R_{305})$,
xb22 and xb23 may each independently be 0, 1, or 2,
$L_{301}$, xb1, and $R_{301}$ are the same as described above,
$L_{302}$ to $L_{304}$ are each independently the same as described in connection with $L_{301}$,
xb2 to xb4 may each independently be the same as described in connection with xb1, and $R_{302}$ to $R_{305}$ and $R_{311}$ to $R_{314}$ are the same as described in connection with $R_{301}$.

In one or more embodiments, the host may include an alkaline earth metal complex. In an embodiment, the host may be a Be complex (for example, Compound H55), a Mg complex, a Zn complex, or any combination thereof.

In an embodiment, the host may include one of Compounds H1 to H124, 9,10-di(2-naphthyl)anthracene (ADN), 2-methyl-9,10-bis(naphthalen-2-yl)anthracene (MADN), 9,10-di-(2-naphthyl)-2-t-butyl-anthracene (TBADN), 4,4'-bis(N-carbazolyl)-1,1'-biphenyl (CBP), 1,3-di(carbazol-9-yl)benzene (mCP), 1,3,5-tri(carbazol-9-Abenzene (TCP), or any combination thereof:

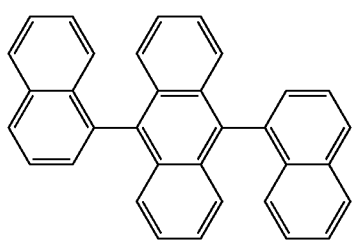

H1

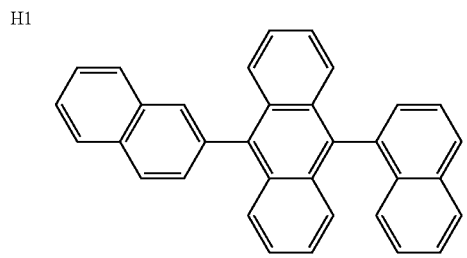

H2

-continued
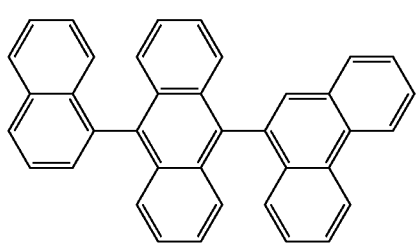 H3
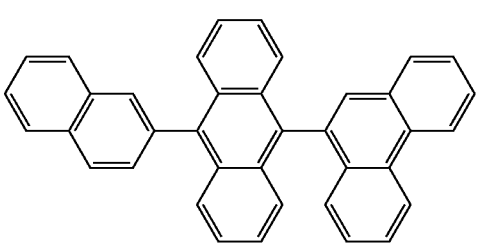 H4
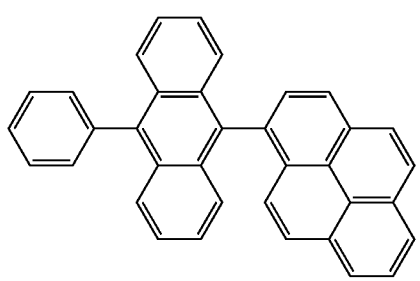 H5
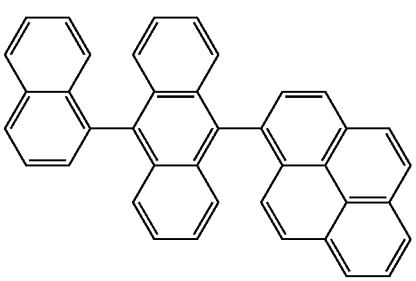 H6
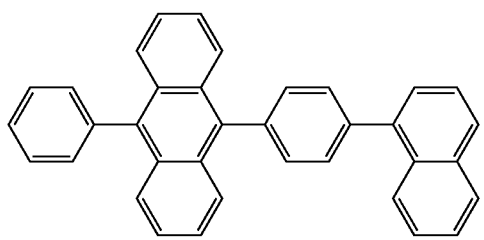 H7
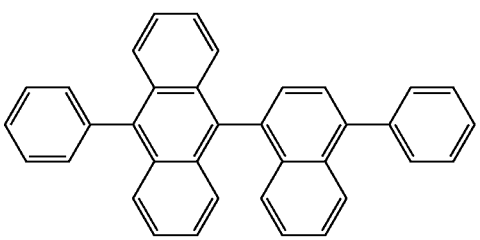 H8
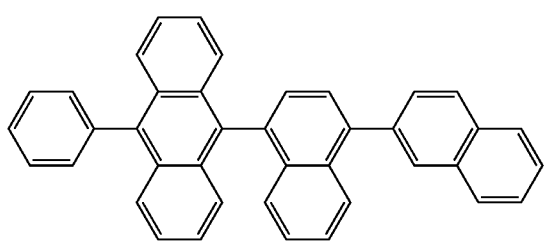 H9
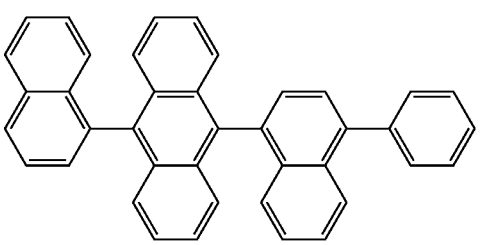 H10
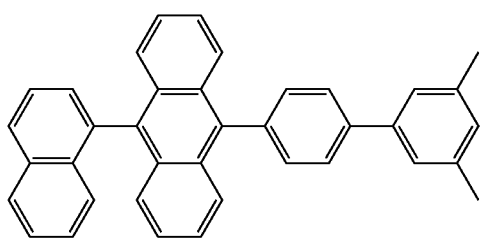 H11
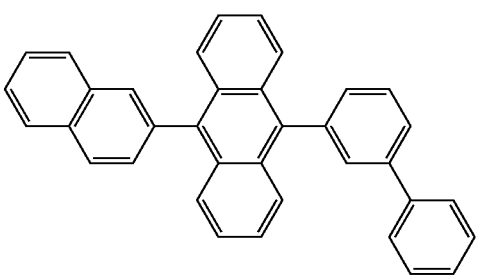 H12

-continued
H13
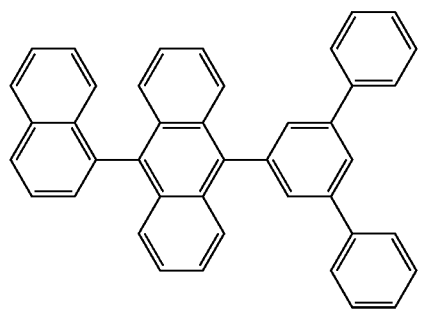
H14
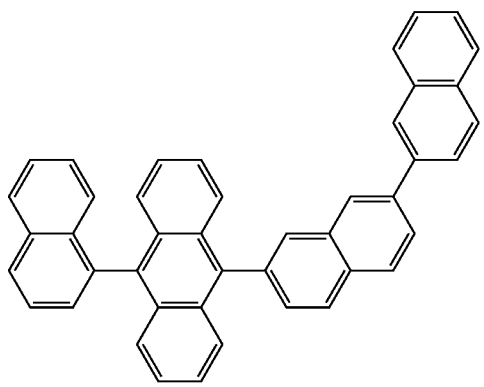
H15
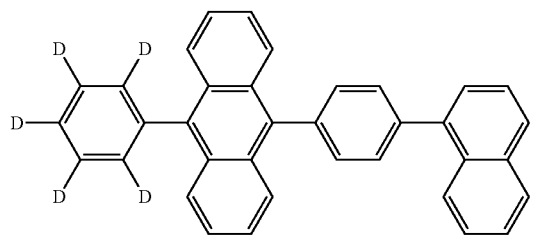
H16
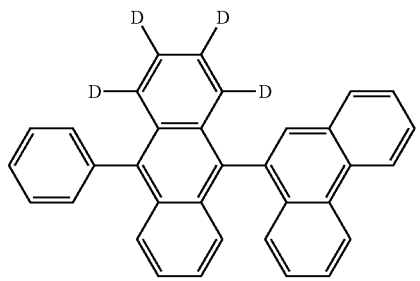
H17
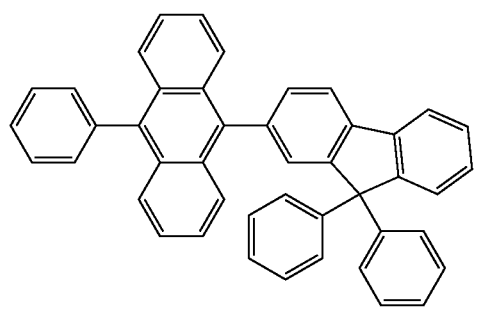
H18
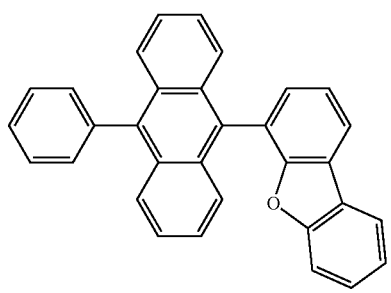
H19
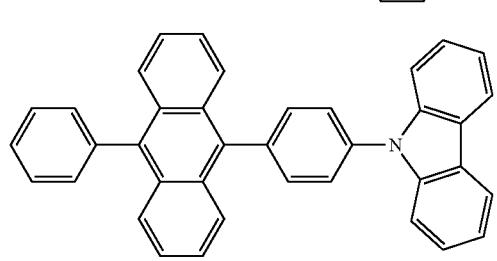
H20
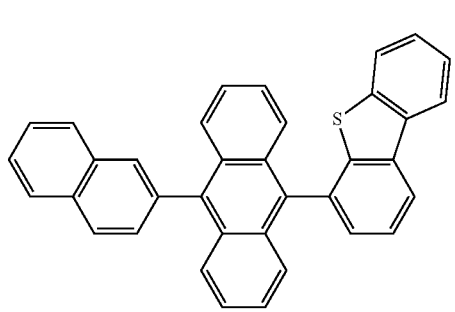
H21
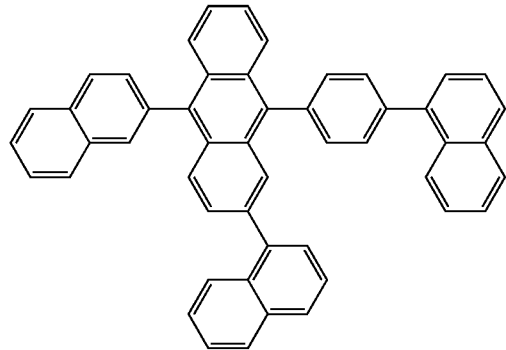
H22
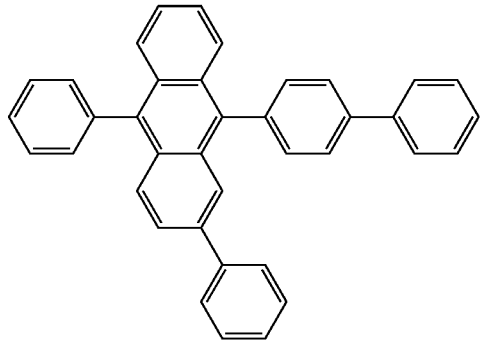

H23
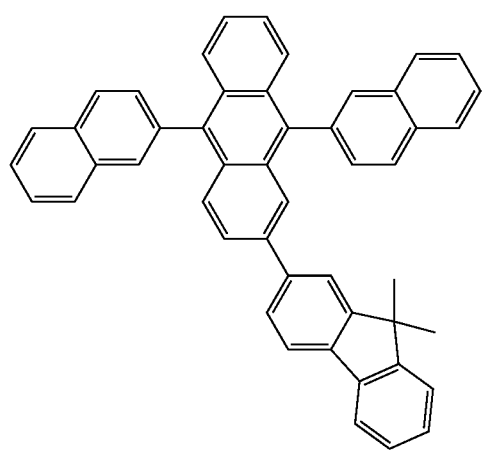
H24
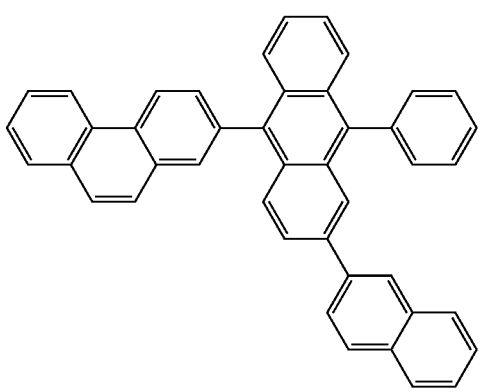
H25
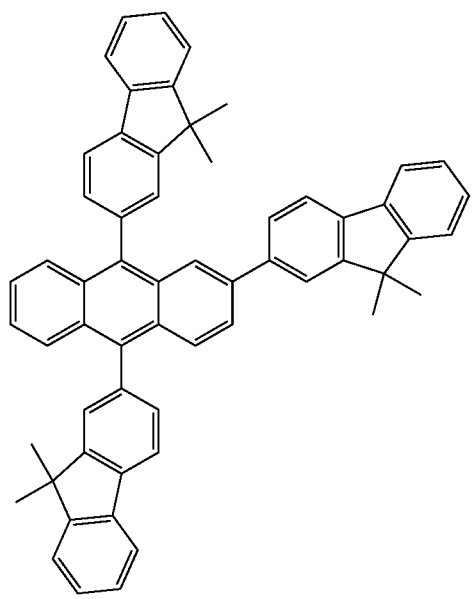
H26
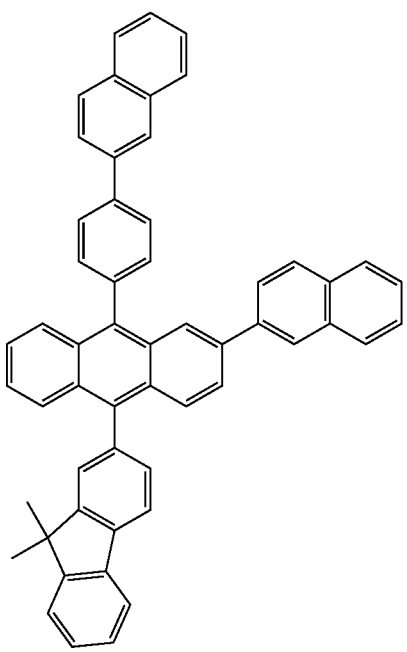
H27
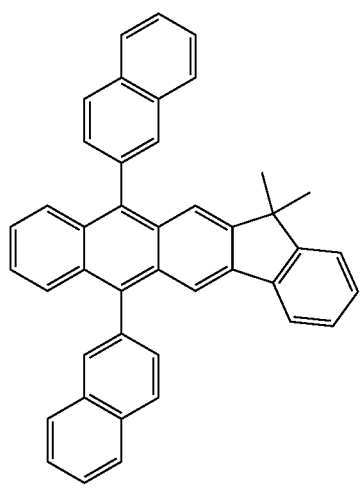
H28
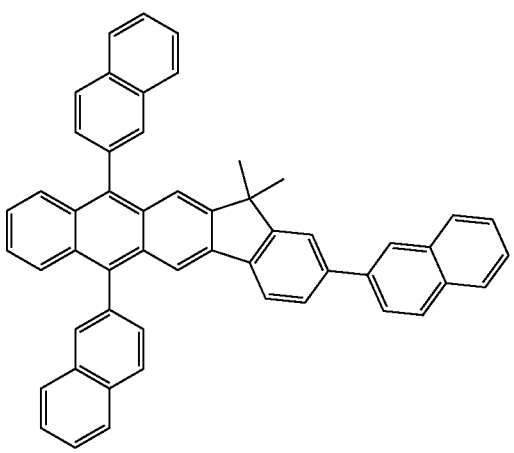

H29 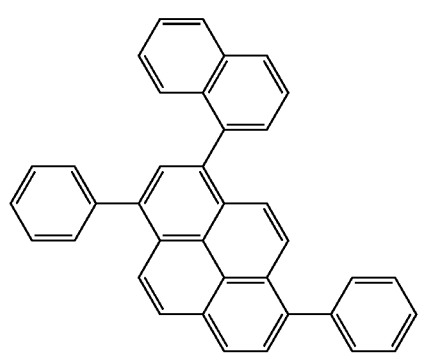
H30 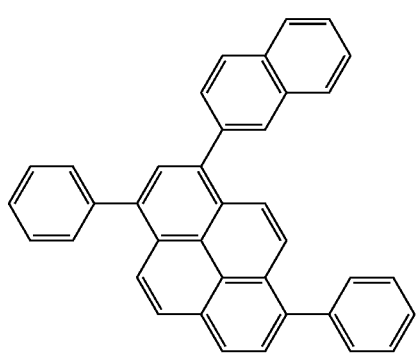
H31 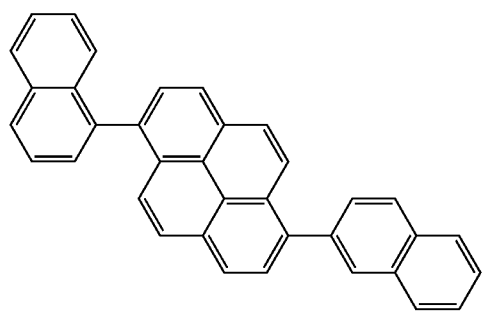
H32 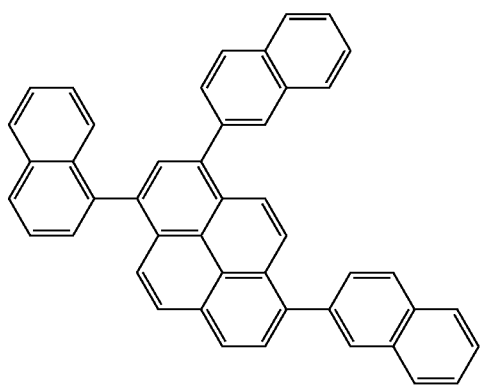
H33 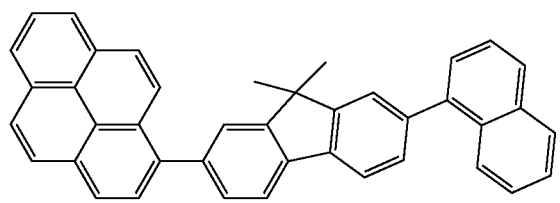
H34 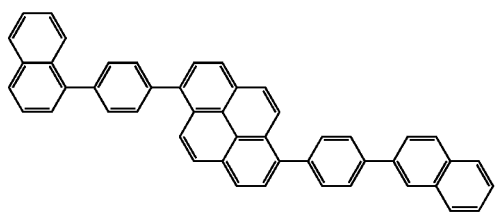
H35 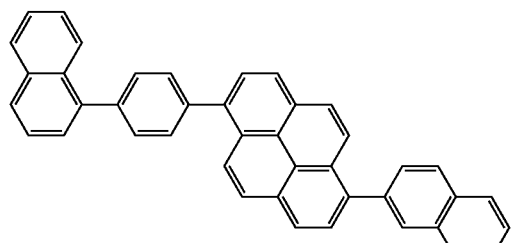
H36 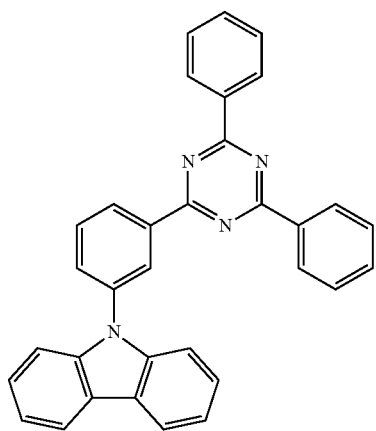

H37 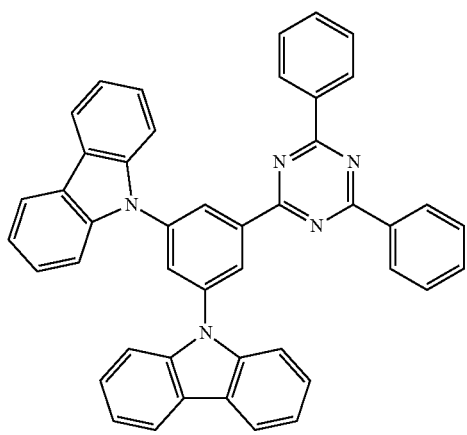
H38 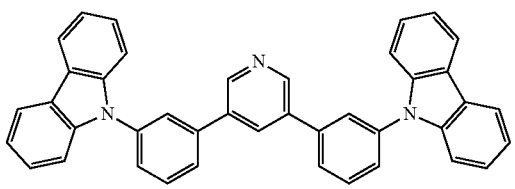
H39 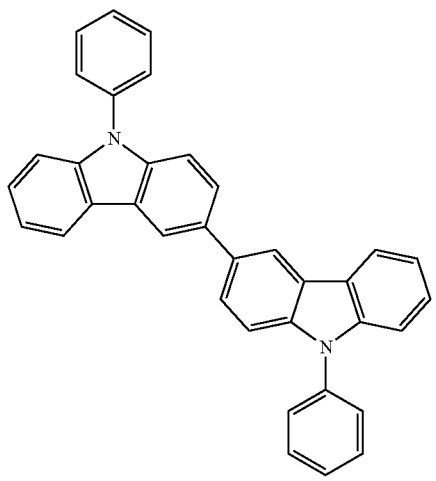
H40 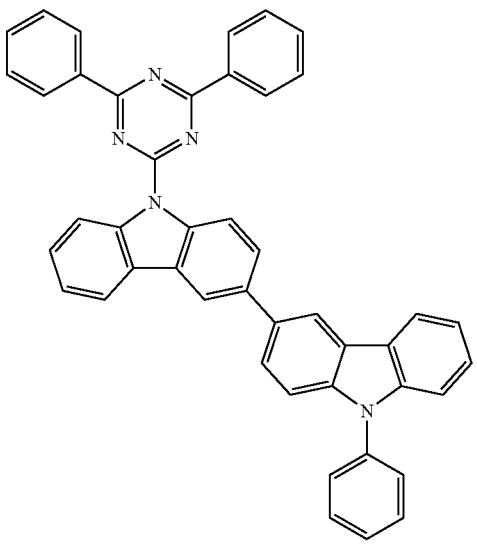
H41 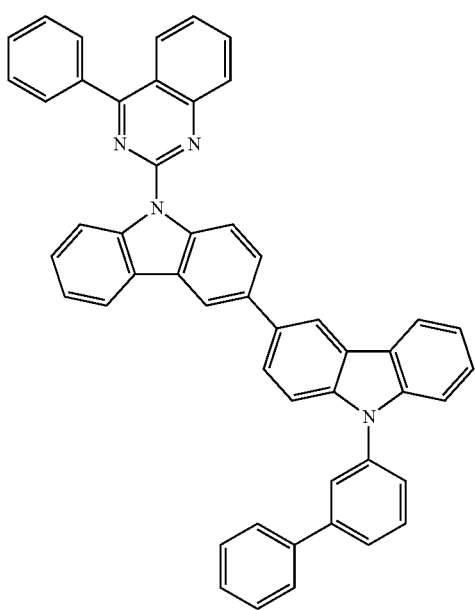
H42 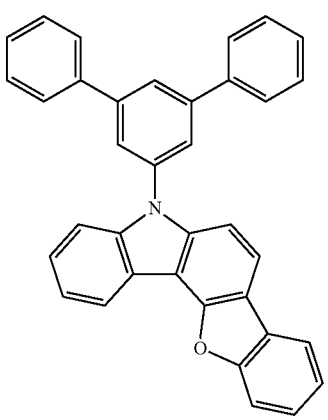

-continued
| | |
|---|---|
| H43 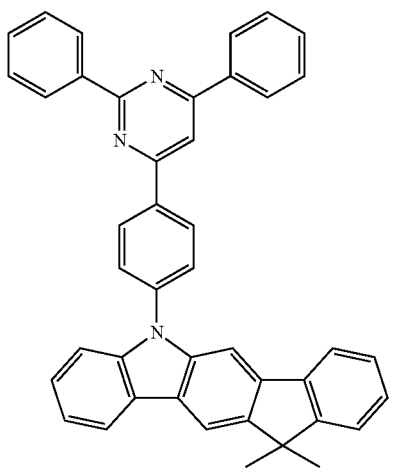 | H44 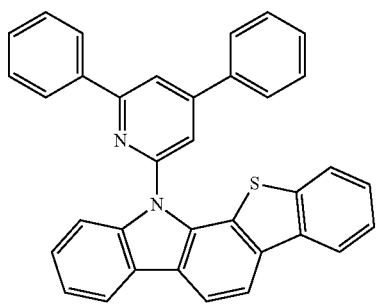 |
| H45 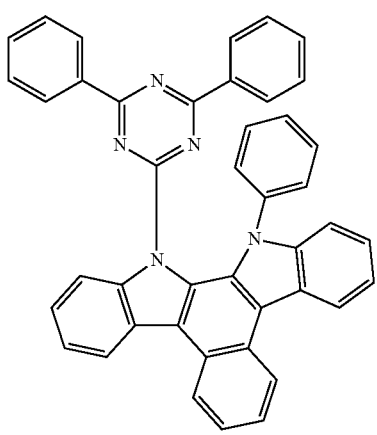 | H46 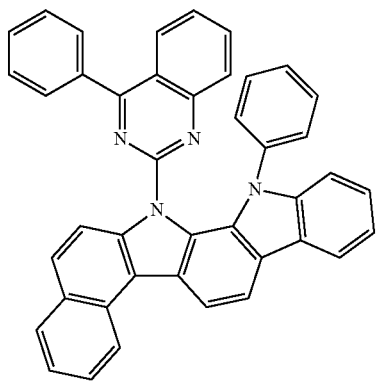 |
| H47 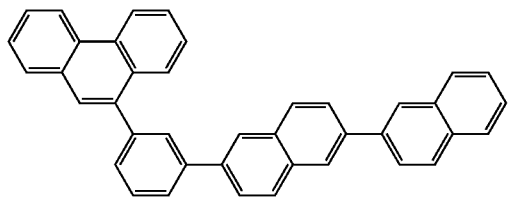 | H48 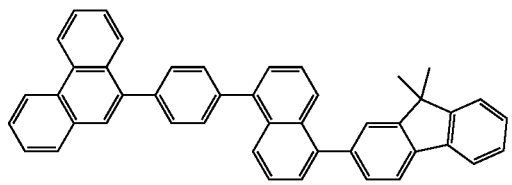 |
| H49 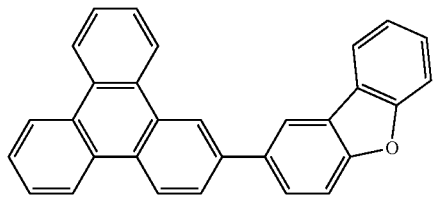 | H50 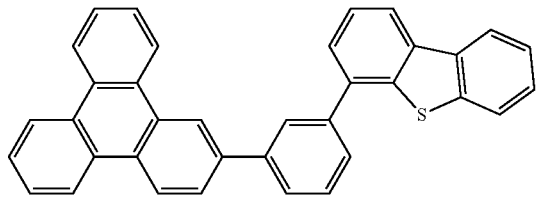 |
| H51 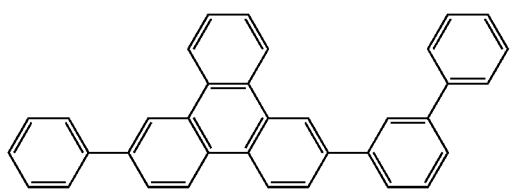 | H52 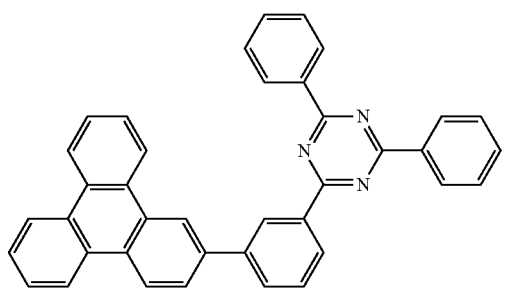 |

-continued
H53
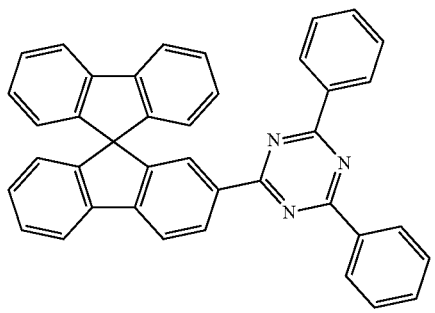
H54
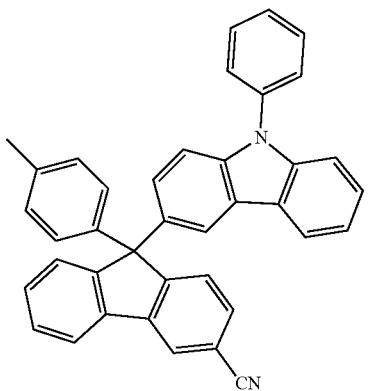
H55
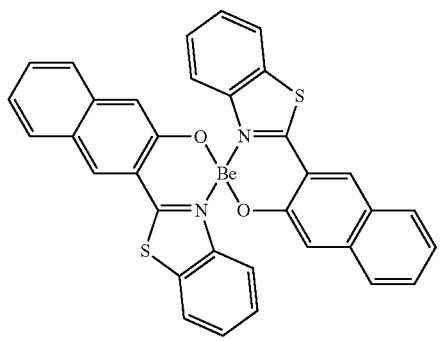
H56
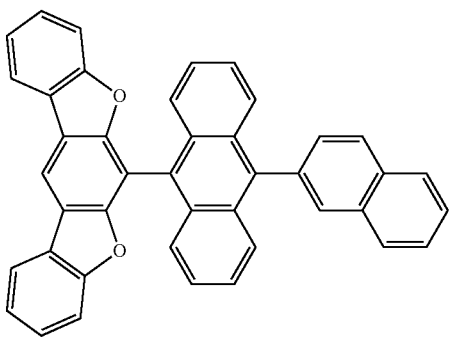
H57
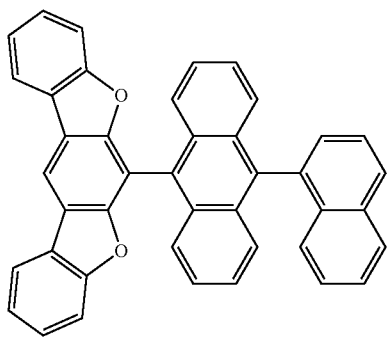
H58
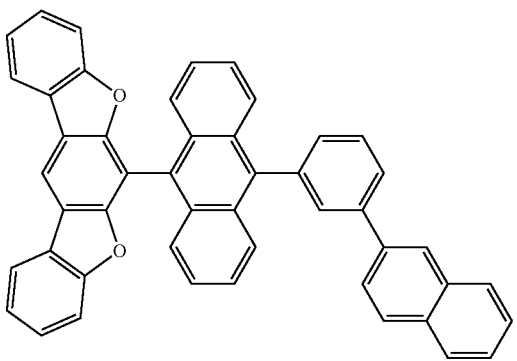
H59
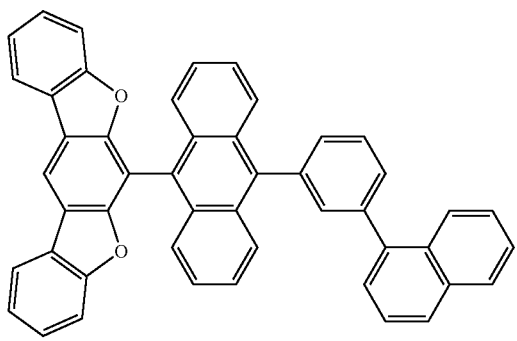
H60
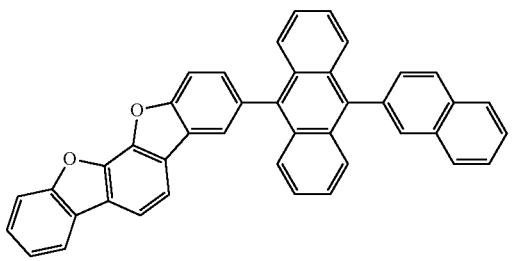

-continued
H61
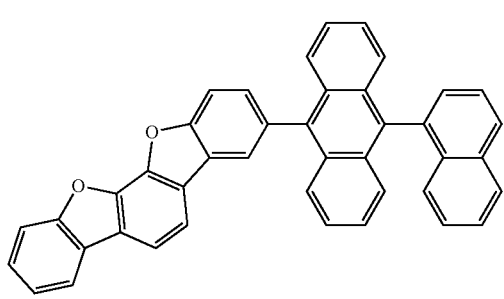
H62
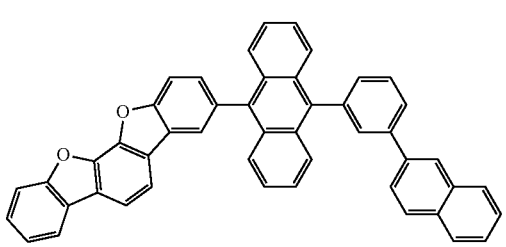
H63
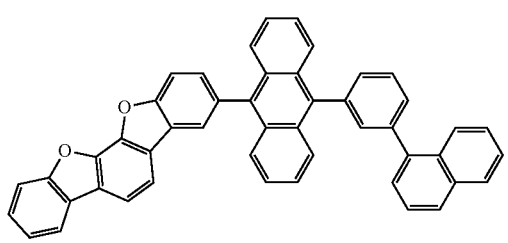
H64
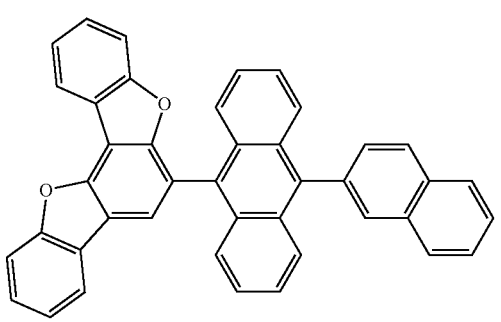
H65
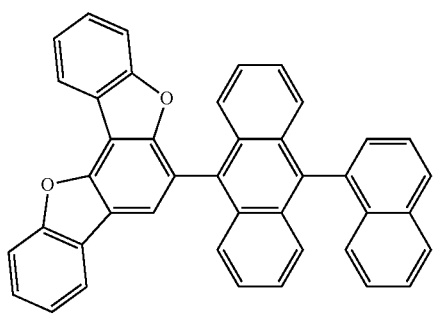
H66
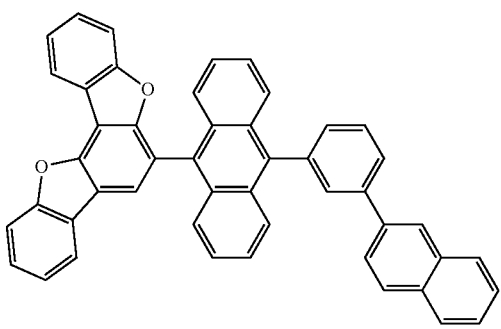
H67
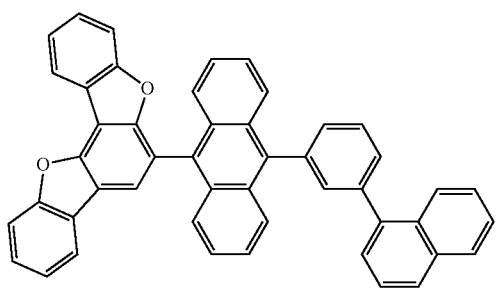
H68
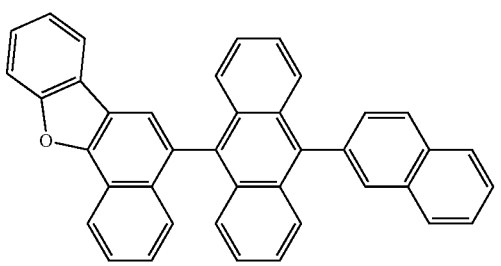
H69
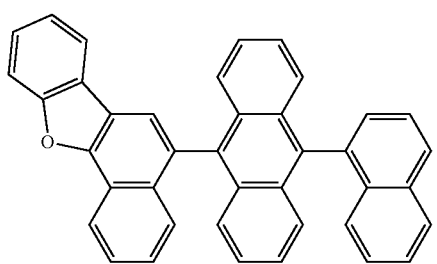
H70
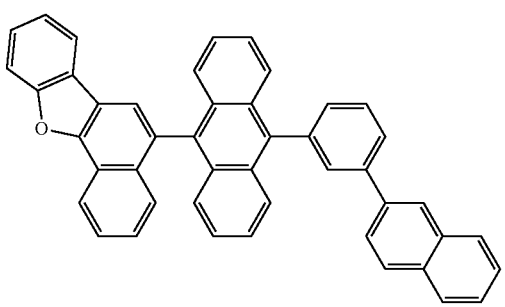

-continued
H71
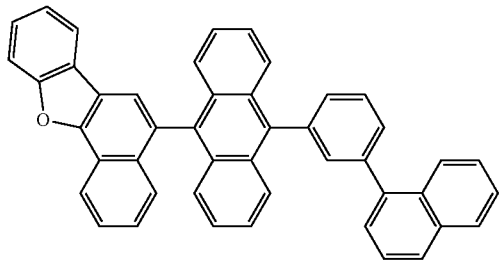
H72
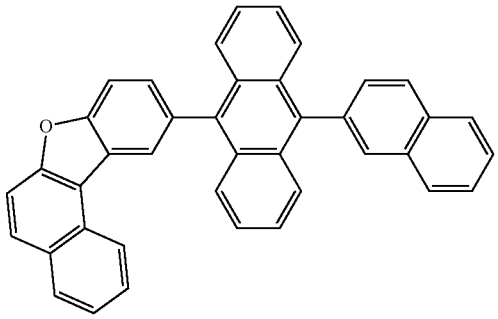
H73
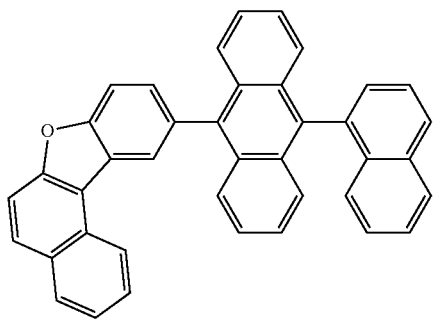
H74
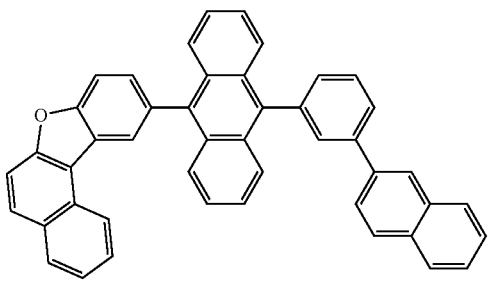
H75
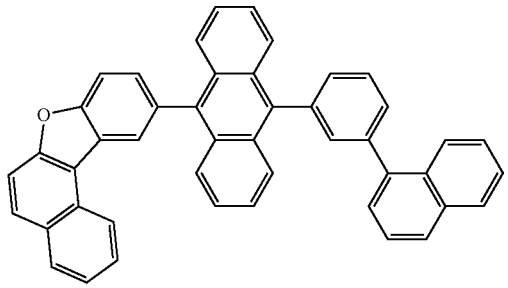
H76
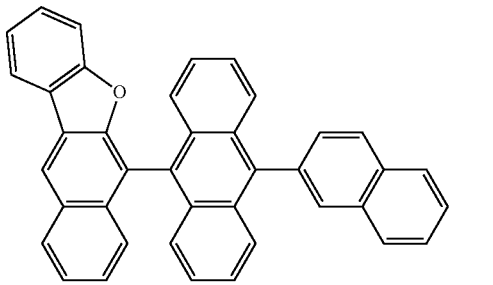
H77
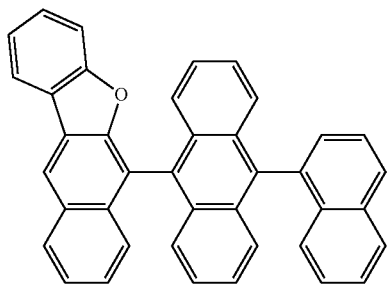
H78
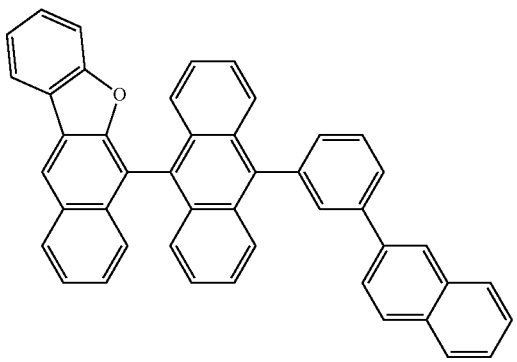
H79
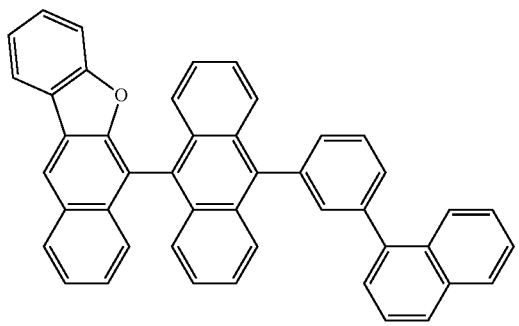
H80
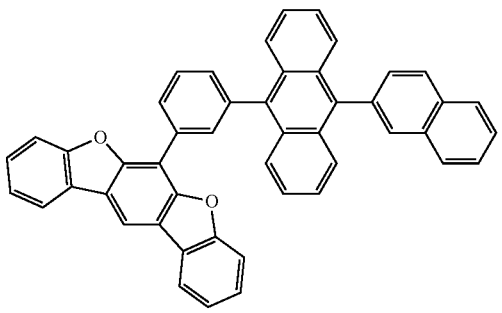

-continued
H81
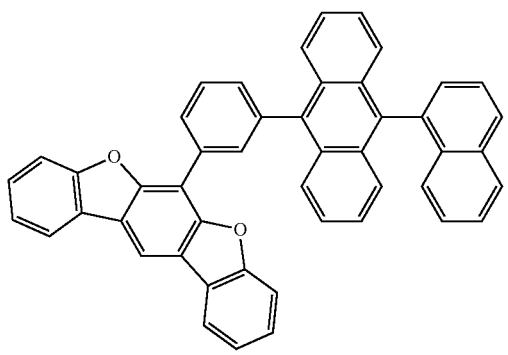
H82
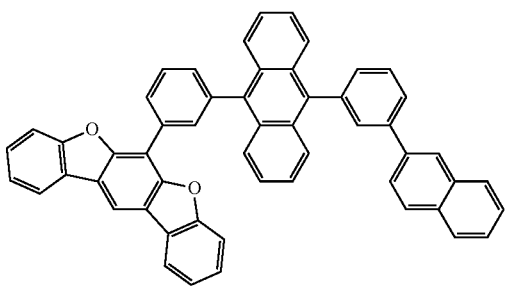
H83
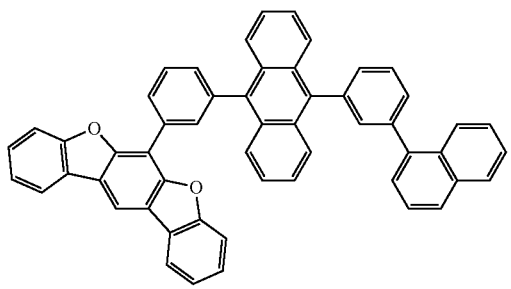
H84
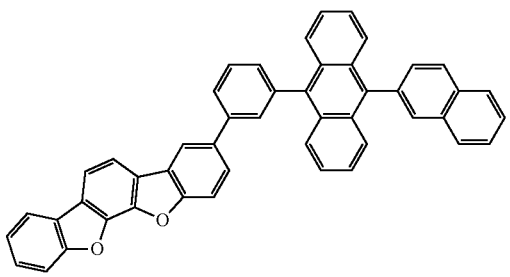
H85
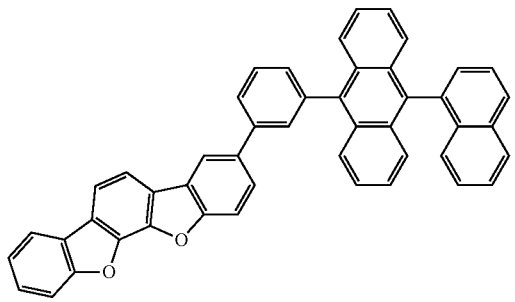
H86
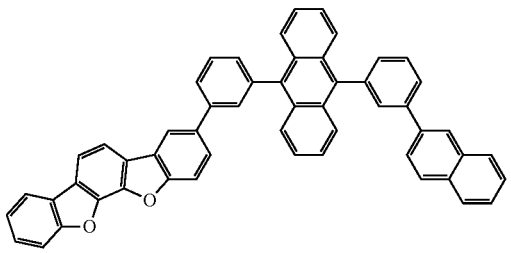
H87
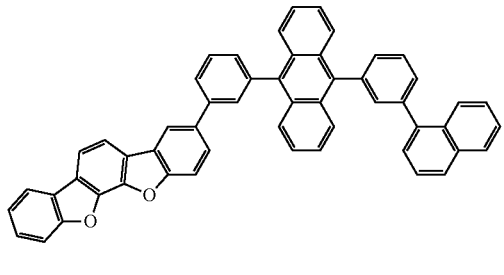
H88
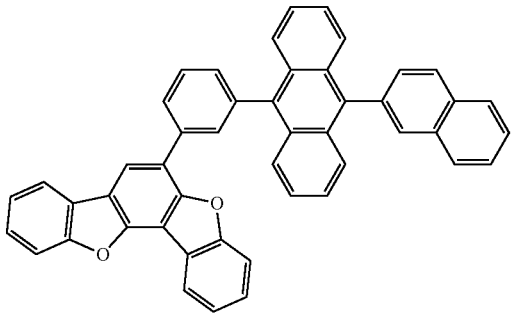
H89
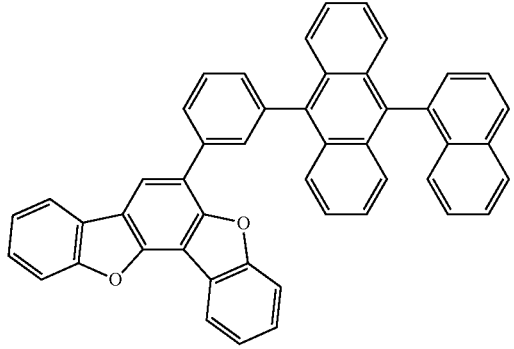
H90
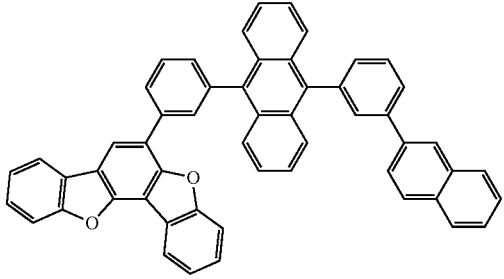

-continued
H91
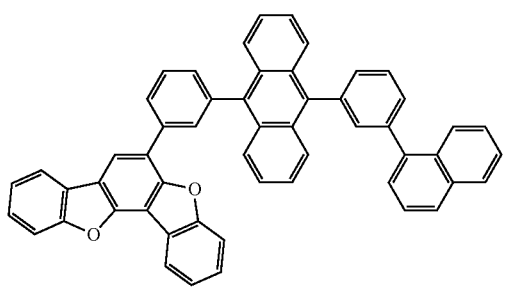
H92
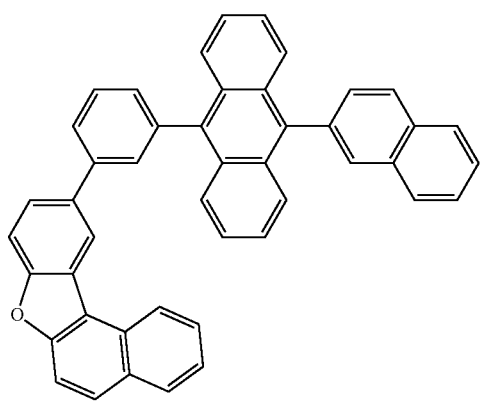
H93
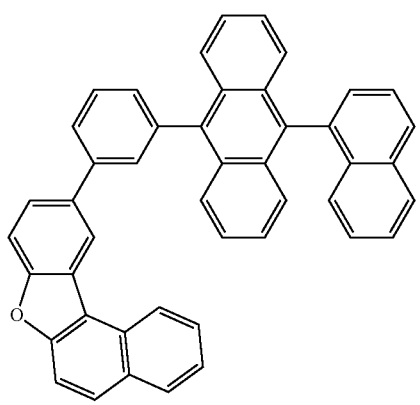
H94
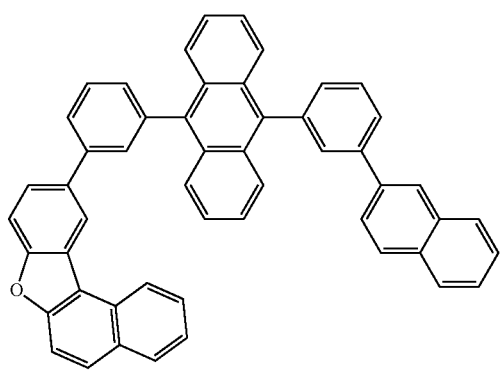
H95
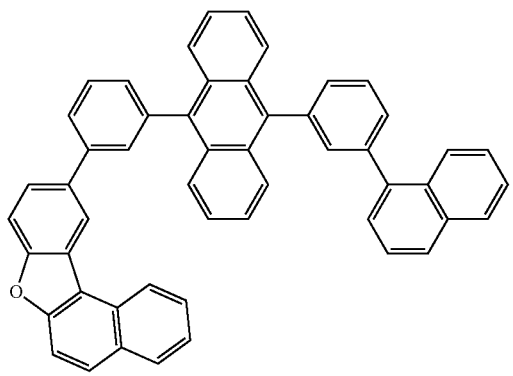
H96
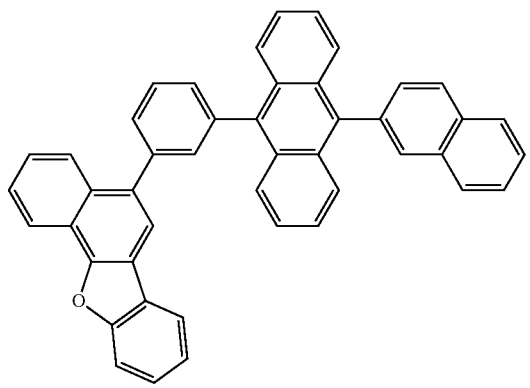
H97
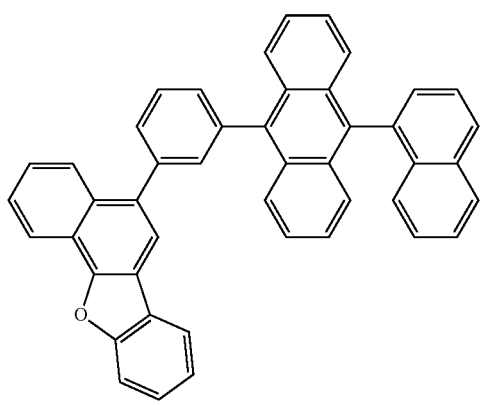
H98
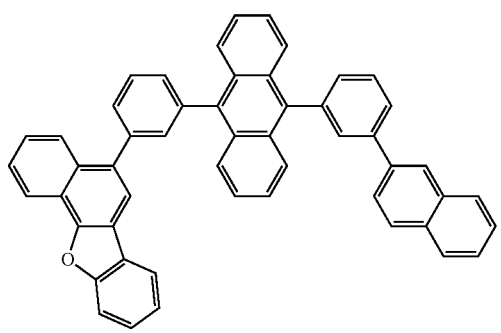

-continued
H99
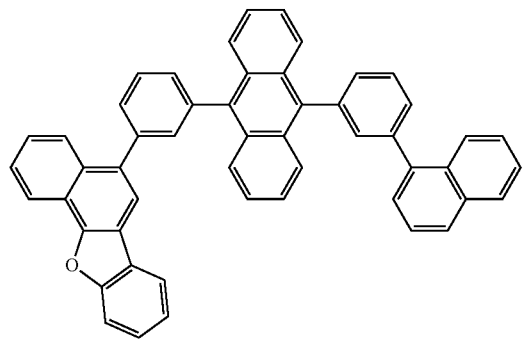
H100
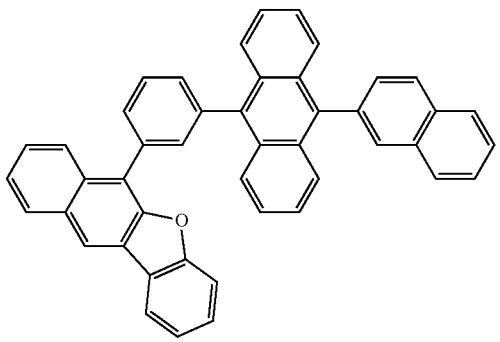
H101
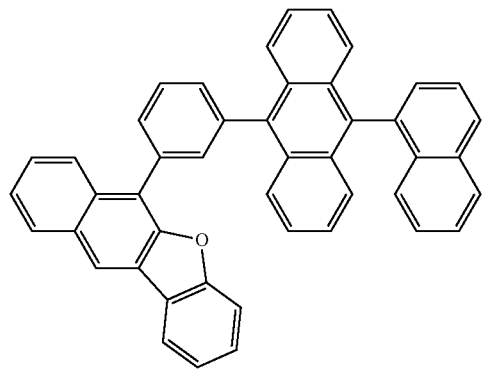
H102
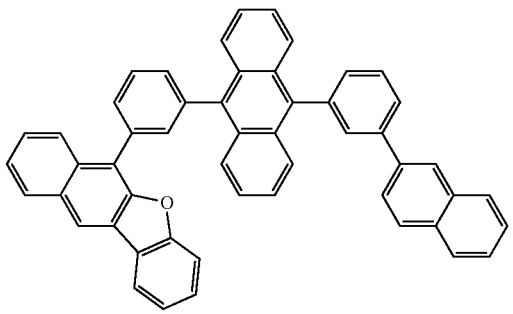
H103
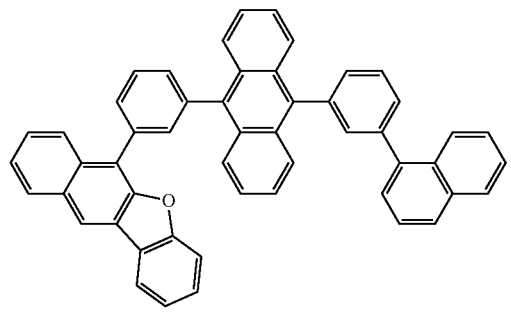
H104
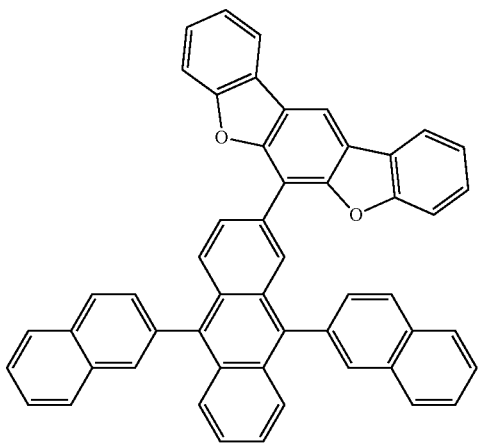
H105
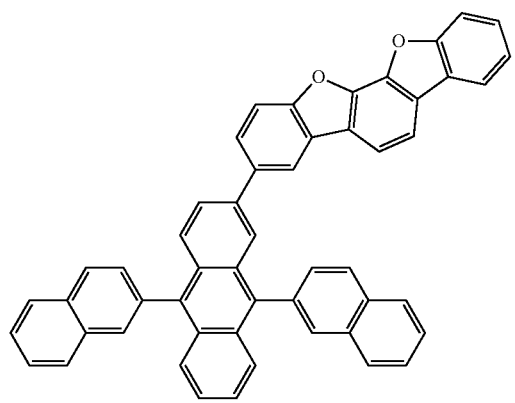
H106
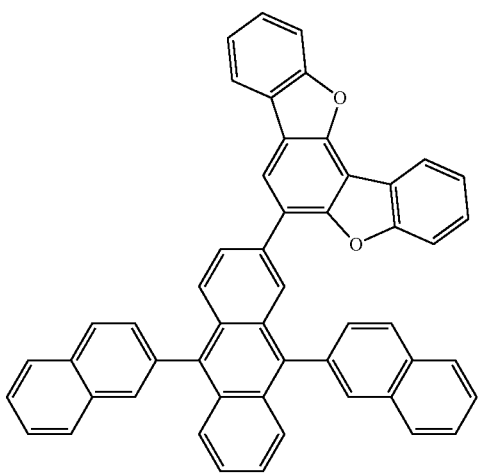

H107
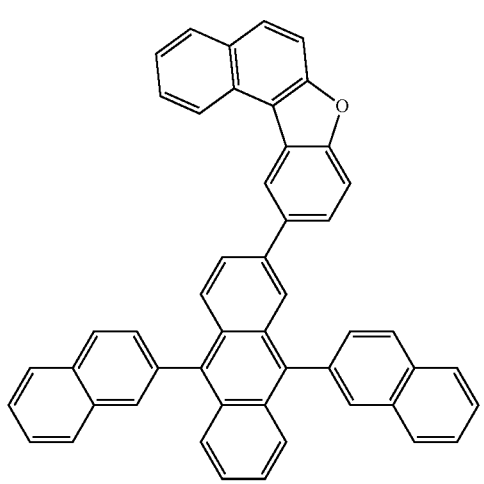
H108
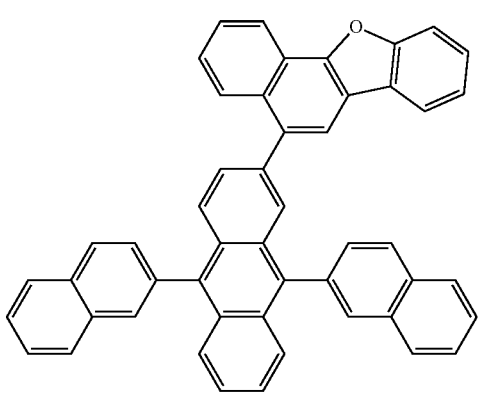
H109
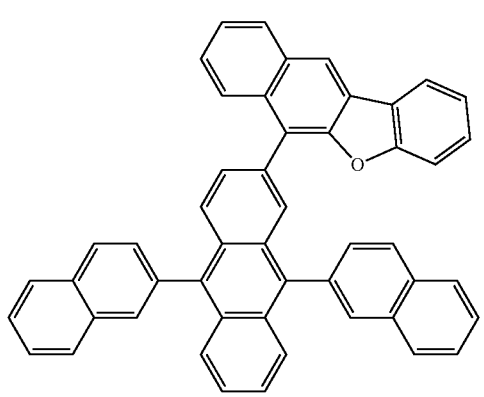
H110
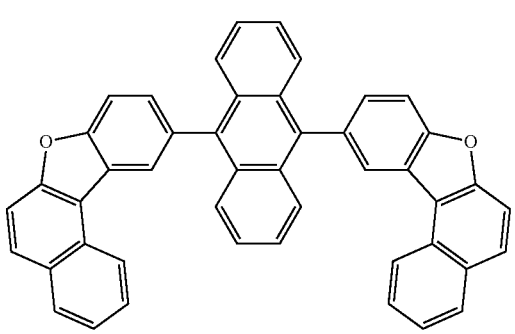
H111
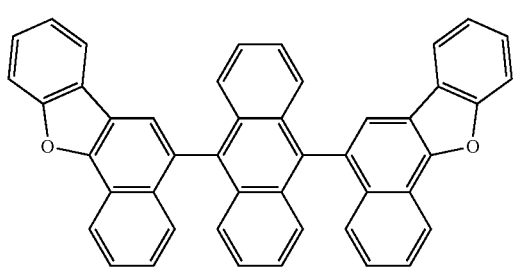
H112
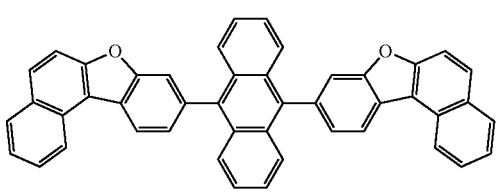
H113
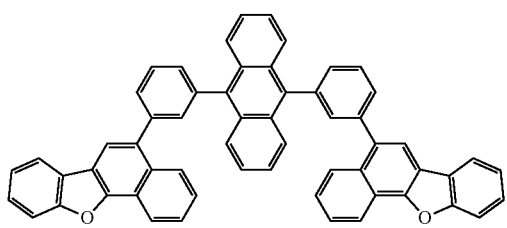

-continued
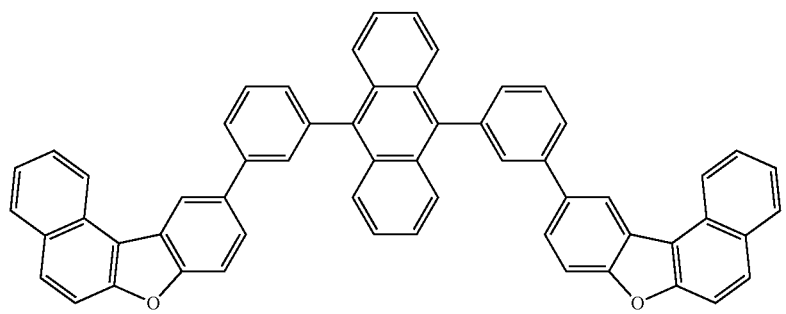
H114
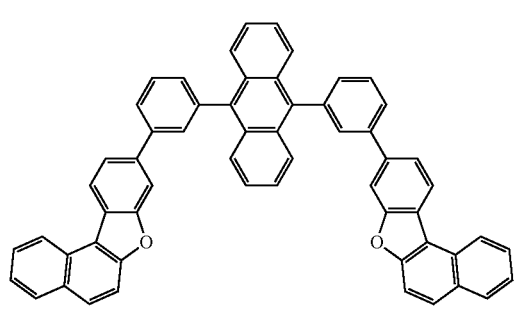
H115
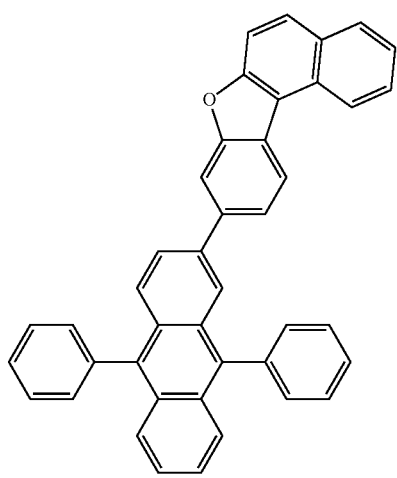
H116
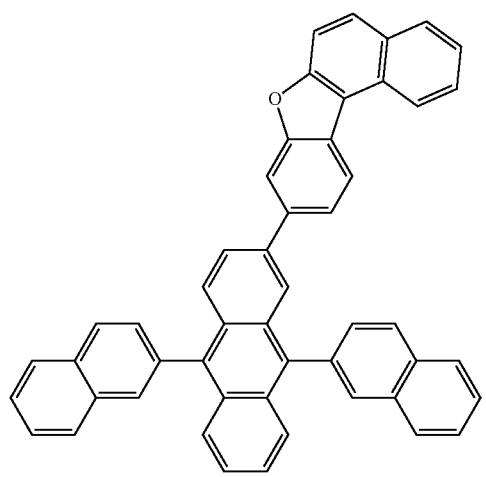
H117
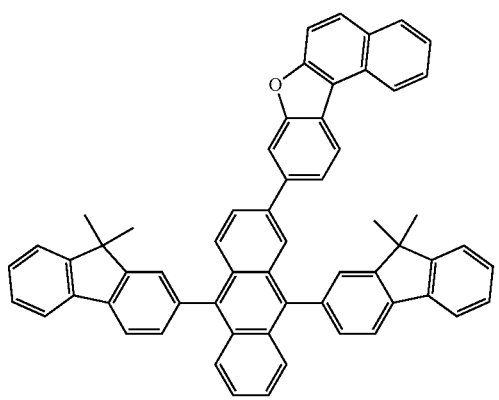
H118

-continued
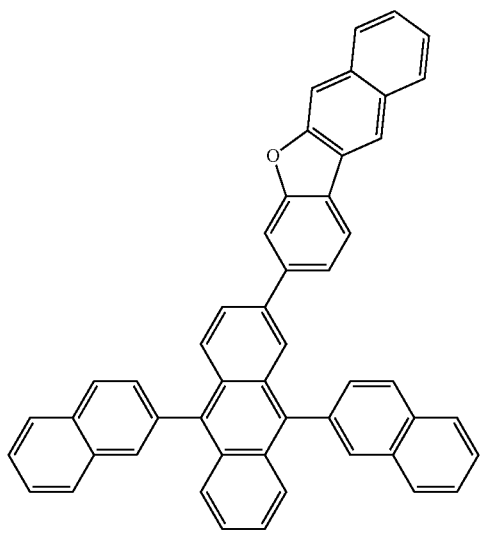
H119
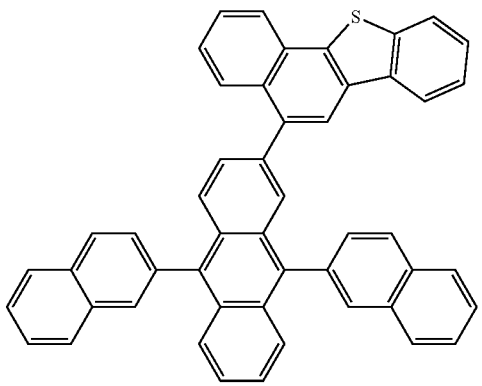
H120
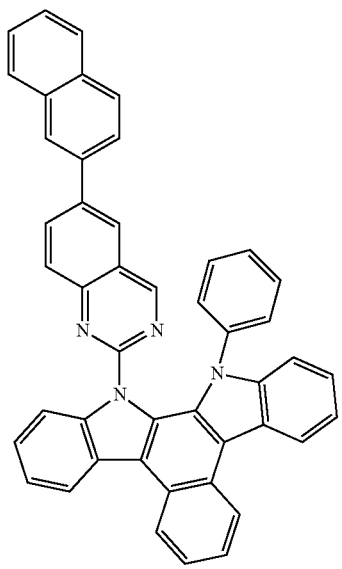
H121
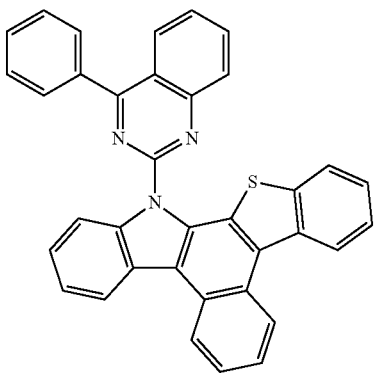
H122
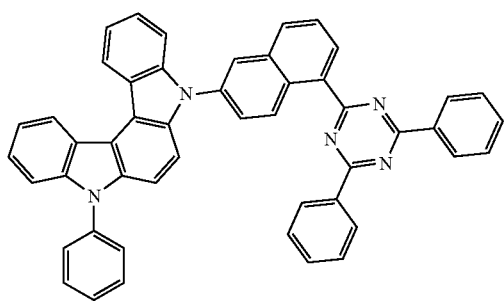
H123
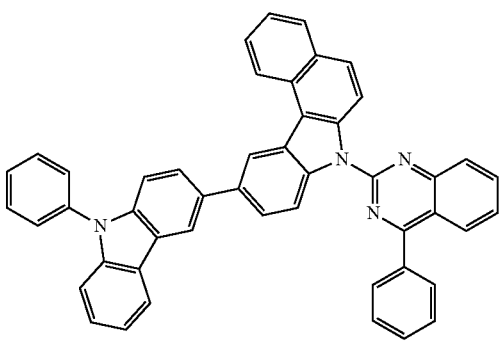
H124

Phosphorescent Dopant

The phosphorescent dopant may include at least one transition metal as a central metal atom.

The phosphorescent dopant may include a monodentate ligand, a bidentate ligand, a tridentate ligand, a tetradentate ligand, a pentadentate ligand, a hexadentate ligand, or any combination thereof.

The phosphorescent dopant may be electrically neutral.

In an embodiment, the phosphorescent dopant may include an organometallic compound represented by Formula 401:

$$M(L_{401})_{xc1}(L_{402})_{xc2}$$ Formula 401

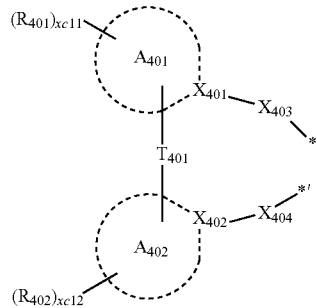

Formula 402 wherein, in Formulae 401 and 402,

M may be a transition metal (for example, iridium (Ir), platinum (Pt), palladium (Pd), osmium (Os), titanium (Ti), gold (Au), hafnium (Hf), europium (Eu), terbium (Tb), rhodium (Rh), rhenium (Re), or thulium (Tm)), $L_{401}$ may be a ligand represented by Formula 402, and xc1 may be 1, 2, or 3, wherein, when xc1 is 2 or more, two or more $L_{401}$(s) may be identical to or different from each other, $L_{402}$ may be an organic ligand, xc2 may be 0, 1, 2, 3, or 4, and when xc2 is 2 or more, two or more of $L_{402}$(s) may be identical to or different from each other, $X_{401}$ and $X_{402}$ may each independently be nitrogen or carbon, ring $A_{401}$ and ring $A_{402}$ may each independently be a $C_3$-$C_{60}$ carbocyclic group, or a $C_1$-$C_{60}$ heterocyclic group, $T_{401}$ may be a single bond, *—O—*', *—S—*', *—C(=O)—*', *—N($Q_{411}$)-*', *—C($Q_{411}$)($Q_{412}$)-*', *—C($Q_{411}$)=C($Q_{412}$)-', *—C($Q_{411}$)=*', or *=C=*', $X_{403}$ and $X_{404}$ may each independently be a chemical bond (for example, a covalent bond or a coordinate bond (e.g., a coordinate covalent bond or dative bond)), O, S, N($Q_{413}$), B($Q_{413}$), P($Q_{413}$), C($Q_{413}$)($Q_{414}$), or Si($Q_{413}$)($Q_{414}$), $Q_{411}$ to $Q_{414}$ are the same as described in connection with $Q_1$, $R_{401}$ and $R_{402}$ may each independently be hydrogen, deuterium, —F, —Cl, —Br, —I, a hydroxyl group, a cyano group, a nitro group, a $C_1$-$C_{20}$ alkyl group unsubstituted or substituted with at least one $R_{10a}$, a $C_1$-$C_{20}$ alkoxy group unsubstituted or substituted with at least one $R_{10a}$, a $C_3$-$C_{60}$ carbocyclic group unsubstituted or substituted with at least one $R_{10a}$, a $C_1$-$C_{60}$ heterocyclic group unsubstituted or substituted with at least one $R_{10a}$, —Si($Q_{401}$)($Q_{402}$)($Q_{403}$), —N($Q_{401}$)($Q_{402}$), —B($Q_{401}$)($Q_{402}$), —C(=O)($Q_{401}$), —S(=O)$_2$($Q_{401}$), or —P(=O)($Q_{401}$)($Q_{402}$), $Q_{401}$ to $Q_{403}$ are the same as described in connection with $Q_1$, xc11 and xc12 may each independently be an integer from 0 to 10, and

* and *' in Formula 402 each indicate a binding site to M in Formula 401.

In one or more embodiments, in Formula 402, i) $X_{401}$ may be nitrogen, and $X_{402}$ may be carbon, or ii) each of $X_{401}$ and $X_{402}$ may be nitrogen.

In one or more embodiments, when xc1 in Formula 401 is 2 or more, two ring $A_{401}$(s) in two or more $L_{401}$(s) may optionally be linked to each other via $T_{402}$, which is a linking group, or two ring $A_{402}$(s) in two or more $L_{401}$(s) may optionally be linked to each other via $T_{403}$, which is a linking group (see Compounds PD1 to PD4 and PD7). $T_{402}$ and $T_{403}$ are the same as described in connection with $T_{401}$.

$L_{402}$ in Formula 401 may be an organic ligand. In an embodiment, $L_{402}$ may be a halogen group, a diketone group (for example, an acetylacetonate group), a carboxylic acid group (for example, a picolinate group), —C(=O), an isonitrile group, a —CN group, a phosphorus group (for example, a phosphine group and/or a phosphite group), or any combination thereof.

The phosphorescent dopant may include, for example, one of the following Compounds PD1 to PD25, or any combination thereof:

PD1

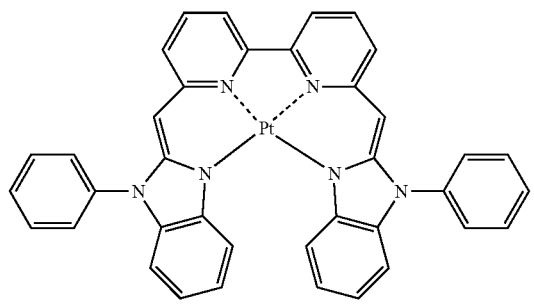

PD2

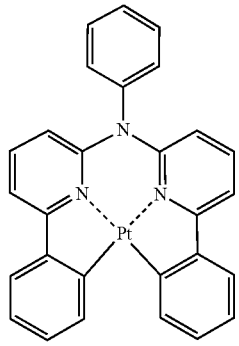

PD3

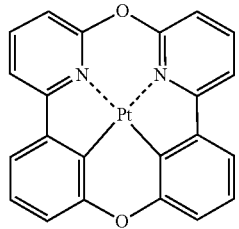

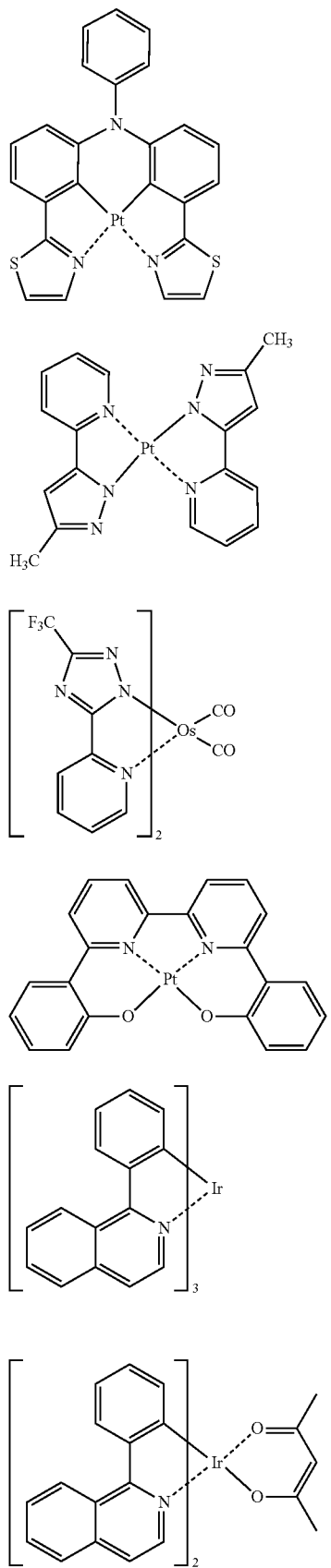
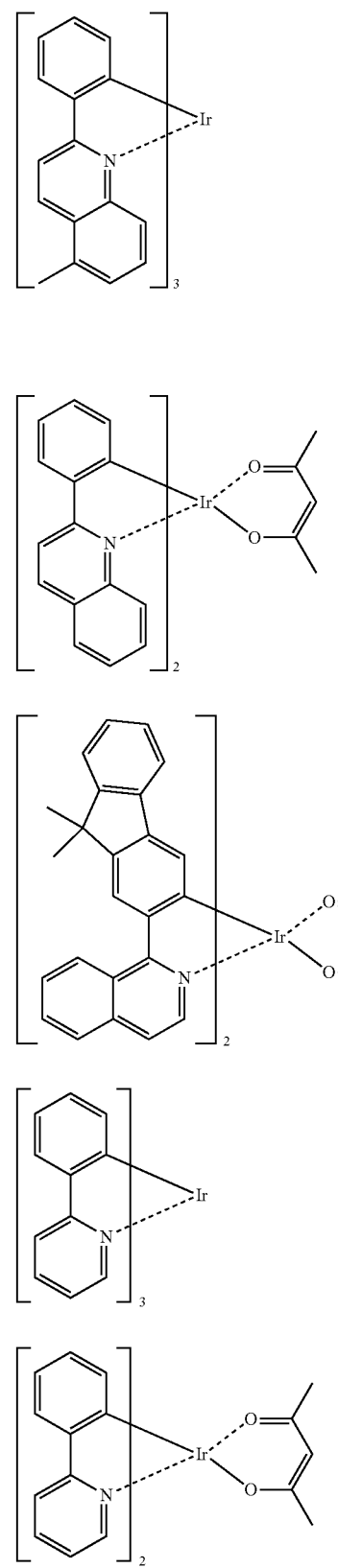

PD15 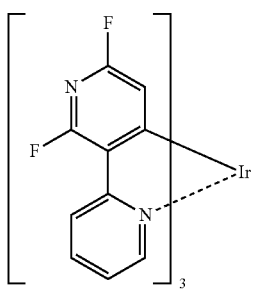
PD16 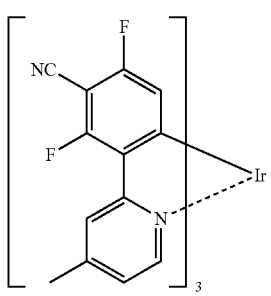
PD17 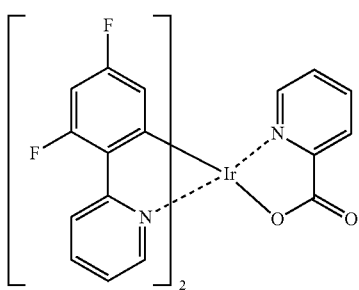
PD18 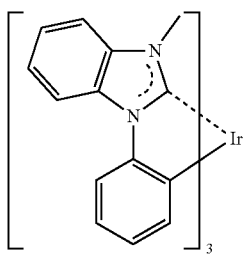
PD19 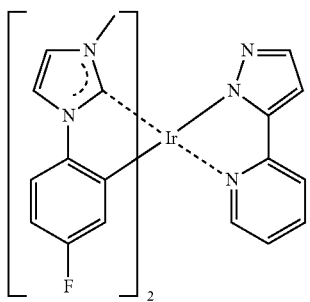
PD20 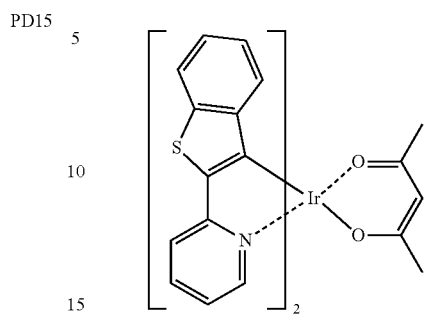
PD21 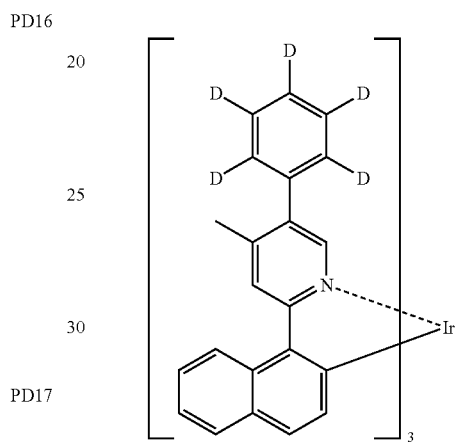
PD22 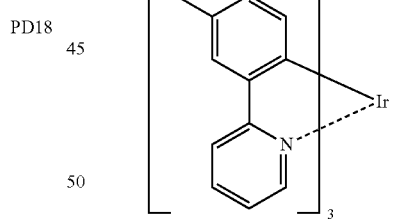
PD23 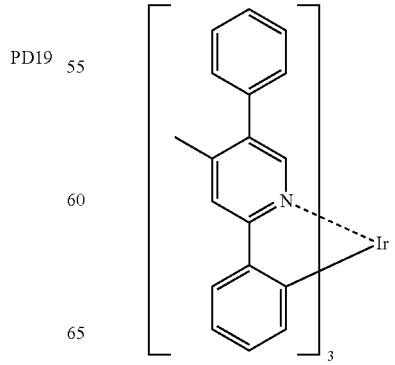

Fluorescent Dopant

The fluorescent dopant may include an amine group-containing compound, a styryl group-containing compound, or any combination thereof.

In an embodiment, the fluorescent dopant may include a compound represented by Formula 501:

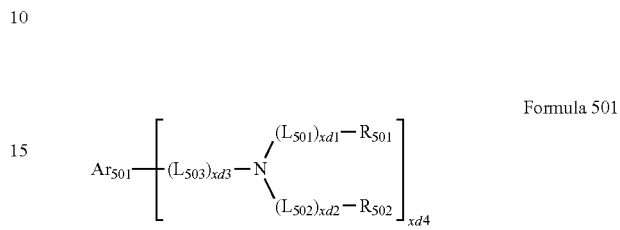

Formula 501 wherein, in Formula 501, $Ar_{501}$, $L_{501}$ to $L_{503}$, $R_{501}$, and $R_{502}$ may each independently be a $C_5$-$C_{60}$ carbocyclic group unsubstituted or substituted with at least one $R_{10a}$, or a $C_1$-$C_{60}$ heterocyclic group unsubstituted or substituted with at least one $R_{10a}$, xd1 to xd3 may each independently be 0, 1, 2, or 3, xd4 may be 1, 2, 3, 4, 5, or 6.

In an embodiment, $Ar_{501}$ in Formula 501 may be a condensed cyclic group (for example, an anthracene group, a chrysene group, or a pyrene group) in which three or more monocyclic groups are condensed (e.g., combined together).

In one or more embodiments xd4 in Formula 501 may be 2.

In an embodiment, the fluorescent dopant may include: one of Compounds FD1 to FD36; DPVBi; DPAVBi; or any combination thereof:

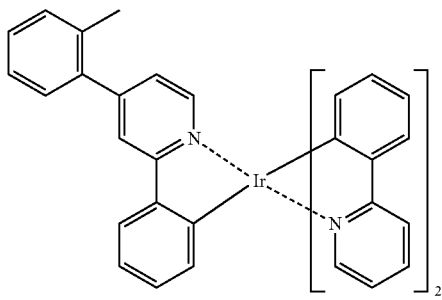

PD24

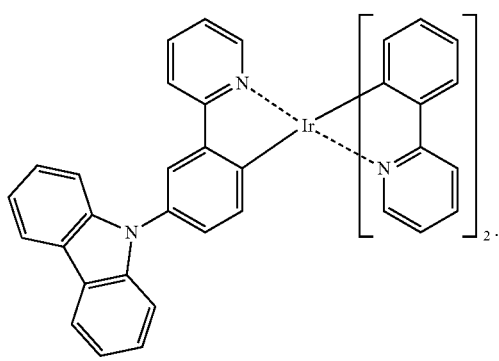

PD25

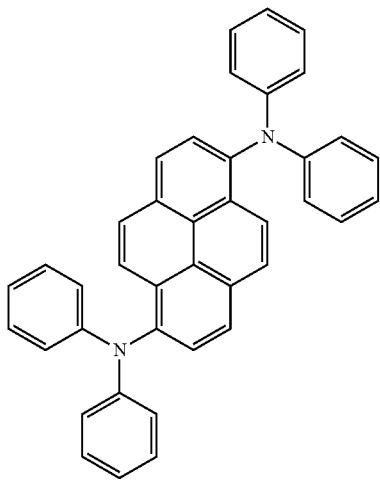

FD1

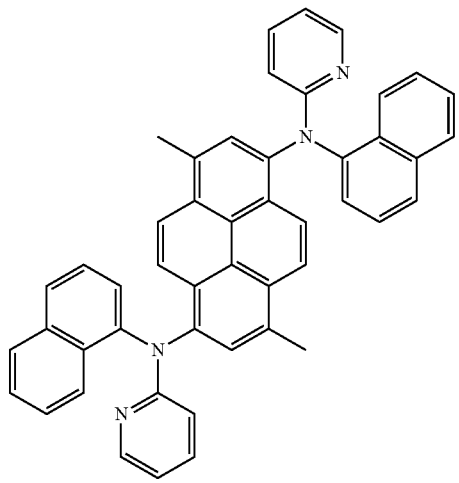

FD2

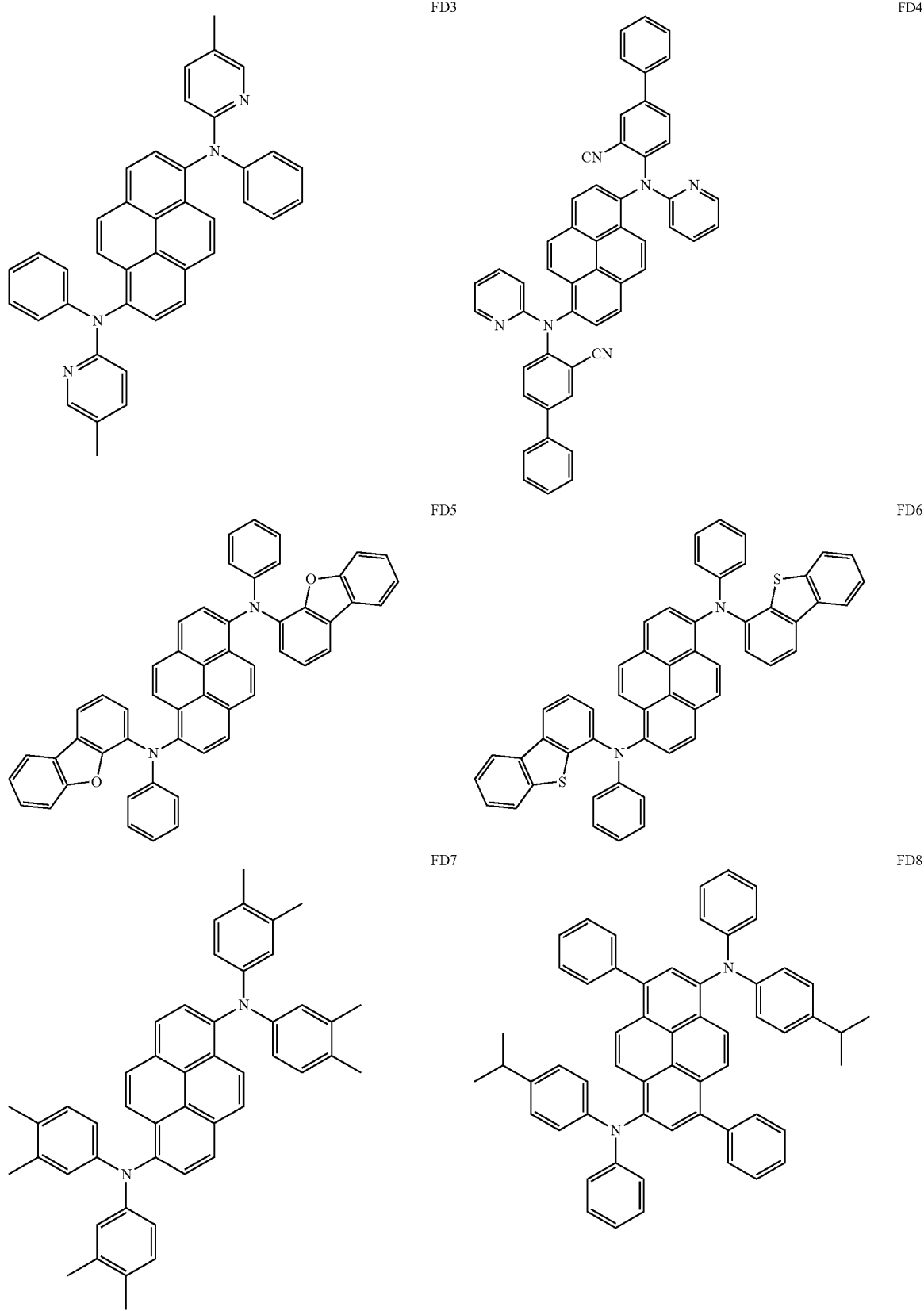

-continued
FD9
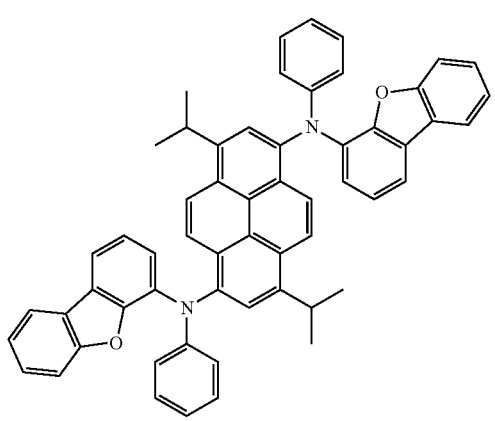
FD10
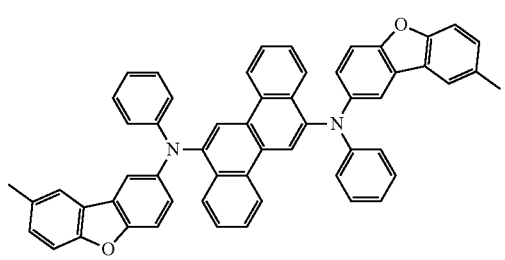
FD11
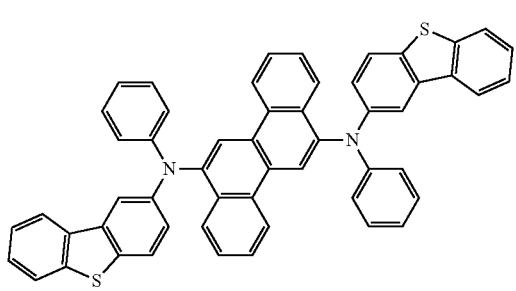
FD12
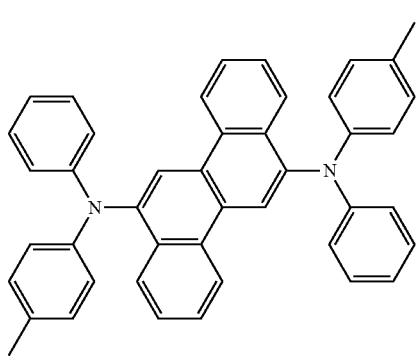
FD13
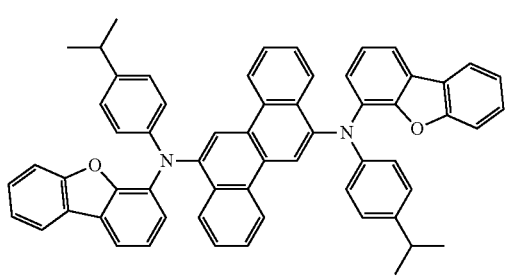
FD14
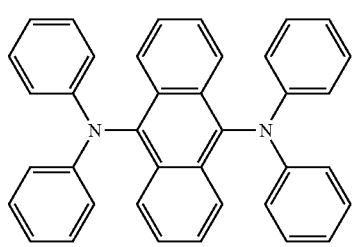
FD15
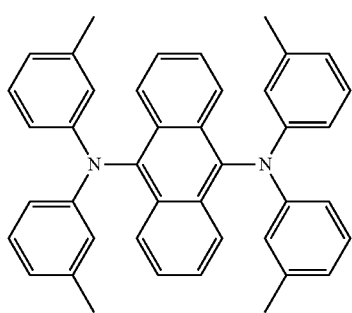
FD16
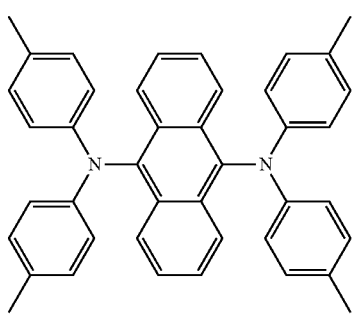

-continued
FD17
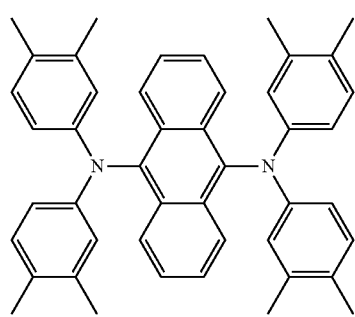
FD18
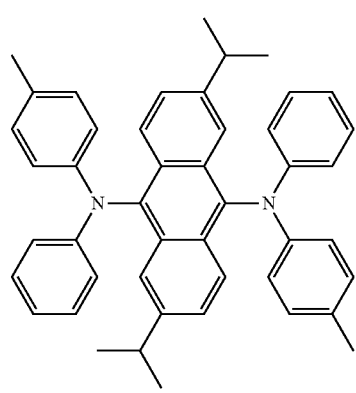
FD19
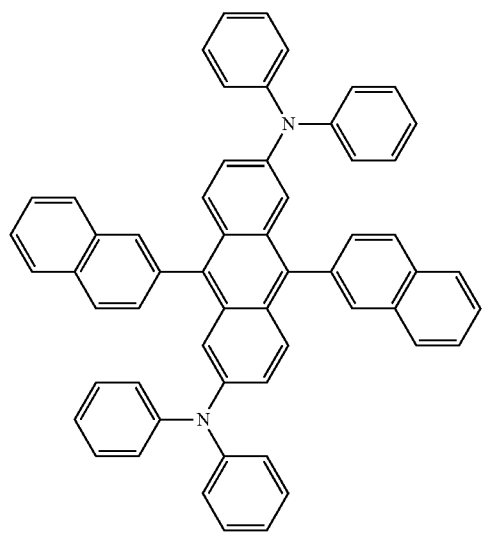
FD20
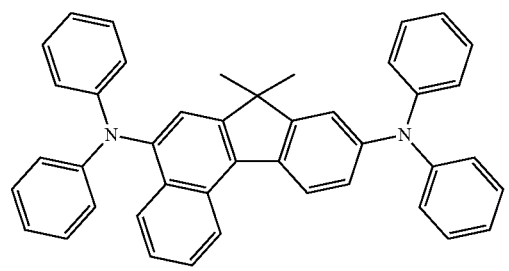
FD21
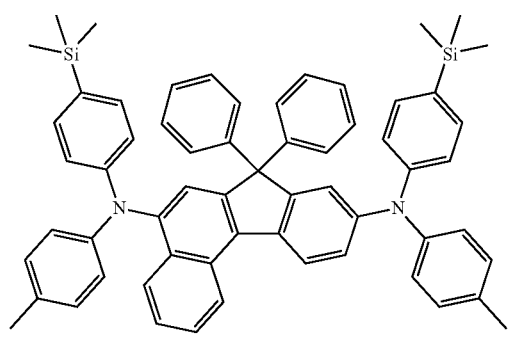
FD22
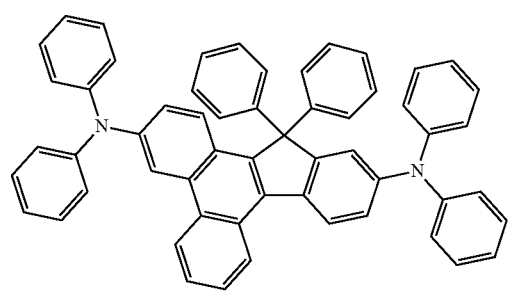
FD23
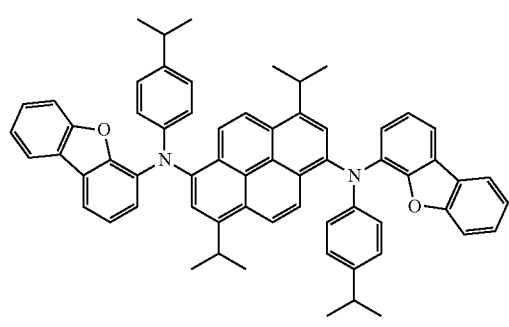
FD24
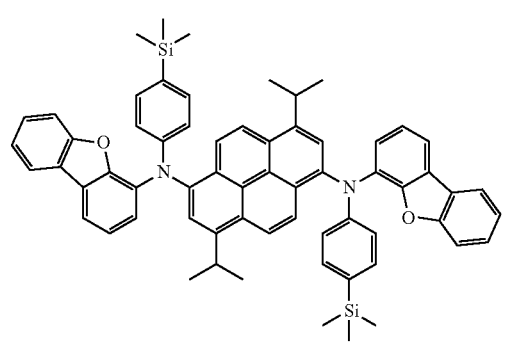

-continued
FD25
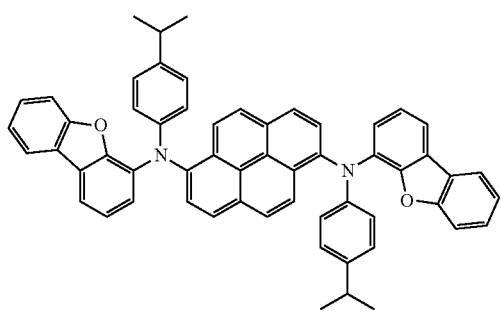
FD26
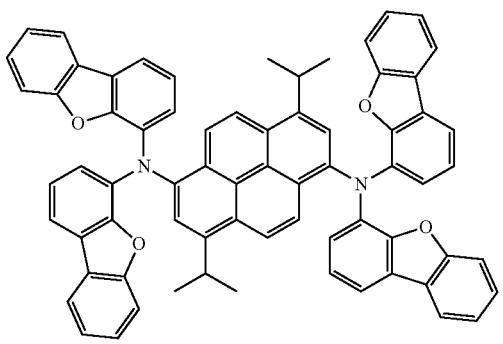
FD27
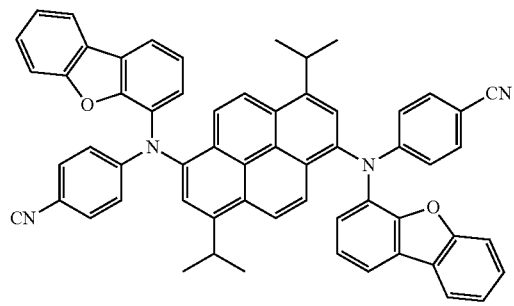
FD28
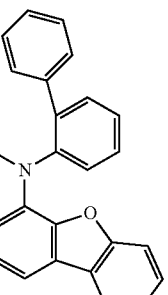
FD29
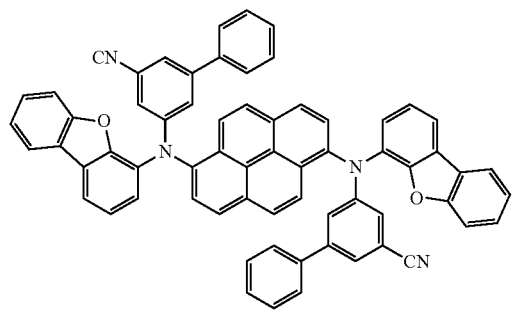
FD30
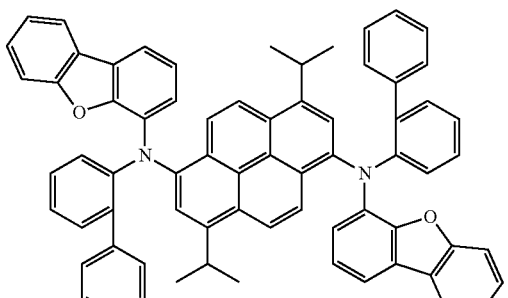
FD31
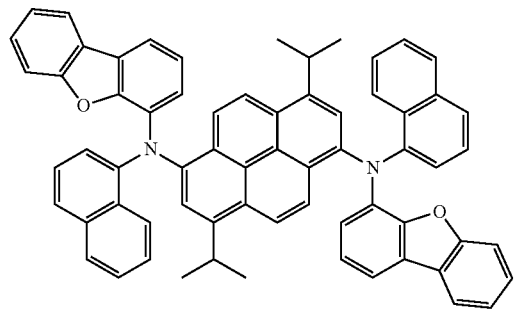
FD32
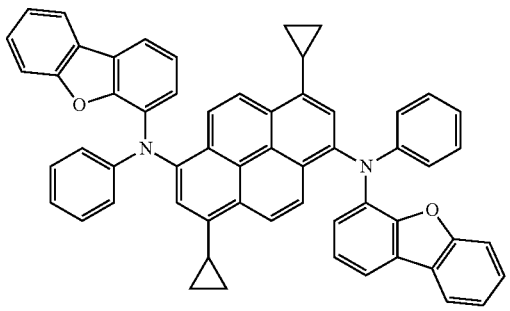
FD33
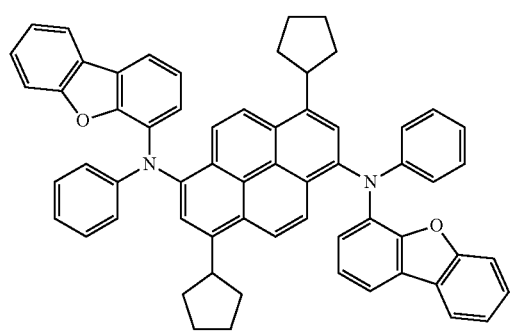
FD34
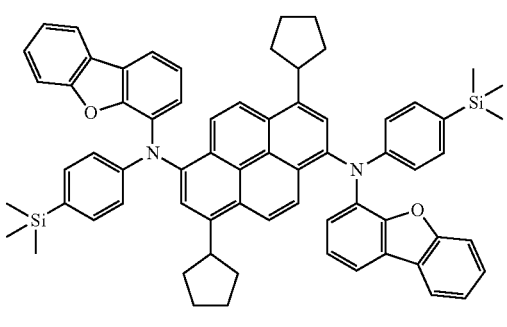

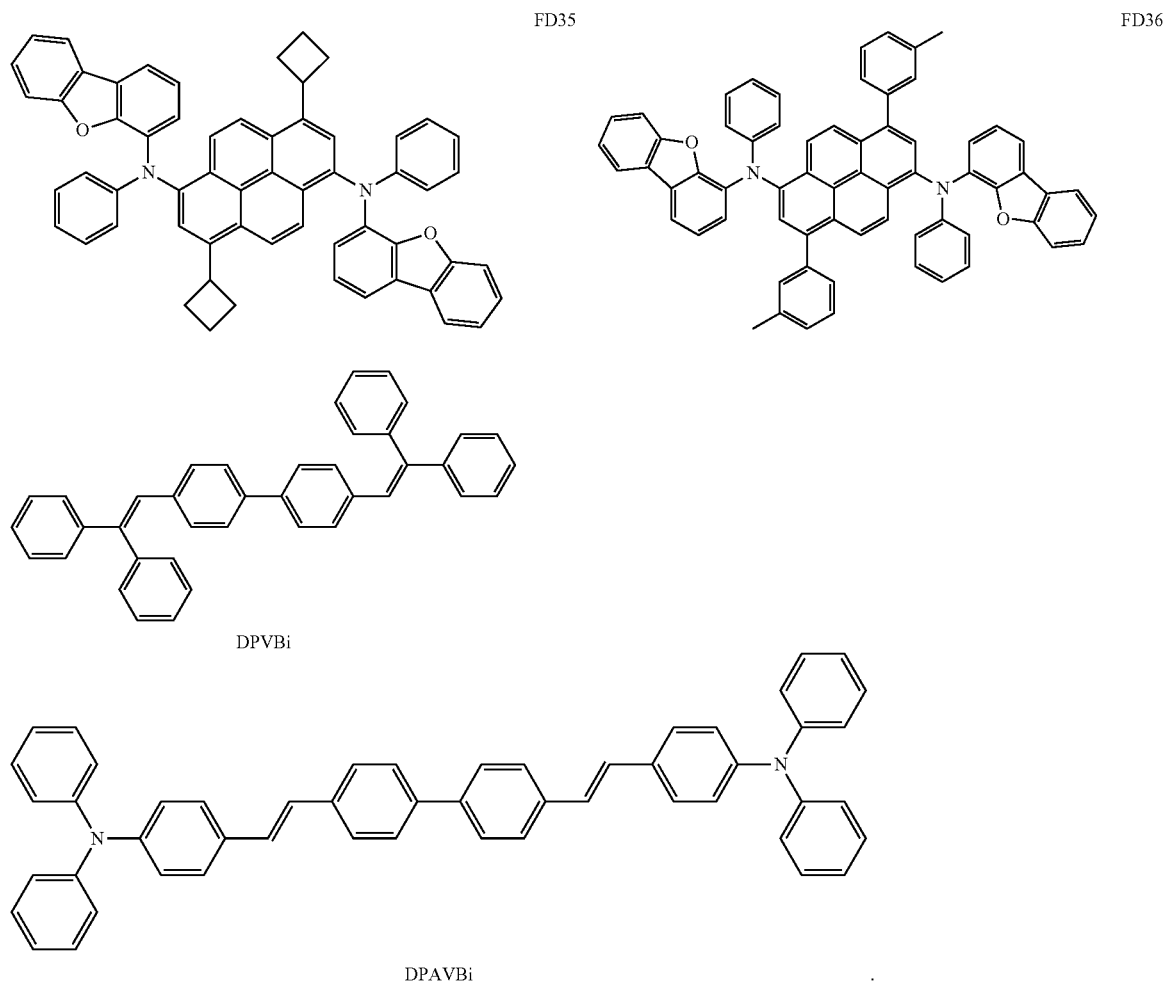

DPVBi

DPAVBi

Delayed Fluorescent Material

The emission layer 133 may include a delayed fluorescent material.

The delayed fluorescent material used herein may be selected from any suitable compound that is capable of emitting delayed fluorescent light based on a delayed fluorescence emission mechanism.

The delayed fluorescent material included in the emission layer 133 may act as a host or a dopant depending on the type (or kind) of other materials included in the emission layer 133.

In an embodiment, the difference between the triplet energy level (eV) of the delayed fluorescent material and the singlet energy level (eV) of the delayed fluorescent material may be 0 eV or more and 0.5 eV or less. When the difference between the triplet energy level (eV) of the delayed fluorescent material and the singlet energy level (eV) of the delayed fluorescent material satisfies the above-described range, up-conversion from the triplet state to the singlet state of the delayed fluorescent materials may effectively occur, and thus, the luminescence efficiency of the light-emitting device 10 may be improved.

In an embodiment, the delayed fluorescent material may include i) a material that includes at least one electron donor (for example, a π electron-rich $C_3$-$C_{60}$ cyclic group, such as a carbazole group) and at least one electron acceptor (for example, a sulfoxide group, a cyano group, or a π electron-deficient nitrogen-containing $C_1$-$C_{60}$ cyclic group), ii) a material including a $C_8$-$C_{60}$ polycyclic group in which two or more cyclic groups share boron (B) and are condensed with each other (e.g., combined together with each other).

The delayed fluorescent material may include at least one of compounds DF1 to DF9:

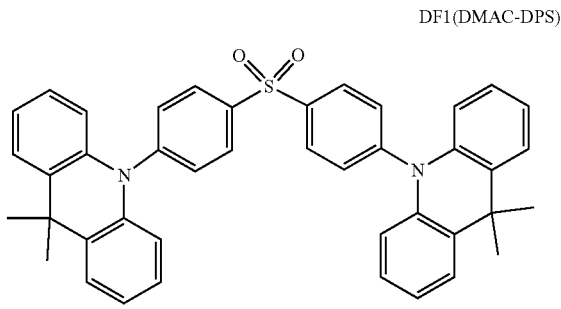

DF1(DMAC-DPS)

-continued

DF2(ACRFLCN)

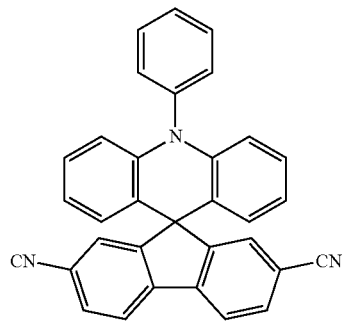

DF3(ACRSA)

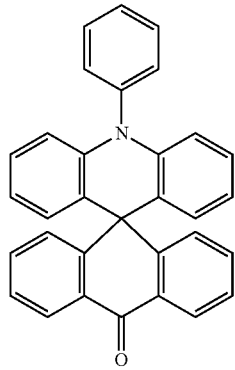

DF4(CC2TA)

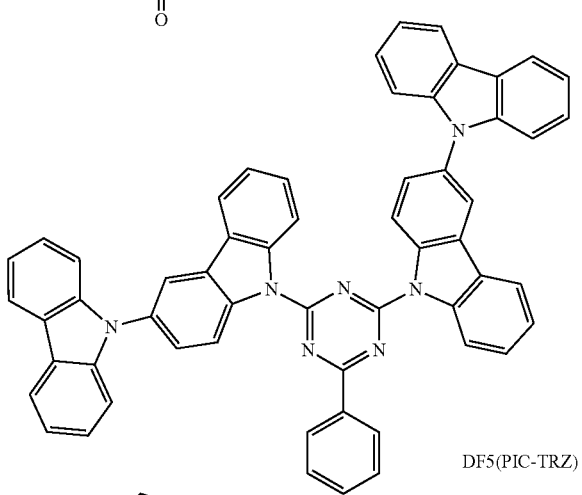

DF5(PIC-TRZ)

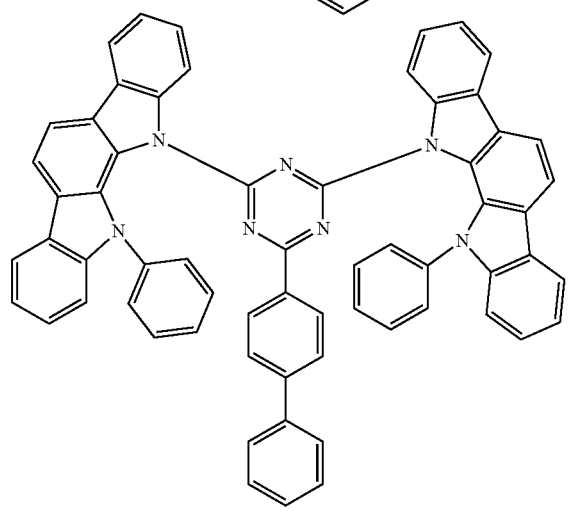

-continued

DF6(PIC-TRZ2)

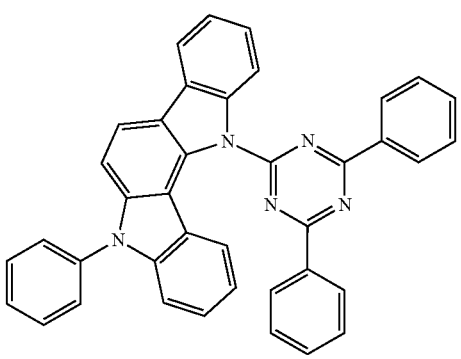

DF7(PXZ-TRZ)

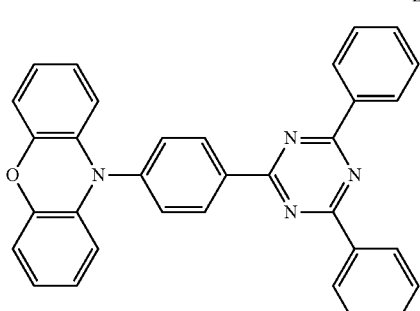

DF8(DABNA-1)

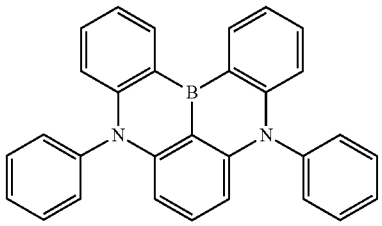

DF9(DABNA-2)

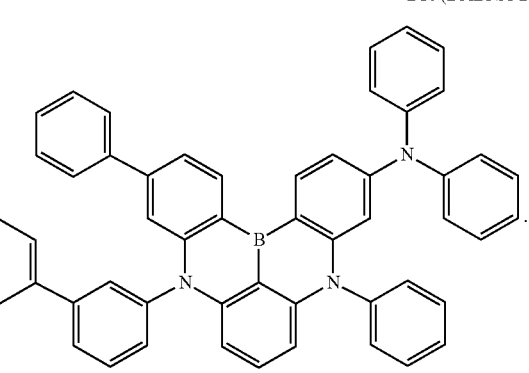

Quantum Dot

In one or more embodiments, the emission layer 133 may include a quantum dot. The quantum dot may be a light-emitting quantum dot. The emission layer 133 may further include a matrix material (for example, a polymer) in addition to quantum dots. For example, the emission layer 133 may include a quantum dot and a matrix material, and quantum dots may be dispersed in the matrix material.

The term "quantum dot," as used herein, refers to the crystal of a semiconductor compound, and may include any suitable material that is capable of emitting light of various suitable emission wavelengths depending on the size of the crystal.

The quantum dot may be synthesized by a wet chemical process, an metal organic chemical vapor deposition process, a molecular beam epitaxy process, and/or a process that is similar to these processes.

The wet chemical process refers to a method in which a solvent and a precursor material are mixed, and then, a quantum dot particle crystal is grown. When the crystal grows, the organic solvent acts as a dispersant naturally coordinated on the surface of the quantum dot crystal and controls the growth of the crystal. Accordingly, by using a process that is easily performed at low costs compared to a vapor deposition process, such as a metal organic chemical vapor deposition (MOCVD) process and a molecular beam epitaxy (MBE) process, the growth of quantum dot particles may be controlled.

The quantum dot may include a Group III-VI semiconductor compound, a Group II-VI semiconductor compound, a Group III-V semiconductor compound, a Group semiconductor compound, a Group IV-VI semiconductor compound, a Group IV element or compound, or any combination thereof.

Examples of the Group II-VI semiconductor compound include a binary compound, such as CdSe, CdTe, ZnS, ZnSe, ZnTe, ZnO, HgS, HgSe, HgTe, MgSe, and/or MgS; a ternary compound, such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and/or MgZnS; a quaternary compound, such as CdZnSeS, CdZnSeTe, CdZnSTe, CdHgSeS, CdHgSeTe, CdHgSTe, HgZnSeS, HgZnSeTe, and/or HgZnSTe; or any combination thereof.

Examples of the Group III-V semiconductor compound include a binary compound, such as GaN, GaP, GaAs, GaSb, AlN, AlP, AlAs, AlSb, InN, InP, InAs, and/or InSb; a ternary compound, such as GaNP, GaNAs, GaNSb, GaPAs, GaPSb, AlNP, AlNAs, AlNSb, AlPAs, AlPSb, InGaP, InNP, InAlP, InNAs, InNSb, InPAs, and/or InPSb; a quaternary compound, such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and/or InAlPSb; or any combination thereof. The Group III-V semiconductor compound may further include a Group II element. Examples of the Group III-V semiconductor compound further including a Group II element include InZnP, InGaZnP, and InAlZnP.

Examples of the Group III-VI semiconductor compound are a binary compound, such as GaS, GaSe, $Ga_2Se_3$, GaTe, InS, $In_2S_3$, InSe, $In_2Se_3$, and/or InTe; a ternary compound, such as $InGaS_3$, and/or $InGaSe_3$; or any combination thereof.

Examples of the Group semiconductor compound include a ternary compound, such as AgInS, $AgInS_2$, CuInS, $CuInS_2$, $CuGaO_2$, $AgGaO_2$, and/or $AgAlO_2$; or any combination thereof.

Examples of the Group IV-VI semiconductor compound include a binary compound, such as SnS, SnSe, SnTe, PbS, PbSe, and/or PbTe; a ternary compound, such as SnSeS, SnSeTe, SnSTe, PbSeS, PbSeTe, PbSTe, SnPbS, SnPbSe, and/or SnPbTe; a quaternary compound, such as SnPbSSe, SnPbSeTe, and/or SnPbSTe; or any combination thereof.

In an embodiment, the Group IV element or compound may include a single element, such as Si and/or Ge; a binary compound, such as SiC and/or SiGe; or any combination thereof.

Each element included in the multi-element compound such as the binary compound, ternary compound, and quaternary compound may be present in a particle at a uniform concentration or a non-uniform concentration.

In some embodiments, the quantum dot may have a single structure having a uniform (e.g., substantially uniform) concentration of each element included in the corresponding quantum dot or a dual structure of a core-shell. In an embodiment, the material included in the core may be different from the material included in the shell.

The shell of the quantum dot may function as a protective layer for maintaining semiconductor characteristics by preventing or reducing chemical degeneration of the core and/or may function as a charging layer for imparting electrophoretic characteristics to the quantum dot. The shell may be a single layer or a multilayer. An interface between the core and the shell may have a concentration gradient in which the concentration of elements existing in the shell decreases along a direction toward the center.

Examples of the shell of the quantum dot include a metal or non-metal oxide, a semiconductor compound, or any combination thereof. Examples of the oxide of metal or non-metal include a binary compound, such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO; a ternary compound, such as $MgAl_2O_4$, $CoFe_2O_4$, $NiFe_2O_4$, and/or $CoMn_2O_4$; or any combination thereof. Examples of the semiconductor compound include, as described herein, Group III-VI semiconductor compounds, Group II-VI semiconductor compounds, Group III-V semiconductor compounds, Group III-VI semiconductor compounds, Group I-III-VI semiconductor compounds, Group IV-VI semiconductor compound, or any combination thereof. In an embodiment, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

A full width of half maximum (FWHM) of an emission wavelength spectrum of the quantum dot may be about 45 nm or less, for example, about 40 nm or less, for example, about 30 nm or less. When the FWHM of the emission wavelength spectrum of the quantum dot is within any of the foregoing ranges, color purity or color reproduction may be improved. In addition, light emitted through such quantum dots is irradiated in omnidirection (e.g., in substantially every direction). Accordingly, a wide viewing angle may be increased.

In addition, the quantum dot may be, for example, a spherical, pyramidal, multi-arm, or cubic nanoparticle, a nanotube, a nanowire, a nanofiber, or nanoplate particle.

By adjusting the size of the quantum dot, the energy band gap may also be adjusted, thereby obtaining light of various suitable wavelengths in the quantum dot emission layer. Therefore, by using quantum dots of different sizes, a light-emitting device that emits light of various suitable wavelengths may be implemented. In an embodiment, the size of the quantum dot may be selected to emit red, green and/or blue light. In addition, the size of the quantum dot may be adjusted such that light of various suitable colors are combined to emit white light.

In an embodiment, the quantum dot may include a Group III-V semiconductor compound.

In an embodiment, the quantum dot may include In.

In one or more embodiments, the quantum dot may include In and P.

In one or more embodiments, the quantum dot may include a Group III-V semiconductor compound or a Group II-VI semiconductor compound.

In one or more embodiments, the quantum dot may include InP, GaP, InGaP, ZnSe, ZnS, ZnSeS, ZnSeTe, or any combination thereof.

In one or more embodiments, the quantum dot may have a core-shell structure, the core may be a Group III-V semiconductor compound, and the shell may be a Group II-VI semiconductor compound.

In one or more embodiments, the quantum dot may have a core-shell structure, the core may be GaN, GaP, GaAs, GaSb, AlN, AlP, AlAs, AlSb, InN, InP, InAs, InSb, GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or any combination thereof, and the shell may be CdS, CdSe, CdTe, ZnS, ZnSe, ZnTe, ZnO, HgS, HgSe, HgTe, MgS, MgSe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnS, MgZnSe, CdZnSeS, CdZnSeTe, CdZnSTe, CdHgSeS, CdHgSeTe, CdHgSTe, HgZnSeS, HgZnSeTe, HgZnSTe, or any combination thereof.

In one or more embodiments, the quantum dot may have a core-shell structure, and the core may be CdSe, CdS, ZnS, ZnSe, CdTe, CdSeTe, CdZnS, PbSe, AgInZnS, ZnO, InN, InP, InAs, InSb, InGaP, or any combination thereof, and the shell may be CdSe, ZnSe, ZnS, ZnSeS, ZnTe, CdTe, PbS, TiO, SrSe, HgSe, or any combination thereof.

In one or more embodiments, the quantum dot may be InP/ZnS, InP/ZnSe, InP/ZnSeS, InP/ZnS/ZnSe, InP/ZnSe/ZnS, InGaP/ZnS, InGaP/ZnSe, InGaP/ZnSeS, InGaP/ZnS/ZnSe, or InGaP/ZnSe/ZnS.

The average particle diameter of the quantum dot may be in a range from about 1 nm to about 20 nm, for example, about 1 nm to about 15 nm, or, for example, about 1 nm to about 10 nm.

When the quantum dot has a core-shell structure, the ratio of the radius of the core to the thickness of the shell may be in range of 2:8 to 8:2, for example, 3:7 to 7:3, or, for example, 4:6 to 6:4.

Electron Transport Layer 135

The interlayer 130 includes the electron transport layer 135 between the emission layer 133 and the second electrode 150. The electron transport layer 135 may transfer the electrons injected from the second electrode 150 to the emission layer 133.

The electron transport layer 135 may include electron transport particles.

In an embodiment, the electron transport layer 135 may not include carbon. For example, the electron transport layer 135 may not include an organic material.

In an embodiment, the electron transport layer 135 may include (or consist of) the electron transport particles.

Figure 2:
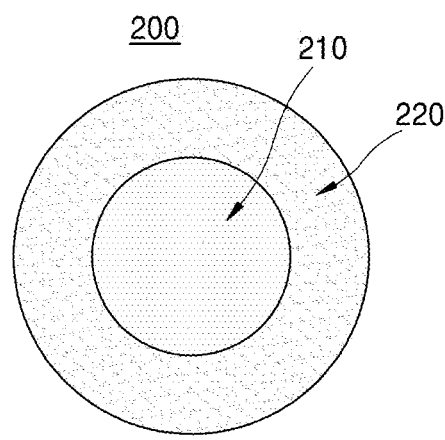
FIG. 2 shows a schematic cross-sectional view of an electron transport particle according to an embodiment.

The cross section of an example of the electron transport particle is shown in FIG. 2.

An electron transport particle 200 of FIG. 2 includes a core 210 and a shell 220 covering the core 210.

The core 210 may transport electrons injected from the second electrode 190 to the emission layer 133. The shell 220 may act as a protective layer for preventing or reducing chemical degeneration of the core 210 and maintaining semiconductor characteristics and/or electron transport characteristics and/or may also act as a charging layer for imparting electrophoretic characteristics to the electron transport particle 200.

The core 210 may include an oxide, a chalcogenide, or any combination thereof.

For example, the core 210 may include oxygen (O), sulfur (S), selenium (Se), tellurium (Te), or any combination thereof.

In an embodiment, the core 210 may include an oxide of $A^1$, a chalcogenide of $A^1$, or any combination thereof, and $A^1$ may be beryllium (Be), magnesium (Mg), calcium (Ca), strontium (Sr), barium (Ba), titanium (Ti), zirconium (Zr), hafnium (Hf), vanadium (V), niobium (Nb), tantalum (Ta), chromium (Cr), molybdenum (Mo), tungsten (W), iron (Fe), zinc (Zn), aluminum (Al), gallium (Ga), indium (In), silicon (Si), germanium(Ge), tin(Sn), copper (Cu), or any combination thereof.

In an embodiment, the core 210 includes $A^1$ and $A^{11}$, and $A^1$ is the same as described in the present specification, and $A^{11}$ may be oxygen (O), sulfur (S), selenium (Se), tellurium (Te), or any combination thereof.

In one or more embodiments, the core 210 may further include, in addition to the elements as described above, lithium (Li), sodium (Na), potassium (K), rubidium (Rb), cesium (Cs), beryllium (Be), or any combination thereof.

In one or more embodiments, the core 210 may include $WO_3$, $TiO_2$, $MoO_3$, $ZnO$, $ZnMgO$, $ZnAlO$, $ZrO$, $Fe_2O_3$, $V_2O_5$, $Al_2O_3$, $MgO$, $SnO$, $SnO_2$, $Ta_2O_3$, $HfO_3$, $ZrSiO_4$, $BaTiO_3$, $BaZrO_3$, $WS_3$, $TiS_2$, $MoS_3$, $ZnS$, $ZnMgS$, $ZnAlS$, $ZrS$, $Fe_2S_3$, $V_2S_5$, $Al_2S_3$, $WSe_3$, $TiSe_2$, $MoSe_3$, $ZnSe$, $ZnMgSe$, $ZnAlSe$, $ZrSe$, $Fe_2Se_3$, $V_2Se_5$, $Al_2Se_3$, or any combination thereof.

In one or more embodiments, the core 210 may include:
ZnO; or
a combination of: ZnO; and Li, Na, K, Rb, Cs, Be, Mg, Ca, Sr, Ba, Cu, Al, Ga, In, Si, or any combination thereof.

In some embodiments, the shell 220 of the electron transport particle 200 may include a chalcogenide.

In an embodiment, the shell 220 may not include oxygen (O).

In an embodiment, the shell 220 may include sulfur (S), selenium (Se), tellurium (Te), or any combination thereof.

In one or more embodiments, the shell 220 may include a chalcogenide of $A^2$, and $A^2$ may be a Group II element, a Group III element, or a combination thereof.

In one or more embodiments, the shell 220 may include $A^2$ and $A^{12}$, $A^2$ may be a Group II element, a Group III element, or a combination thereof, and $A^{12}$ may be sulfur (S), selenium (Se), tellurium (Te), or any combination thereof.

In one or more embodiments, $A^2$ may be zinc (Zn), magnesium (Mg), boron (B), aluminum (Al), gallium (Ga), indium (In), thallium (Tl), or any combination thereof.

In one or more embodiments, the shell 220 may include ZnSe, ZnSeS, ZnS, $Ga_2S_3$, $Ga_2Se_3$, $Zn_xGa_{1-x}S$, $Zn_xGa_{1-x}Se$, or any combination thereof, and x may be a real number satisfying the condition of 0<x<1.

The shell 220 may be crystalline.

The shell 220 may have a single-layered structure including (or consisting of) a single material, or may have a multilayer structure including (or consisting of) two or more different materials.

For example, the shell 220 includes a first shell covering the core 210 and a second shell covering the first shell, and the material included in the first shell and the material included in the second shell may be different from each other.

The average particle diameter (D50) of the electron transport particle 200 may be in a range from about 3 nm to about 15 nm, from about 5 nm to about 12 nm, or from about 6 nm to about 10 nm. When the average particle diameter of the electron transport particle satisfies the above-described range, the electron mobility and external light extraction efficiency of the electron transport layer 135 may be improved.

In one or more embodiments, an organic ligand may be additionally bound to the surface of the shell 220. The organic ligand, when the electron transport particle 200 is mixed with another material (for example, various suitable organic solvents), may improve the miscibility and/or dispersibility of the electron transport particle 200 with respect to other materials. Because the shell 220 includes a chalcogenide, the introduction of the organic ligand to the shell 220 may be relatively easy. Therefore, due to the shell 220 including the chalcogenide, the electron transport particle 200 may have high miscibility and/or dispersibility with respect to other materials (for example, various suitable organic solvents).

For example, the organic ligand may be a group represented by one of Formulae 1A to 1E, or any combination thereof:

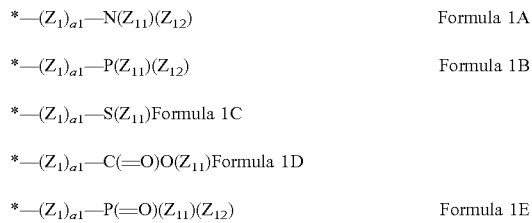

wherein, in Formulae 1A to 1E, $Z_1$ may be a single bond, *—O—*', *—S—*', *—C(=O)—', a $C_1$-$C_{60}$ alkylene group unsubstituted or substituted with at least one $R_{1a}$, a $C_2$-$C_{60}$ alkenylene group unsubstituted or substituted with at least one $R_{1a}$, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$, a1 may be an integer from 1 to 10, and when a1 is 2 or more, two or more of $Z_1(s)$ may be identical to or different from each other, $Z_{11}$ and $Z_{12}$ may each independently be hydrogen, deuterium, a $C_1$-$C_{60}$ alkyl group unsubstituted or substituted with at least one $R_{1a}$, a $C_2$-$C_{60}$ alkenyl group unsubstituted or substituted with at least one $R_{1a}$, a $C_2$-$C_{60}$ alkynyl group unsubstituted or substituted with at least one $R_{1a}$, a $C_1$-$C_{60}$ alkoxy group unsubstituted or substituted with at least one $R_{1a}$, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$, $R_{1a}$ may be hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group,

* indicates a binding site to the surface of the shell.

For example, $Z_1$ may be a single bond, a $C_1$-$C_{20}$ alkylene group unsubstituted or substituted with at least one $R_{1a}$, or a $C_2$-$C_{20}$ alkenylene group unsubstituted or substituted with at least one $R_{1a}$, and a1 may be an integer from 1 to 5.

In an embodiment, $Z_{11}$ and $Z_{12}$ may each independently be hydrogen, a $C_1$-$C_{20}$ alkyl group unsubstituted or substituted with at least one $R_{1a}$, a $C_2$-$C_{20}$ alkenyl group unsubstituted or substituted with at least one $R_{1a}$, or a $C_1$-$C_{20}$ alkoxy group unsubstituted or substituted with at least one $R_{1a}$.

In an embodiment, $Z_{11}$ and $Z_{12}$ may each independently be:

hydrogen or a $C_1$-$C_{20}$ alkyl group; or a phenyl group, a naphthyl group, a carbazolyl group, a fluorenyl group, a dibenzofuranyl group, or a dibenzothiophenyl group, each unsubstituted or substituted with at least one $C_1$-$C_{20}$ alkyl group, a phenyl group, or any combination thereof.

In an embodiment, the organic ligand may be *—$NH_2$, *—SH, *—C(=O)O(H), an oleic acid group (*—$(CH_2)_8$CH=CH$(CH_2)_7$—COOH), or any combination thereof.

A thickness of the electron transport layer 135 may be in a range of about 100 Å to about 1,500 Å, for example, about 150 Å to about 700 Å. When the thickness of the electron transport layer 135 is within any of the ranges described above, the electron transport layer may have suitable or satisfactory electron transport characteristics without a substantial increase in driving voltage.

The electron transport layer 135 may not include carbon, as described above. For example, the electron transport layer 135 does not include an organic material, but an inorganic material. Thus, the deterioration of the electron transport layer 135 caused by heat generated during driving and excessive excitons moved from the emission layer 133, may be substantially prevented or reduced. Thus, the light-emitting device 10 may have excellent emission efficiency and/or lifespan properties.

Second Electrode 150

The second electrode 150 may be above the interlayer 130, for example, above the electron transport layer 135. The second electrode 150 may be a cathode, which is an electron injection electrode, and as the material for the second electrode 150, a metal, an alloy, an electrically conductive compound, or any combination thereof, each having a low work function, may be used.

According to an embodiment, the second electrode 150 may include silver (Ag), aluminum (Al), magnesium (Mg), calcium (Ca), strontium (Sr), barium (Ba), indium (In), ytterbium (Yb), or any combination thereof.

In one embodiment, the second electrode 150 may include, in addition to, Ag, Al, Mg, Ca, Sr, Ba, In, or any combination thereof, alkali metal, rare earth metal, or any combination thereof.

The alkali metal may include Li, Na, K, Rb, Cs, or any combination thereof. The rare earth metal may include Sc, Y, Ce, Tb, Yb, Gd, or any combination thereof.

In an embodiment, the second electrode 150 may include at least one selected from lithium (Li), silver (Ag), magnesium (Mg), aluminum (Al), aluminum-lithium (Al—Li), calcium (Ca), magnesium-indium (Mg—In), magnesium-silver (Mg—Ag), ytterbium (Yb), silver-ytterbium (Ag—Yb), ITO, IZO, and a combination thereof.

The second electrode 150 may be a transparent electrode, a semi-transparent electrode, or a reflective electrode.

For example, the second electrode 150 may be a transparent electrode that has a light transmittance of 50% or more (for example, 60% or more, 65% or more, 70% or more, 75% or more, 80% or more, 85% or more, 90% or more, or 95% or more) with respect to light having a wavelength in a visible-light wavelength range (for example, light having a maximum emission wavelength of about 400 nm to about 700 nm). As a result, the light-emitting device 10 using the second electrode 150 may be a top emission type (or kind) of light-emitting device having excellent emission efficiency and/or lifespan properties.

The second electrode 150 may have a single-layered structure or a multi-layered structure including two or more layers.

The thickness of the second electrode 150 may be, for example, in a range from about 10 nm to about 1000 nm, or from about 100 nm to about 300 nm.

Capping Layer

A first capping layer may be outside the first electrode 110, and/or a second capping layer may be outside the second electrode 150. In more detail, the light-emitting device 10 may have a structure in which the first capping layer, the first electrode 110, the interlayer 130, and the second electrode 150 are sequentially stacked in this stated order, a structure in which the first electrode 110, the interlayer 130, the second electrode 150, and the second capping layer are sequentially stacked in this stated order, or a structure in which the first capping layer, the first electrode 110, the interlayer 130, the second electrode 150, and the second capping layer are sequentially stacked in this stated order.

Light generated in an emission layer 133 of the interlayer 130 of the light-emitting device 10 may be extracted toward the outside through the first electrode 110, which is a semi-transmissive electrode or a transmissive electrode, and the first capping layer, and light generated in an emission layer 133 of the interlayer 130 of the light-emitting device 10 may be extracted toward the outside through the second electrode 150, which is a semi-transmissive electrode or a transmissive electrode, and the second capping layer.

The first capping layer and the second capping layer may increase external luminescence efficiency according to the principle of constructive interference. Accordingly, the light extraction efficiency of the light-emitting device 10 is increased, so that the luminescence efficiency of the light-emitting device 10 may be improved.

Each of the first capping layer and the second capping layer may include a material having a refractive index of 1.6 or more (at a wavelength of 589 nm).

The first capping layer and the second capping layer may each independently be an organic capping layer including an organic material, an inorganic capping layer including an inorganic material, or a composite capping layer including an organic material and an inorganic material.

At least one selected from the first capping layer and the second capping layer may each independently include a carbocyclic compound, a heterocyclic compound, an amine group-containing compound, a porphyrine derivative, a phthalocyanine derivative, a naphthalocyanine derivative, an alkali metal complex, an alkaline earth-metal complex, or a combination thereof. The carbocyclic compound, the heterocyclic compound, and the amine group-containing compound may be optionally substituted with a substituent containing O, N, S, Se, Si, F, Cl, Br, I, or any combination thereof. In an embodiment, at least one of the first capping layer and the second capping layer may each independently include an amine group-containing compound.

In an embodiment, at least one of the first capping layer and second capping layer may each independently include a compound represented by Formula 201, a compound represented by Formula 202, or any combination thereof.

In one or more embodiments, at least one of the first capping layer and the second capping layer may each independently include a compound selected from Compounds HT28 to HT33, Compounds CP1 to CP6, β-NPB, or any combination thereof:

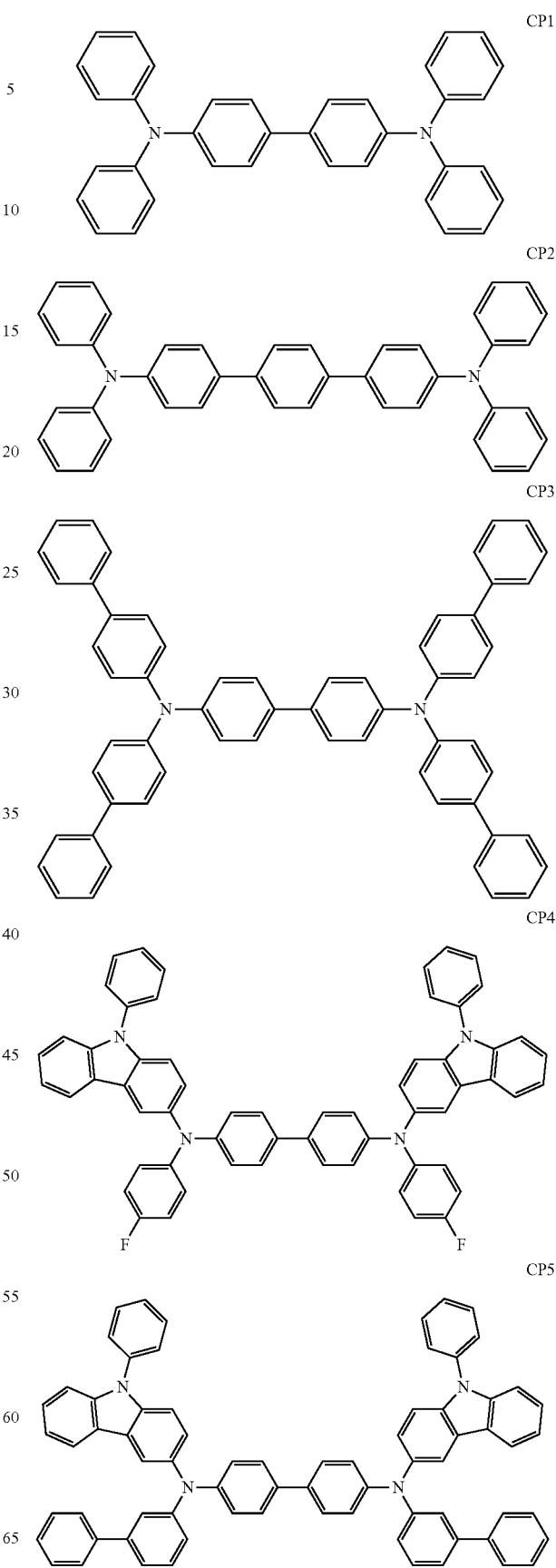

-continued

CP6

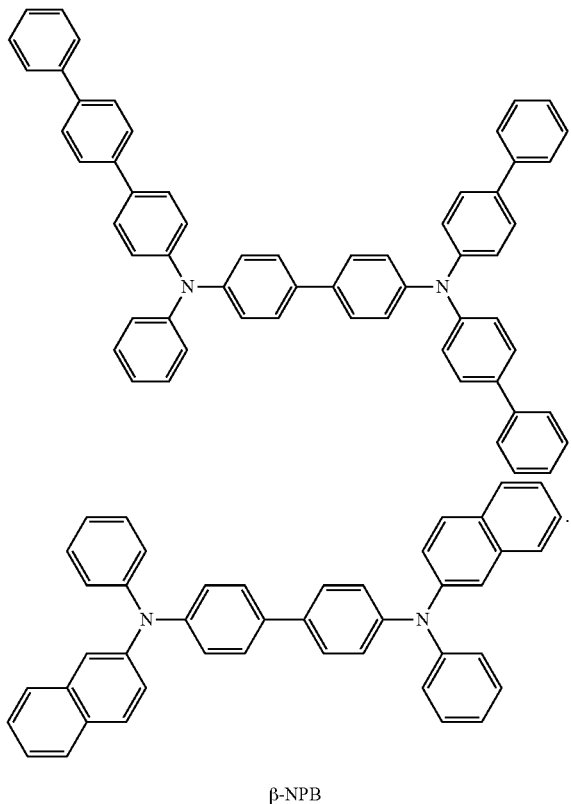

β-NPB

Electronic Apparatus

The light-emitting device may be included in various suitable electronic apparatuses. In an embodiment, the electronic apparatus including the light-emitting device may be a light-emitting apparatus, an authentication apparatus, and/or the like.

The electronic apparatus (for example, a light-emitting apparatus) may further include, in addition to the light-emitting device, i) a color filter, ii) a color conversion layer, or iii) a color filter and a color conversion layer. The color filter and/or the color conversion layer may be in at least one traveling direction of light emitted from the light-emitting device (e.g., in a path of a direction in which light emitted from the light-emitting device travels). In an embodiment, light emitted from the light-emitting device may be blue light or white light. The light-emitting device may be the same as described above. In an embodiment, the color conversion layer may include quantum dots. The quantum dot may be, for example, a quantum dot as described herein.

The electronic apparatus may include a first substrate. The first substrate includes a plurality of subpixel areas, the color filter includes a plurality of color filter areas corresponding to the plurality of subpixel areas, respectively, and the color conversion layer may include a plurality of color conversion areas corresponding to the subpixel areas, respectively.

A pixel-defining film may be between the plurality of subpixel areas to define each of the subpixel areas.

The color filter may further include the color filter areas and a light-blocking pattern between adjacent color filter areas of the color filter areas, and the color conversion layer may further include the color conversion areas and a light-blocking pattern between adjacent color conversion areas of the color conversion areas.

The color filter areas (or the color conversion areas) may include a first area that emits a first color light, a second area that emits a second color light, and/or a third area that emits a third color light, and the first color light, the second color light, and/or the third color light may have different maximum emission wavelengths from one another. In an embodiment, the first color light may be red light, the second color light may be green light, and the third color light may be blue light. In an embodiment, the color filter areas (or the color conversion areas) may include quantum dots. In more detail, the first area may include a red quantum dot, the second area may include a green quantum dot, and the third area may not include a quantum dot. The quantum dot is the same as described elsewhere in the present specification. Each of the first area, the second area and/or the third area may further include a scattering body.

In an embodiment, the light-emitting device may emit first light, the first area may absorb the first light to emit a first first-color light, the second area may absorb the first light to emit a second first-color light, and the third area may absorb the first light to emit a third first-color light. In this regard, the first first-color light, the second first-color light, and the third first-color light may have different maximum emission wavelengths from one another. In more detail, the first light may be blue light, the first first-color light may be red light, the second first-color light may be green light, and the third first-color light may be blue light.

The electronic apparatus may further include a thin-film transistor in addition to the light-emitting device 10 as described above. The thin-film transistor may include a source electrode, a drain electrode, and an activation layer, wherein any one selected from the source electrode and the drain electrode may be electrically coupled to any one selected from the first electrode and the second electrode of the light-emitting device.

The thin-film transistor may further include a gate electrode, a gate insulation layer, and/or the like.

The activation layer may include crystalline silicon, amorphous silicon, organic semiconductor, oxide semiconductor, and/or the like.

The electronic apparatus may further include a sealing portion for sealing the light-emitting device. The sealing portion may be between the color filter and/or the color conversion layer and the light-emitting device. The sealing portion allows light from the light-emitting device 10 to be extracted to the outside, while concurrently (e.g., simultaneously) preventing or reducing penetration of ambient air and moisture into the light-emitting device 10. The sealing portion may be a sealing substrate including a transparent glass substrate and/or a plastic substrate. The sealing portion may be a thin film encapsulation layer including at least one layer of an organic layer and/or a inorganic layer. When the sealing portion is a thin film encapsulation layer, the electronic apparatus may be flexible.

On the sealing portion, in addition to the color filter and/or color conversion layer, various suitable functional layers may be further included according to the use of the electronic apparatus. The functional layers may include a touch screen layer, a polarizing layer, and/or the like. The touch screen layer may be a pressure-sensitive touch screen layer, a capacitive touch screen layer, and/or an infrared touch screen layer. The authentication apparatus may be, for example, a biometric authentication apparatus for authenticating an individual by using biometric information of a biometric body (for example, a finger tip, a pupil, and/or the like).

The authentication apparatus may further include, in addition to the light-emitting device, a biometric information collector.

The electronic apparatus may be applied to various suitable displays, light sources, lighting, personal computers (for example, a mobile personal computer), mobile phones, digital cameras, electronic organizers, electronic dictionaries, electronic game machines, medical instruments (for example, electronic thermometers, sphygmomanometers, blood glucose meters, pulse measurement devices, pulse wave measurement devices, electrocardiogram displays, ultrasonic diagnostic devices, and/or endoscope displays), fish finders, various suitable measuring instruments, meters (for example, meters for a vehicle, an aircraft, and/or a vessel), projectors, and/or the like.

Figure 3:
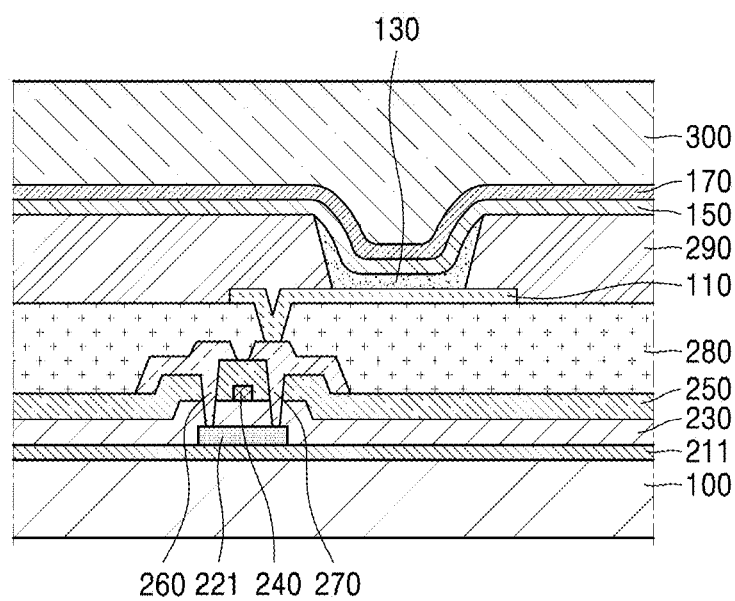
FIGS. 3 and 4 show diagrams each schematically showing the structure of an electronic apparatus according to an embodiment.
Figure 4:
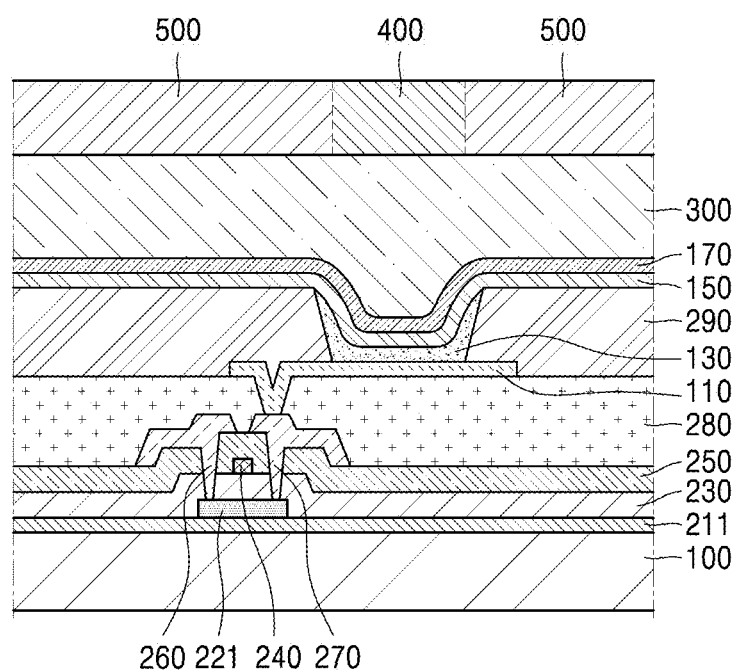

Description of FIGS. 3 and 4

FIG. 3 is a cross-sectional view showing a light-emitting apparatus according to an embodiment.

The light-emitting apparatus of FIG. 3 includes a substrate 100, a thin-film transistor (TFT), a light-emitting device, and an encapsulation portion 300 that seals the light-emitting device.

The substrate 100 may be a flexible substrate, a glass substrate, and/or a metal substrate. A buffer layer 211 may be on the substrate 100. The buffer layer 211 prevents or reduces the penetration of impurities through the substrate 100 and may provide a flat surface on the substrate 100.

A TFT may be on the buffer layer 211. The TFT may include an activation layer 221, a gate electrode 240, a source electrode 260, and a drain electrode 270.

The activation layer 221 may include an inorganic semiconductor such as silicon and/or polysilicon, an organic semiconductor, and/or an oxide semiconductor, and may include a source region, a drain region and a channel region.

A gate insulating film 230 for insulating the activation layer 221 from the gate electrode 240 may be on the activation layer 221, and the gate electrode 240 may be on the gate insulating film 230.

An interlayer insulating film 250 may be on the gate electrode 240. The interlayer insulating film 250 is between the gate electrode 240 and the source electrode 260 to insulate the gate electrode 240 from the source electrode 260 and between the gate electrode 240 and the drain electrode 270 to insulate the gate electrode 240 from the drain electrode 270.

The source electrode 260 and the drain electrode 270 may be on the interlayer insulating film 250. The interlayer insulating film 250 and the gate insulating film 230 may be formed to expose the source region and the drain region of the activation layer 221, and the source electrode 260 and the drain electrode 270 may be located to be in contact (e.g., physical contact) with the exposed portions of the source region and the drain region of the activation layer 221.

The TFT may be electrically coupled to a light-emitting device to drive the light-emitting device, and is covered by a passivation layer 280. The passivation layer 280 may include an inorganic insulating film, an organic insulating film, or a combination thereof. A light-emitting device is provided on the passivation layer 280.

The light-emitting device includes the first electrode 110, the interlayer 130, and the second electrode 150.

The first electrode 110 may be on the passivation layer 280. The passivation layer 280 does not completely cover the drain electrode 270 and exposes a portion of the drain electrode 270, and the first electrode 110 may be coupled to the exposed portion of the drain electrode 270.

A pixel defining layer 290 including an insulating material may be on the first electrode 110. The pixel defining layer 290 may expose a certain region of the first electrode 110, and the interlayer 130 may be formed in the exposed region of the first electrode 110. The pixel defining layer 290 may be a polyimide and/or polyacryl-based organic film. In some embodiments, at least some layers of the interlayer 130 may extend beyond the upper portion of the pixel defining layer 290 and may thus be in the form of a common layer.

The second electrode 150 may be on the interlayer 130, and a capping layer 170 may be additionally formed on the second electrode 150. The capping layer 170 may be formed to cover the second electrode 150.

The encapsulation portion 300 may be on the capping layer 170. The encapsulation portion 300 may be on a light-emitting device and protects the light-emitting device from moisture and/or oxygen. The encapsulation portion 300 may include: an inorganic film including silicon nitride (SiNx), silicon oxide (SiOx), indium tin oxide, indium zinc oxide, or a combination thereof; an organic film including polyethylene terephthalate, polyethylene naphthalate, polycarbonate, polyimide, polyethylene sulfonate, polyoxymethylene, polyarylate, hexamethyldisiloxane, an acrylic resin (for example, polymethyl methacrylate and/or polyacrylic acid), an epoxy-based resin (for example, aliphatic glycidyl ether (AGE)), or a combination thereof; or a combination of an inorganic film and an organic film.

FIG. 4 is a cross-sectional view showing a light-emitting apparatus according to an embodiment of the present disclosure.

The light-emitting apparatus of FIG. 4 is the same as the light-emitting apparatus of FIG. 3, except that a light-blocking pattern 500 and a functional region 400 are additionally on the encapsulation portion 300. The functional region 400 may be i) a color filter area, ii) a color conversion area, or iii) a combination of the color filter area and the color conversion area. In an embodiment, the light-emitting device included in the light-emitting apparatus of FIG. 4 may be a tandem light-emitting device.

Method of Manufacturing Light-Emitting Device

The layers constituting the interlayer 130 may each be formed in a certain region by using one or more suitable methods selected from vacuum deposition, spin coating, casting, Langmuir-Blodgett (LB) deposition, ink-jet printing, laser-printing, and laser-induced thermal imaging.

When the respective layers included in the interlayer 130 are each formed by vacuum deposition, the deposition may be performed at a deposition temperature in a range of about 100° C. to about 500° C., a vacuum degree in a range of about $10^{-8}$ torr to about $10^{-3}$ torr, and a deposition speed in a range of about 0.01 Å/sec to about 100 Å/sec by taking into account a material to be included in a layer to be formed and the structure of a layer to be formed.

When the respective layers included in the interlayer 130 are each formed by spin coating, the spin coating may be performed at a coating speed in a range of about 2,000 rpm to about 5,000 rpm and at a heat treatment temperature in a range of about 80° C. to 200° C. by taking into account a material to be included in a layer to be formed and the structure of a layer to be formed.

According to an embodiment of the method of manufacturing the light-emitting device 10, the method may include forming the electron transport layer 135 on the emission layer 133.

The forming of the electron transport layer 135 may include:

providing a first composition including the electron transport particle 200 and an organic solvent;

providing the first composition on the emission layer 133; and forming the electron transport layer 135 including the electron transport particle 200 by removing at least some of the organic solvent in the first composition provided on the emission layer 133.

The electron transport particle 200 is the same as described elsewhere in the present specification.

In an embodiment, an organic ligand may be bound on the surface of the shell 220 of the electron transport particle 200, as described above.

The organic solvent that may be included in the first composition may be selected from solvents that are miscible with the electron transport particle 200 and provide the first composition suitable or appropriate levels of viscosity and fluidity.

In an embodiment, the organic solvent may be selected from solvents capable of improving ejection stability so that the first composition can be provided by using an inkjet printing method.

In an embodiment, the organic solvent may include an aromatic solvent, an aliphatic solvent, a fluorine-based solvent, or any combination thereof.

The aromatic solvent may have a boiling point in a range of 150° C. to 350° C., 170° C. to 320° C. or 200° C. to 300° C. so that ink droplets are stably ejected to prevent or reduce ink dryness in the nozzle part of the inkjet print head.

In an embodiment, the aromatic solvent may include cyclohexylbenzene (having a boiling point of 240° C.) 1,3-dipropoxybenzene (having a boiling point of 251° C.), 4-methoxybenzaldehyde-dimethyl-acetal (having a boiling point of 253° C.), 4,4'-difluorodiphenylmethane (having a boiling point of 258° C.), diphenylether (having a boiling point of 259° C.), 1,2-dimethoxy-4-(1-propenyl)benzene (having a boiling point of 264° C.), 2-phenoxytoluene (MDPE; having a boiling point of 265° C.), diphenylmethane (having a boiling point of 265° C.), 2-phenylpyridine (having a boiling point of 268° C.), dimethyl benzyl ether (DMDPE; having a boiling point of 270° C.), 3-phenoxytoluene (having a boiling point of 272° C.), 3-phenylpyridine (having a boiling point of 272° C.), 2-phenylanisole (having a boiling point of 274° C.), 2-phenoxytetrahydrofuran (having a boiling point of 275° C.), 1-propyl-4-phenyl benzene (NPBP; having a boiling point of 280° C.), 2-phenoxy-1,4-dimethyl benzene (25DMDPE; having a boiling point of 280° C.), Ethyl-2-Naphthyl-Ether (having a boiling point of 282° C.), dodecylbenzene (having a boiling point of 290° C.), 2,2,5-Tri-methyl diphenyl ether (225TMDPE; having a boiling point of 290° C.), dibenzyl-ether (having a boiling point of 295° C.), 2,3,5-tri-methyl diphenyl ether (35TMDPE; having a boiling point of 295° C.), N-methyldiphenylamine (having a boiling point of 297° C.), 4-isopropylbiphenyl (having a boiling point of 298° C.), α,α-dichlorodiphenylmethane (having a boiling point of 305° C.), 4-(3-phenylpropyl)pyridine (having a boiling point of 322° C.), benzyl-benzoate (having a boiling point of 324° C.), 1,1-bis(3,4-dimethylphenyl)ethane (having a boiling point of 333° C.), or any combination thereof.

When the first composition includes the aromatic solvents as described above, the aromatic solvent may be included in an amount in a range of 50 parts by weight to 99 parts by weight, 60 parts by weight to 99 parts by weight or 70 parts by weight to 95 parts by weight, based on 100 parts by weight of the organic solvent. When the amount of the aromatic solvent is within any of the ranges described above, the electron transport particle 200 may be suitably or effectively dispersed in the first composition, and, when the first composition is used in the inkjet printing process, clogging of the nozzle of the print head will be minimized or reduced.

The fluorine-based solvent lowers the surface tension of the first composition, thereby improving the spreadability of the first composition provided on a certain substrate, and thereby, improving the film flatness of an electron transport layer to be formed after drying.

In an embodiment, the fluorine-based solvent may be a solvent having a boiling point in a range of 50° C. to 350° C., 60° C. to 320° C., or 70° C. to 300° C. When the boiling point of the fluorine-based solvent is within any of the foregoing boiling-point ranges, during the ink jet process, ink is rapidly volatilized while jetting, so that the decrease in the jetting property due to the remaining of ink stains in a nozzle may be reduced. In some embodiments, the fluorine-based solvent may have a surface tension of 35 mN/m or less.

In an embodiment, the fluorine-based solvent is α,α,α-trifluorotoluene, octafluorotoluene, decafluorobenzophenone, hexafluorobenzene, 1,3-difluorobenzene, 2,6-difluorobenzonitrile, or any combination thereof.

When the first composition includes the fluorine-based solvent, the amount of the fluorine-based solvent may be in a range from 0.3 parts by weight to 35 parts by weight or from 3 parts by weight to 30 parts by weight based on 100 parts by weight of the first composition. When the amount of the fluorine-based solvent is within any of the foregoing ranges, the first composition may have excellent surface tension characteristics.

The first composition may include an aliphatic solvent in order to control the viscosity and/or fluidity of the first composition. The aliphatic solvent may be, for example, a glycolether solvent. The aliphatic solvent may have, for example, a surface tension of 35 mN/m or less, and a boiling point in a range of 150° C. to 350° C. (or, 170° C. to 300° C.).

In an embodiment, the aliphatic solvent may include diethylene glycol butylmethyl ether (DEGBME), diethylene glycol monomethyl ether (DEGME), diethylene glycol ethylmethyl ether (DEGEME), diethylene glycol dibutyl ether (DEGDBE), or any combination thereof.

The amount of the electron transport particle 200 in the first composition may be in a range from 0.1 parts by weight to 10 parts by weight, 0.5 parts by weight to 7 parts by weight, or 1 part by weight to 5 parts by weight, based on 100 parts by weight of the first composition. When the amount of the electron transport particle 200 in the first composition is within any of the foregoing ranges, an electron transport layer 135 having excellent surface flatness and electron transport capability may be formed.

The first composition may further include various suitable additives such as a dispersant and a viscosity modifier, in addition to the electron transport particle 200 and the organic solvent as described above.

In the providing of the first composition on the emission layer 133, any suitable coating method generally used in the art may be used.

In an embodiment, the providing of the first composition on the emission layer may be performed using an inkjet printing method. As the inkjet printer used in the inkjet printing method, any suitable inkjet printer generally used in the art may be used.

In the case of the electron transport particle 200, as described herein, due to the inclusion of the shell 220 including a chalcogenide, optionally, the organic ligand as described herein is effectively introduced to the surface of the shell 200. Thus, the electron transport particle 200 may have excellent miscibility and/or dispersibility with respect to organic solvents as described above, for example, organic solvents that can be used in inkjet printing. Therefore, by using the electron transport particle 200, the electron transport layer 135 as described herein can be effectively formed by an inkjet printing method. Accordingly, a high-quality large-area light-emitting device can be manufactured at relatively low costs.

The forming an electron transport layer including the electron transport particles by removing at least some of the organic solvent in the first composition provided on the emission layer 133, may include any suitable baking process generally used in the art. The temperature range of the baking process differs depending on the organic solvent used. For example, the temperature range may be from about 80° C. to 250° C. Before the baking process, an additional room-temperature drying process may be performed to remove at least some of the organic solvent included in the first composition may be removed.

Definition of at Least Some Terms

The term "$C_3$-$C_{60}$ carbocyclic group," as used herein, refers to a cyclic group that includes (or consists of) carbon only and has three to sixty carbon atoms, and the term "$C_1$-$C_{60}$ heterocyclic group," as used herein, refers to a cyclic group that has one to sixty carbon atoms and further includes, in addition to carbon, a heteroatom. The $C_3$-$C_{60}$ carbocyclic group and the $C_1$-$C_{60}$ heterocyclic group may each be a monocyclic group that includes (or consists of) one ring or a polycyclic group in which two or more rings are condensed with each other (e.g., combined together with each other). In an embodiment, the number of ring-forming atoms of the $C_1$-$C_{60}$ heterocyclic group may be from 3 to 61.

The term "cyclic group," as used herein, includes the $C_3$-$C_{60}$ carbocyclic group and the $C_1$-$C_{60}$ heterocyclic group.

The term "T1 electron-rich $C_3$-$C_{60}$ cyclic group," as used herein, refers to a cyclic group that has one to sixty carbon atoms and does not include *—N=*' as a ring-forming moiety, and the term "T1 electron-deficient nitrogen-containing $C_1$-$C_{60}$ cyclic group," as used herein, refers to a heterocyclic group that has one to sixty carbon atoms and includes *—N=*' as a ring-forming moiety.

For example, the $C_3$-$C_{60}$ carbocyclic group may be i) a group T1 or ii) a condensed cyclic group in which two or more groups T1 are condensed with (e.g., combined together with) each other (for example, a cyclopentadiene group, an adamantane group, a norbornane group, a benzene group, a pentalene group, a naphthalene group, an azulene group, an indacene group, acenaphthylene group, a phenalene group, a phenanthrene group, an anthracene group, a fluoranthene group, a triphenylene group, a pyrene group, a chrysene group, a perylene group, a pentaphene group, a heptalene group, a naphthacene group, a picene group, a hexacene group, a pentacene group, a rubicene group, a coronene group, an ovalene group, an indene group, a fluorene group, a spiro-bifluorene group, a benzofluorene group, an indenophenanthrene group, or an indenoanthracene group), the $C_1$-$C_{60}$ heterocyclic group may be i) a group T2, ii) a condensed cyclic group in which two or more groups T2 are condensed with (e.g., combined together with) each other, or iii) a condensed cyclic group in which at least one groups T2 and at least one group T1 are condensed with (e.g., combined together with) each other (for example, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, a benzothieno dibenzothiophene group, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the π electron-rich $C_3$-$C_{60}$ cyclic group may be i) a group T1, ii) a condensed cyclic group in which two or more groups T1 are condensed with each other (e.g., combined together with each other), iii) a group T3, iv) a condensed cyclic group in which two or more groups T3 are condensed with each other (e.g., combined together with each other), or v) a condensed cyclic group in which at least one group T3 and at least one group T1 are condensed with (e.g., combined together with) each other (for example, a $C_3$-$C_{60}$ carbocyclic group, a pyrrole group, a thiophene group, a furan group, an indole group, a benzoindole group, a naphthoindole group, an isoindole group, a benzoisoindole group, a naphthoisoindole group, a benzosilole group, a benzothiophene group, a benzofuran group, a carbazole group, a dibenzosilole group, a dibenzothiophene group, a dibenzofuran group, an indenocarbazole group, an indolocarbazole group, a benzofurocarbazole group, a benzothienocarbazole group, a benzosilolocarbazole group, a benzoindolocarbazole group, a benzocarbazole group, a benzonaphthofuran group, a benzonaphthothiophene group, a benzonaphthosilole group, a benzofurodibenzofuran group, a benzofurodibenzothiophene group, or a benzothienodibenzothiophene group), the π electron-deficient nitrogen-containing $C_1$-$C_{60}$ cyclic group may be i) a group T4, ii) a condensed cyclic group in which two or more groups T4 are condensed with each other (e.g., combined together with each other), iii) a condensed cyclic group in which at least one group T4 and at least one group T1 are condensed with each other (e.g., combined together with each other), iv) a condensed cyclic group in which at least one group T4 and at least one group T3 are condensed with each other (e.g., combined together with each other), or v) a condensed cyclic group in which at least one group T4, at least one group T1, and at least one group T3 are condensed with (e.g., combined together with) each other (for example, a pyrazole group, an imidazole group, a triazole group, an oxazole group, an isoxazole group, an oxadiazole group, a thiazole group, an isothiazole group, a thiadiazole group, a benzopyrazole group, a benzimidazole group, a benzoxazole group, a benzoisoxazole group, a benzothiazole group, a benzoisothiazole group, a pyridine group, a pyrimidine group, a pyrazine group, a pyridazine group, a triazine group, a quinoline group, an isoquinoline group, a benzoquinoline group, a benzoisoquinoline group, a quinoxaline group, a benzoquinoxaline group, a quinazoline group, a benzoquinazoline group, a phenanthroline group, a cinnoline group, a phthalazine group, a naphthyridine group, an imidazopyridine group, an imidazopyrimidine group, an imidazotriazine group, an imidazopyrazine group, an imidazopyridazine group, an azacarbazole group, an azafluorene group, an azadibenzosilole group, an azadibenzothiophene group, or an azadibenzofuran group), the group T1 may be a cyclopropane group, a cyclobutane group, a cyclopentane group, a cyclohexane group, a cycloheptane group, a cyclooctane group, a cyclobutene group, a cyclopentene group, a cyclopentadiene group, a cyclohexene group, a cyclohexadiene group, a cycloheptene group, an adamantane group, a norbornane group (or, a bicyclo[2.2.1]heptane group), a norbornene group, a bicyclo[1.1.1]pentane group, a bicyclo[2.1.1]hexane group, a bicyclo[2.2.2]octane group, or a benzene group, the group T2 may be a furan group, a thiophene group, a 1H-pyrrole group, a silole group, a borole group, a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group, the group T3 may be a furan group, a thiophene group, a 1H-pyrrole group, a silole group, or a borole group, and the group T4 may be a 2H-pyrrole group, a 3H-pyrrole group, an imidazole group, a pyrazole group, a triazole group, a tetrazole group, an oxazole group, an isoxazole group, an oxadiazole group, a thiazole group, an isothiazole group, a thiadiazole group, an azasilole group, an azaborole group, a pyridine group, a pyrimidine group, a pyrazine group, a pyridazine group, a triazine group, or a tetrazine group.

The terms "the cyclic group," "the $C_3$-$C_{60}$ carbocyclic group," "the $C_1$-$C_{60}$ heterocyclic group," "the π electron-rich $C_3$-$C_{60}$ cyclic group," or "the π electron-deficient nitrogen-containing $C_1$-$C_{60}$ cyclic group," as used herein, refer to a group that is condensed with (e.g., combined together with) a cyclic group, a monovalent group, a polyvalent group (for example, a divalent group, a trivalent group, a tetravalent group, or the like), according to the structure of a formula described with corresponding terms. In an embodiment, "a benzene group" may be a benzo group, a phenyl group, a phenylene group, or the like, which may should be easily understood by one of ordinary skill in the art according to the structure of a formula including the "benzene group."

In an embodiment, examples of the monovalent $C_3$-$C_{60}$ carbocyclic group and the monovalent $C_1$-$C_{60}$ heterocyclic group are a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group, and examples of the divalent $C_3$-$C_{60}$ carbocyclic group and the divalent $C_1$-$C_{60}$ heterocyclic group are a $C_3$-$C_{10}$ cycloalkylene group, a $C_1$-$C_{10}$ heterocycloalkylene group, a $C_3$-$C_{10}$ cycloalkenylene group, a $C_1$-$C_{10}$ heterocycloalkenylene group, a $C_6$-$C_{60}$ arylene group, a $C_1$-$C_{60}$ heteroarylene group, a divalent non-aromatic condensed polycyclic group, and a divalent non-aromatic condensed heteropolycyclic group.

The term "$C_1$-$C_{60}$ alkyl group," as used herein, refers to a linear or branched aliphatic hydrocarbon monovalent group having 1 to 60 carbon atoms, and examples thereof are a methyl group, an ethyl group, an n-propyl group, an isopropyl group, an n-butyl group, a sec-butyl group, an isobutyl group, a tert-butyl group, an n-pentyl group, a tert-pentyl group, a neopentyl group, an isopentyl group, a sec-pentyl group, a 3-pentyl group, a sec-isopentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, and a tert-decyl group. The term "$C_1$-$C_{60}$ alkylene group," as used herein, refers to a divalent group having substantially the same structure as the $C_1$-$C_{60}$ alkyl group.

The term "$C_2$-$C_{60}$ alkenyl group," as used herein, refers to a monovalent hydrocarbon group having at least one carbon-carbon double bond at a main chain (e.g., in the middle) or at a terminal end (e.g., the terminus) of a $C_2$-$C_{60}$ alkyl group, and examples thereof include an ethenyl group, a propenyl group, and a butenyl group. The term "$C_2$-$C_{60}$ alkenylene group," as used herein, refers to a divalent group having substantially the same structure as the $C_2$-$C_{60}$ alkenyl group.

The term "$C_2$-$C_{60}$ alkynyl group," as used herein, refers to a monovalent hydrocarbon group having at least one carbon-carbon triple bond at a main chain (e.g., in the middle) or at a terminal end (e.g., the terminus) of a $C_2$-$C_{60}$ alkyl group, and examples thereof include an ethynyl group, and a propynyl group. The term "$C_2$-$C_{60}$ alkynylene group," as used herein, refers to a divalent group having substantially the same structure as the $C_2$-$C_{60}$ alkynyl group.

The term "$C_1$-$C_{60}$ alkoxy group," as used herein, refers to a monovalent group represented by —O$A_{101}$ (wherein $A_{101}$ is the $C_1$-$C_{60}$ alkyl group), and examples thereof include a methoxy group, an ethoxy group, and an isopropyloxy group.

The term "$C_3$-$C_{10}$ cycloalkyl group," as used herein, refers to a monovalent saturated hydrocarbon cyclic group having 3 to 10 carbon atoms, and examples thereof are a cyclopropyl group, a cyclobutyl group, a cyclopentyl group, a cyclohexyl group, a cycloheptyl group, a cyclooctyl group, an adamantanyl group, a norbornanyl group (or a bicyclo[2.2.1]heptyl group), a bicyclo[1.1.1]pentyl group, a bicyclo[2.1.1]hexyl group, and a bicyclo[2.2.2]octyl group. The term "$C_3$-$C_{10}$ cycloalkylene group," as used herein, refers to a divalent group having substantially the same structure as the $C_3$-$C_{10}$ cycloalkyl group.

The term "$C_1$-$C_{10}$ heterocycloalkyl group," as used herein, refers to a monovalent cyclic group that further includes, in addition to a carbon atom, at least one heteroatom as a ring-forming atom and has 1 to 10 carbon atoms, and examples thereof are a 1,2,3,4-oxatriazolidinyl group, a tetrahydrofuranyl group, and a tetrahydrothiophenyl group. The term "$C_1$-$C_{10}$ heterocycloalkylene group," as used herein, refers to a divalent group having substantially the same structure as the $C_1$-$C_{10}$ heterocycloalkyl group.

The term "$C_3$-$C_{10}$ cycloalkenyl group," as used herein, refers to a monovalent monocyclic group that has 3 to 10 carbon atoms and at least one carbon-carbon double bond in the ring thereof and no aromaticity (e.g., is not aromatic), and non-limiting examples thereof include a cyclopentenyl group, a cyclohexenyl group, and a cycloheptenyl group. The term "$C_3$-$C_{10}$ cycloalkenylene group," as used herein, refers to a divalent group having substantially the same structure as the $C_3$-$C_{10}$ cycloalkenyl group.

The term "$C_1$-$C_{10}$ heterocycloalkenyl group," as used herein, refers to a monovalent cyclic group that has, in addition to a carbon atom, at least one heteroatom as a ring-forming atom, 1 to 10 carbon atoms, and at least one double bond in the cyclic structure thereof. Examples of the $C_1$-$C_{10}$ heterocycloalkenyl group include a 4,5-dihydro-1,2,3,4-oxatriazolylgroup, a 2,3-dihydrofuranyl group, and a 2,3-dihydrothiophenyl group. The term "$C_1$-$C_{10}$ heterocycloalkenylene group," as used herein, refers to a divalent group having substantially the same structure as the $C_1$-$C_{10}$ heterocycloalkenyl group.

The term "$C_6$-$C_{60}$ aryl group," as used herein, refers to a monovalent group having a carbocyclic aromatic system having 6 to 60 carbon atoms, and the term "$C_6$-$C_{60}$ arylene group," as used herein, refers to a divalent group having a carbocyclic aromatic system having 6 to 60 carbon atoms. Examples of the $C_6$-$C_{60}$ aryl group are a fluorenyl group, a phenyl group, a pentalenyl group, a naphthyl group, an azulenyl group, an indacenyl group, an acenaphthyl group, a phenalenyl group, a phenanthrenyl group, an anthracenyl group, a fluoranthenyl group, a triphenylenyl group, a pyrenyl group, a chrysenyl group, a perylenyl group, a pentaphenyl group, a heptalenyl group, a naphthacenyl group, a picenyl group, a hexacenyl group, a pentacenyl group, a rubicenyl group, a coronenyl group, and an ovalenyl group. When the $C_6$-$C_{60}$ aryl group and the $C_6$-$C_{60}$ arylene group each include two or more rings, the two or more rings may be fused to each other (e.g., combined together with each other).

The term "$C_1$-$C_{60}$ heteroaryl group," as used herein, refers to a monovalent group having a heterocyclic aromatic system that has, in addition to a carbon atom, at least one heteroatom as a ring-forming atom, and 1 to 60 carbon atoms. The term "$C_1$-$C_{60}$ heteroarylene group," as used herein, refers to a divalent group having a heterocyclic aromatic system that has, in addition to a carbon atom, at least one heteroatom as a ring-forming atom, and 1 to 60 carbon atoms. Examples of the $C_1$-$C_{60}$ heteroaryl group are a carbozylyl group, a pyridinyl group, a pyrimidinyl group, a pyrazinyl group, a pyridazinyl group, a triazinyl group, a quinolinyl group, a benzoquinolinyl group, an isoquinolinyl group, a benzoisoquinolinyl group, a quinoxalinyl group, a benzoquinoxalinyl group, a quinazolinyl group, a benzoquinazolinyl group, a cinnolinyl group, a phenanthrolinyl group, a phthalazinyl group, and a naphthyridinyl group. When the $C_1$-$C_{60}$ heteroaryl group and the $C_1$-$C_{60}$ heteroarylene group each include two or more rings, the two or more rings may be condensed with each other (e.g., combined together with each other).

The term "monovalent non-aromatic condensed polycyclic group," as used herein, refers to a monovalent group (for example, having 8 to 60 carbon atoms) having two or more rings condensed with each other (e.g., combined together with each other), only carbon atoms as ring-forming atoms, and no aromaticity in its entire molecular structure (e.g., the entire molecular structure is not aromatic). Examples of the monovalent non-aromatic condensed polycyclic group are an indenyl group, a fluorenyl group, a spiro-bifluorenyl group, a benzofluorenyl group, an indenophenanthrenyl group, and an indenoanthracenyl group. The term "divalent non-aromatic condensed polycyclic group," as used herein, refers to a divalent group having substantially the same structure as the monovalent non-aromatic condensed polycyclic group.

The term "monovalent non-aromatic condensed heteropolycyclic group," as used herein, refers to a monovalent group (for example, having 1 to 60 carbon atoms) having two or more rings condensed to each other (e.g., combined together with each other), at least one heteroatom other than carbon atoms, as a ring-forming atom, and no aromaticity in its entire molecular structure (e.g., the entire molecular structure is not aromatic). Examples of the monovalent non-aromatic condensed heteropolycyclic group are a pyrrolyl group, a thiophenyl group, a furanyl group, an indolyl group, a benzoindolyl group, a naphthoindolyl group, an isoindolyl group, a benzoisoindolyl group, a naphthoisoindolyl group, a benzosilolyl group, a benzothiophenyl group, a benzofuranyl group, a carbazolyl group, a dibenzosilolyl group, a dibenzothiophenyl group, a dibenzofuranyl group, an azacarbazolyl group, an azafluorenyl group, an azadibenzosilolyl group, an azadibenzothiophenyl group, an azadibenzofuranyl group, a pyrazolyl group, an imidazolyl group, a triazolyl group, a tetrazolyl group, an oxazolyl group, an isoxazolyl group, a thiazolyl group, an isothiazolyl group, an oxadiazolyl group, a thiadiazolyl group, a benzopyrazolyl group, a benzimidazolyl group, a benzoxazolyl group, a benzothiazolyl group, a benzoxadiazolyl group, a benzothiadiazolyl group, an imidazopyridinyl group, an imidazopyrimidinyl group, an imidazotriazinyl group, an imidazopyrazinyl group, an imidazopyridazinyl group, an indenocarbazolyl group, an indolocarbazolyl group, a benzofurocarbazolyl group, a benzothienocarbazolyl group, a benzosilolocarbazolyl group, a benzoindolocarbazolyl group, a benzocarbazolyl group, a benzonaphthofuranyl group, a benzonaphthothiophenyl group, a benzonaphthosilolyl group, a benzofurodibenzofuranyl group, a benzofurodibenzothiophenyl group, and a benzothienodibenzothiophenyl group. The term "divalent non-aromatic condensed heteropolycyclic group," as used herein, refers to a divalent group having substantially the same structure as the monovalent non-aromatic condensed heteropolycyclic group.

The term "$C_6$-$C_{60}$ aryloxy group," as used herein, refers to —$OA_{102}$ (wherein $A_{102}$ is the $C_6$-$C_{60}$ aryl group), and the term "$C_6$-$C_{60}$ arylthio group," as used herein, refers to —$SA_{103}$ (wherein $A_{103}$ is the $C_6$-$C_{60}$ aryl group).

The term "$R_{10a}$," as used herein, refers to:
deuterium (-D), —F, —Cl, —Br, —I, a hydroxyl group, a cyano group, or a nitro group;
a $C_1$-$C_{60}$ alkyl group, a $C_2$-$C_{60}$ alkenyl group, a $C_2$-$C_{60}$ alkynyl group, or a $C_1$-$C_{60}$ alkoxy group, each unsubstituted or substituted with deuterium, —F, —Cl, —Br, —I, a hydroxyl group, a cyano group, a nitro group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si$(Q_{11})(Q_{12})(Q_{13})$, —N$(Q_{11})(Q_{12})$, —B$(Q_{11})(Q_{12})$, —C(=O)$(Q_{11})$, —S(=O)$_2(Q_{11})$, —P(=O)$(Q_{11})(Q_{12})$, or any combination thereof;

a $C_3$-$C_{60}$ carbocyclic group, a $C_1$-$C_{60}$ heterocyclic group, a $C_6$-$C_{60}$ aryloxy group, or a $C_6$-$C_{60}$ arylthio group, each unsubstituted or substituted with deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, a $C_1$-$C_{60}$ heterocyclic group, a $C_6$-$C_{60}$ aryloxy group, a $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$ and $Q_{31}$ to $Q_{33}$ used herein may each independently be: hydrogen; deuterium; —F; —Cl; —Br; —I; a hydroxyl group; a cyano group; a nitro group; a $C_1$-$C_{60}$ alkyl group; a $C_2$-$C_{60}$ alkenyl group; a $C_2$-$C_{60}$ alkynyl group; a $C_1$-$C_{60}$ alkoxy group; or a $C_3$-$C_{60}$ carbocyclic group, or a $C_1$-$C_{60}$ heterocyclic group, each unsubstituted or substituted with deuterium, —F, a cyano group, a $C_1$-$C_{60}$ alkyl group, a $C_1$-$C_{60}$ alkoxy group, a phenyl group, a biphenyl group, or any combination thereof.

The term "hetero atom," as used herein, refers to any atom other than a carbon atom. Examples of the heteroatom are O, S, N, P, Si, B, Ge, Se, and any combination thereof.

The term "Ph," as used herein, refers to a phenyl group, the term "Me," as used herein, refers to a methyl group, the term "Et," as used herein, refers to an ethyl group, the term "ter-Bu" or "Bu$^t$," as used herein, refers to a tert-butyl group, and the term "OMe," as used herein, refers to a methoxy group.

The term "biphenyl group," as used herein, refers to "a phenyl group substituted with a phenyl group." In other words, the "biphenyl group" is a substituted phenyl group having a $C_6$-$C_{60}$ aryl group as a substituent.

The term "terphenyl group," as used herein, refers to "a phenyl group substituted with a biphenyl group." In other words, the "terphenyl group" is a substituted phenyl group having, as a substituent, a $C_6$-$C_{60}$ aryl group substituted with a $C_6$-$C_{60}$ aryl group.

* and *', as used herein, unless defined otherwise, each refer to a binding site to a neighboring atom in a corresponding formula.

Hereinafter, a compound according to embodiments and a light-emitting device according to embodiments will be described in more detail with reference to Synthesis Examples and Examples. The wording "B was used instead of A" used in describing Synthesis Examples refers to that an identical molar equivalent of B was used in place of A.

EXAMPLES

Synthesis Example 1 (Synthesis of Electron Transport Particle 1)

Synthesis of Core 0.5 g of Zn(CH$_3$COO)$_2$.2H$_2$O (zinc acetate dihydrate) and 20 mL of methanol were mixed in a 50 mL three-necked flask, and then, strongly stirred at a temperature of 60° C. for 30 minutes. A mixture including 0.25 g of KOH and 40 mL of methanol was added to the mixture obtained therefrom, and a reaction was driven at a temperature of 60° C. for 2.5 hours, and then the temperature was decreased to room temperature. The resultant mixture was purified twice with methanol to obtain precipitated ZnO nanoparticles.

Synthesis of Electron Transport Particle 1

Figure 5:
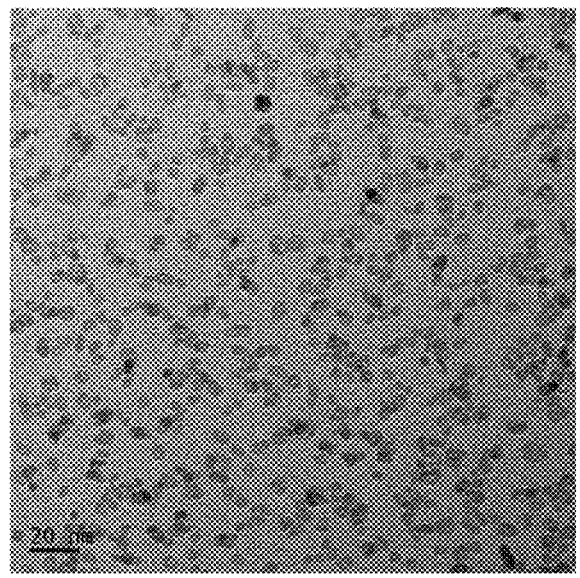
FIG. 5 shows a transmission electron microscopic image of an electron transport particle synthesized in Synthesis Example 1.

0.5 g of the ZnO nanoparticles was dispersed in 0.5 mL of oleylamine and 1 mL of toluene, and then, 10 mL of octadecene (ODE) and 1 mmol of Zn oleate (1M) was added thereto, and then, the temperature thereof was raised to 300° C. Then, 1 mmol TOP-S ([CH$_3$(CH$_2$)$_7$]$_3$P—S) (2M) was loaded thereto and caused the reaction to occur for 1 hour. Then, the resultant mixture was cooled to room temperature, and purified using acetone, thereby synthesizing an electron transport particle 1 having the core-shell structure of ZnO/ZnS. A transmission electron microscope image of electron transport particle 1 is shown in FIG. 5.

Synthesis Example 2 (Synthesis of Electron Transport Particle 2)

Synthesis of Core

ZnMgO nanoparticles were obtained in substantially the same manner as used to synthesize the core in Synthesis Example 1, except that a mixture including 0.5 g of Zn(CH$_3$COO)$_2$.2H$_2$O and Mg(CH$_3$COO)$_2$.4H$_2$O (the molar ratio of Zn(CH$_3$COO)$_2$.2H$_2$O to Mg(CH$_3$COO)$_2$.4H$_2$O was 1:1) was used instead of 0.5 g of Zn(CH$_3$COO)$_2$.2H$_2$O.

Synthesis of Electron Transport Particle 2

Electron transport particle 2 having the core-shell structure of ZnMgO/ZnS was synthesized in substantially the same manner as used to prepare electron transport particle 1 in Synthesis Example 1, except that the ZnMgO nanoparticles were used instead of ZnO nanoparticles.

Comparative Synthesis Example A (Synthesis of Electron Transport Particle A)

Synthesis of Core

ZnO nanoparticles were obtained using substantially the same method as used to synthesize the core of Synthesis Example 1.

Synthesis of Electron Transport Particle A

ZnO nanoparticles were dispersed in 20 mL of distilled water, and then, 0.2 g of polyvinylpyrrolidone (PVP) was added and stirred for a day, thereby replacing the surface of the ZnO nanoparticles with PVP. The resultant ZnO nanoparticles were separated from the obtained mixture by centrifugation, and then dispersed in a mixture of ethanol (23 ml), distilled water (4.3 mL) and aqueous ammonia (30%, JUNSEI 13370-0380). To the obtained mixture, 0.05 ml of tetraethyl orthosilicate (TEOS) was added, stirred at room temperature for 4 hours, and then, centrifuged to synthesize electron transport particle A having the core-shell structure of ZnMgO/SiO$_2$.

Comparative Synthesis Example B (Synthesis of Electron Transport Particle B)

Electron transport particle B was synthesized by obtaining ZnO nanoparticles in substantially the same manner as used to synthesize the core in Synthesis Example 1 and then dispersing the same in oleylamine and toluene.

TABLE 1

| | Core | Shell | Average particle diameter (D50) of particle excluding organic group introduced on the surface of the shell (or, core) (nm) | Organic group introduced on the shell (or, core) surface |
|---|---|---|---|---|
| Electron transport particle 1 | ZnO | ZnS | 7.3 | Oleic acid group |
| Electron transport particle 2 | ZnMgO | ZnS | 7.2 | Oleic acid group |
| Electron transport particle A | ZnO | SiO$_2$ | 8.0 | — |
| Electron transport particle B | ZnO | — | 6.0 | Hydroxyl group |

Evaluation Example 1 (Evaluation of Dispersion Stability in Organic Solvents)

Each of electron transport particles 1, 2, A and B was dispersed in cyclohexylbenzene, and then, the time (days) it takes for each dispersion to be observed as having precipitated while storing at room temperature was measured in order to evaluate the corresponding room-temperature dispersion stability with respect to an organic solvent (cyclohexylbenzene), and results thereof are summarized in Table 2.

TABLE 2

| Electron transport particle No | Core | Shell | Room-temperature dispersion stability (Day) |
|---|---|---|---|
| 1 | ZnO | ZnS | >30 |
| 2 | ZnMgO | ZnS | >30 |
| A | ZnO | SiO$_2$ | No dispersion |
| B | ZnO | — | 3 |

From Table 2, it can be seen that electron transport particles 1 and 2 each have a high room-temperature dispersion stability of 30 days or more with respect to organic solvents such as cyclohexylbenzene, whereas electron transport particle B has a poor room-temperature dispersion stability compared to electron transport particles 1 and 2, and electron transport particle A is not even dispersed in an organic solvent.

Example 1

As an anode, a glass substrate with an ITO electrode deposited thereon was cut to a size of 50 mm×50 mm×0.7 mm, sonicated with acetone, isopropyl alcohol, and pure water, each for 15 minutes, and then cleaned by exposure to ultraviolet rays and ozone for 30 minutes. Then, the glass substrate was provided to a vacuum deposition apparatus.

PEDOT:PSS were spin-coated on the ITO electrode and dried to form a hole injection layer having a thickness of 40 nm, and then, TFB (Poly[(9,9-dioctylfluoren-2,7-diyl)-co-(4,4'-(N-(p-butylphenyl))diphenylamine)]) was spin-coated on the hole injection layer to form a hole transport layer having a thickness of 40 nm.

A composition including InP/ZnSe/ZnS core-shell quantum dots (average particle diameter: 3 nm to 8 nm) was spin-coated on the hole transport layer at a coating speed of 3,500 rpm for 30 seconds, and then naturally dried for 5 minutes at room temperature, followed by drying at a temperature of 100° C. for 10 minutes to form an emission layer having a thickness of 15 nm.

A composition in which 0.1 g of electron transport particle 1 was mixed with 10 mL of cyclohexylbenzene, was coated on the emission layer by using an inkjet printer, and then, dried naturally at room temperature to form an electron transport layer having a thickness of 40 nm, and then, Ag was deposited on the electron transport layer to form a cathode having a thickness of 150 nm, thereby completing the manufacture of a light-emitting device.

Example 2 and Comparative Examples A and B

Light-emitting devices were manufactured in substantially the same manner as in Example 1, except that, in forming the electron transport layer, electron transport particles 2, A, and B were respectively used instead of electron transport particle 1 (Example 2 included electron transport particle 2, Comparative Example A included electron transport particle A, and Comparative Example B included electron transport particle B).

Evaluation Example 2 (Light-Emitting Device Performance Evaluation)

The driving voltage (V), current density (mA/cm$^2$), and emission efficiency (cd/A) of the light-emitting devices of Examples 1 and 2 and Comparative Examples A and B were measured by using a Keithley SMU 236 and a luminance meter PR650, and results thereof are shown as a relative value (%) in Table 3. FIG. 6 shows a graph of the luminance (cd/m$^2$)-emission efficiency (cd/A) of each of the light-emitting devices fabricated in Example 1 and 2 and Comparative Examples A and B.

TABLE 3

| | Electron transport particles included in electron transport layer | Core | Shell | Driving voltage (Relative values with respect to Comparative Example B, %) | Current density (Relative values with respect to Comparative Example B, %) | Emission efficiency (Relative values with respect to Comparative Example B, %) |
|---|---|---|---|---|---|---|
| Example 1 | 1 | ZnO | ZnS | 66 | 78 | 128 |
| Example 2 | 2 | ZnMgO | ZnS | 69 | 59 | 175 |

TABLE 3-continued

| | Electron transport particles included in electron transport layer | Core | Shell | Driving voltage (Relative values with respect to Comparative Example B, %) | Current density (Relative values with respect to Comparative Example B, %) | Emission efficiency (Relative values with respect to Comparative Example B, %) |
|---|---|---|---|---|---|---|
| Comparative Example A | A | ZnO | $SiO_2$ | 92 | 155 | 64 |
| Comparative Example B | B | ZnO | — | 100 | 100 | 100 |

From Table 3 and FIG. 6, it can be seen that the light-emitting devices of Examples 1 and 2 have improved driving voltage, improved current density, and improved emission efficiency compared to the light-emitting devices of Comparative Examples A and B.

Light-emitting devices according to embodiments according to the present disclosure have excellent driving voltage characteristics and emission efficiency, and may be easily manufactured by a soluble process (for example, inkjet printing). Accordingly, by using the light-emitting device, a high-quality electronic apparatus can be implemented.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A light-emitting device comprising:
a first electrode,
a second electrode facing the first electrode, and
an interlayer between the first electrode and the second electrode,
wherein the interlayer comprises an emission layer and an electron transport layer,
the electron transport layer is between the emission layer and the second electrode,
the electron transport layer comprises an electron transport particle,
the electron transport particle comprises a core and a shell covering the core,
the shell comprises a chalcogenide, and
the core comprises:
ZnO; or
a combination of: ZnO; and Li, Na, K, Rb, Cs, Be, Mg, Ca, Sr, Ba, Cu, Al, Ga, In, Si, or any combination thereof.

2. The light-emitting device of claim 1, wherein the emission layer comprises a quantum dot.

3. The light-emitting device of claim 2, wherein the quantum dot comprises a Group III-V semiconductor compound and a Group II-VI semiconductor compound.

4. The light-emitting device of claim 2, wherein the quantum dot comprises InP, GaP, InGaP, ZnSe, ZnS, ZnSeTe, or any combination thereof.

5. The light-emitting device of claim 1, wherein the chalcogenide of the shell of the electron transport particle comprises a chalcogenide of $A^2$, and
$A^2$ is a Group II element, a Group III element, or a combination thereof.

6. The light-emitting device of claim 5, wherein $A^2$ is zinc (Zn), magnesium (Mg), boron (B), aluminum (Al), gallium (Ga), indium (In), thallium (Tl), or any combination thereof.

7. The light-emitting device of claim 1, wherein the shell of the electron transport particle comprises ZnSe, ZnSeS, ZnS, $Ga_2S_3$, $Ga_2Se_3$, $Zn_xGa_{1-x}S$, $Zn_xGa_{1-x}Se$, or any combination thereof, and x is a real number satisfying the condition of 0<x<1.

8. The light-emitting device of claim 1, wherein an average particle diameter (D50) of the electron transport particle is in a range from 3 nm to 15 nm.

9. The light-emitting device of claim 1, wherein an organic ligand is additionally bound to a surface of the shell.

10. The light-emitting device of claim 9, wherein the organic ligand is a group represented by one of Formulae 1A to 1E, or any combination thereof:

$$*-(Z_1)_{a1}-N(Z_{11})(Z_{12}) \quad \text{Formula 1A}$$

$$*-(Z_1)_{a1}-P(Z_{11})(Z_{12}) \quad \text{Formula 1B}$$

$$*-(Z_1)_{a1}-S(Z_{11}) \quad \text{Formula 1C}$$

$$*-(Z_1)_{a1}-C(=O)O(Z_{11}) \quad \text{Formula 1D}$$

$$*-(Z_1)_{a1}-P(=O)(Z_{11})(Z_{12}) \quad \text{Formula 1E}$$

wherein, in Formulae 1A to 1E,
$Z_1$ is a single bond, *—O—*', *—S—*', *—C(=O)—*', a $C_1$-$C_{60}$ alkylene group unsubstituted or substituted with at least one $R_{1a}$, a $C_2$-$C_{60}$ alkenylene group unsubstituted or substituted with at least one $R_{1a}$, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$,
a1 is an integer in a range from 1 to 10, and when a1 is 2 or more, two or more of $Z_1$(s) are identical to or different from each other,
$Z_{11}$ and $Z_{12}$ are each independently hydrogen, deuterium, a $C_1$-$C_{60}$ alkyl group unsubstituted or substituted with at least one $R_{1a}$, a $C_2$-$C_{60}$ alkenyl group unsubstituted or substituted with at least one $R_{1a}$, a $C_2$-$C_{60}$ alkynyl group unsubstituted or substituted with at least one $R_{1a}$, a $C_1$-$C_{60}$ alkoxy group unsubstituted or substituted with at least one $R_{1a}$, a $C_3$-$C_{60}$ carbocyclic group unsubstituted or substituted with at least one $R_{1a}$, or a $C_1$-$C_{60}$ heterocyclic group unsubstituted or substituted with at least one $R_{1a}$, $R_{1a}$ is hydrogen, deuterium, —F, —Cl, —Br, —I, a hydroxyl group, a cyano group, a nitro group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{60}$ carbocyclic group, or a $C_1$-$C_{60}$ heterocyclic group, and \* indicates a binding site to the surface of the shell.

11. The light-emitting device of claim 1, wherein the second electrode comprises silver (Ag), aluminum (Al), magnesium (Mg), calcium (Ca), strontium (Sr), barium (Ba), indium (In), ytterbium (Yb), or any combination thereof.

12. The light-emitting device of claim 1, wherein the second electrode is a transparent electrode having a light transmittance of 50% or more with respect to light having a wavelength in a visible-light wavelength range.

13. An electronic apparatus comprising the light-emitting device of claim 1.

\* \* \* \* \*